(12) United States Patent
Choi et al.

(10) Patent No.: US 12,080,225 B2
(45) Date of Patent: Sep. 3, 2024

(54) DISPLAY DEVICE AND TILED DISPLAY DEVICE INCLUDING THE SAME

(71) Applicant: Samsung Display Co., LTD., Yongin-si (KR)

(72) Inventors: Nak Cho Choi, Yongin-si (KR); Jeong Su Kim, Yongin-si (KR); Myung Koo Hur, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/243,031

(22) Filed: Sep. 6, 2023

(65) Prior Publication Data

US 2024/0119890 A1    Apr. 11, 2024

(30) Foreign Application Priority Data

Oct. 11, 2022  (KR) .......................... 10-2022-0130091
Apr. 25, 2023  (KR) .......................... 10-2023-0054262

(51) Int. Cl.
  *G09G 3/32*   (2016.01)
  *G09G 3/00*   (2006.01)

(52) U.S. Cl.
  CPC ............... *G09G 3/32* (2013.01); *G09G 3/006* (2013.01); *G09G 2300/0426* (2013.01); *G09G 2300/0819* (2013.01); *G09G 2300/0852* (2013.01); *G09G 2300/0861* (2013.01); *G09G 2310/0267* (2013.01); *G09G 2330/12* (2013.01)

(58) Field of Classification Search
  None
  See application file for complete search history.

(56) References Cited

U.S. PATENT DOCUMENTS

| | | | |
|---|---|---|---|
| 2020/0027939 A1* | 1/2020 | Cho | H10K 59/126 |
| 2021/0217353 A1 | 7/2021 | Zhao et al. | |
| 2023/0121681 A1* | 4/2023 | Hwang | G09G 3/2014 345/55 |
| 2023/0230957 A1* | 7/2023 | Kim | H01L 25/167 345/690 |

(Continued)

FOREIGN PATENT DOCUMENTS

| | | |
|---|---|---|
| JP | 7034235 B2 | 3/2022 |
| KR | 2018-0049356 A | 5/2018 |

(Continued)

*Primary Examiner* — Parul H Gupta
(74) *Attorney, Agent, or Firm* — Lewis Roca Rothgerber Christie LLP

(57) ABSTRACT

A display device includes a sub-pixel connected to a scan write line, a first data line, and a second data line. The sub-pixel includes a light emitting element, a first pixel driving unit configured to generate a control current according to a first data voltage of the first data line, a second pixel driving unit configured to generate a driving current applied to the light emitting element according to a second data voltage of the second data line, and a third pixel driving unit configured to apply the driving current to the light emitting element according to the control current of the first pixel driving unit. The first pixel driving unit includes a first transistor to generate the control current according to the first data voltage, a second transistor configured to apply the first data voltage of the first data line to a first electrode of the first transistor.

21 Claims, 47 Drawing Sheets

(56) References Cited

U.S. PATENT DOCUMENTS

2023/0343289 A1* 10/2023 Song .................. G06V 40/1318

FOREIGN PATENT DOCUMENTS

| KR | 2019-0044016 A | 4/2019 |
| KR | 10-2062912 B1 | 2/2020 |
| KR | 2021-0061957 A | 5/2021 |
| KR | 2021-0068356 A | 6/2021 |
| KR | 2023-0113472 A | 7/2023 |
| KR | 2023-0113474 A | 7/2023 |
| KR | 2023-0115388 A | 8/2023 |
| KR | 2023-0116153 A | 8/2023 |

* cited by examiner (a)

(b)

T3: T31, T32
T4: T41, T42
T10: T101, T102
T11: T111, T112
T16: T161, T162

US 12,080,225 B2

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2022-0130091 filed on Oct. 11, 2022, and Korean Patent Application No. 10-2023-0054262 filed on Apr. 25, 2023, in the Korean Intellectual Property Office (KIPO), the entire content of both of which is incorporated by reference herein.

BACKGROUND

1. Field

One or more embodiments of the present disclosure relate to a display device and a tiled display device including the same.

2. Description of the Related Art

With the advance of information-oriented society, more and more demands are placed on display devices for displaying images in various ways. The display device may be a flat panel display device such as a liquid crystal display, a field emission display and a light emitting display.

A light emitting display device may include an organic light emitting display device including an organic light emitting diode element as a light emitting element, or a light emitting diode display device including an inorganic light emitting diode element such as a light emitting diode (LED) as a light emitting element.

The light emitting diode display device is inspected if it operates normally before releasing. In this case, the device identifier of the light emitting diode display device may be visually recognized during the inspection process.

SUMMARY

Aspects and features of embodiments of the present disclosure provide a display device and a tiled display device including the display device capable of preventing a device identifier of a light emitting diode display device from being visually recognized in an inspection mode.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a sub-pixel connected to a scan write line, a first data line, and a second data line. The sub-pixel includes a light emitting element, a first pixel driving unit configured to generate a control current according to a first data voltage of the first data line, a second pixel driving unit configured to generate a driving current applied to the light emitting element according to a second data voltage of the second data line, and a third pixel driving unit configured to apply the driving current to the light emitting element according to the control current of the first pixel driving unit. The first pixel driving unit includes a first transistor configured to generate the control current according to the first data voltage, a second transistor configured to apply the first data voltage of the first data line to a first electrode of the first transistor according to a scan write signal of the scan write line, and a third transistor connecting a gate electrode and a second electrode of the first transistor according to the scan write signal of the scan write line. The third transistor comprises a first sub-transistor and a second sub-transistor connected in series between the gate electrode and the second electrode of the first transistor. A channel of the first sub-transistor and a channel of the second sub-transistor overlap a bottom gate electrode of the third transistor.

The bottom gate electrode of the third transistor may be connected to a gate electrode of the first sub-transistor and a gate electrode of the second sub-transistor.

The bottom gate electrode of the third transistor may be connected to a first electrode of the first sub-transistor.

The first electrode of the first sub-transistor may be connected to the second electrode of the first transistor.

The first pixel driving unit may comprise a fourth transistor configured to initialize a voltage of the gate electrode of the first transistor to an initialization voltage according to a scan initialization signal of a scan initialization line.

The fourth transistor may comprise a third sub-transistor and a fourth sub-transistor connected in series between the gate electrode of the first transistor and an initialization voltage line configured to receive the initialization voltage. A channel of the third sub-transistor and a channel of the fourth sub-transistor may overlap a bottom gate electrode of the fourth transistor.

The bottom gate electrode of the fourth transistor may be connected to a gate electrode of the third sub-transistor and a gate electrode of the fourth sub-transistor.

The bottom gate electrode of the fourth transistor may be connected to a first electrode of the third sub-transistor, and the first electrode of the third sub-transistor may be connected to the gate electrode of the first transistor.

A channel of the first transistor may overlap a bottom gate electrode of the first transistor.

The bottom gate electrode of the first transistor may be connected to the gate electrode of the first transistor.

The bottom gate electrode of the first transistor may be connected to the first electrode of the first transistor.

The bottom gate electrode of the third transistor may be between the channel of the first sub-transistor and a substrate of the display device and between the channel of the second sub-transistor and the substrate.

A second electrode of the light emitting element may be connected to a first power supply line configured to receive a first power voltage. The third pixel driving unit may include a fifth transistor electrically connecting a first electrode of the light emitting element to the first power supply line according to a test signal of a test signal line.

A second electrode of the fifth transistor may overlap a light blocking layer.

The light blocking layer may be electrically floating.

The bottom gate electrode of the third transistor may include a same material as the light blocking layer.

The bottom gate electrode of the third transistor and the light blocking layer may be on a substrate. A buffer film may be on the bottom gate electrode of the third transistor and the light blocking layer.

According to one or more embodiments of the present disclosure, there is provided a display device includes a sub-pixel connected to a scan write line, a first data line, and a second data line. The sub-pixel includes a light emitting element, a first pixel driving unit configured to generate a control current according to a first data voltage of the first data line, a second pixel driving unit configured to generate a driving current applied to the light emitting element according to a second data voltage of the second data line, and a third pixel driving unit configured to apply the driving current to the light emitting element according to the control current of the first pixel driving unit. The second pixel driving unit includes a first transistor configured to generate the drive current according to the second data voltage, a second transistor configured to apply the second data voltage of second first data line to a first electrode of the first transistor according to a scan write signal of the scan write line, and a third transistor connecting a gate electrode and a second electrode of the first transistor according to the scan write signal of the scan write line. The third transistor includes a first sub-transistor and a second sub-transistor connected in series between the gate electrode and the second electrode of the first transistor. A channel of the first sub-transistor and a channel of the second sub-transistor overlap a bottom gate electrode of the third transistor.

The bottom gate electrode of the third transistor may be connected to a gate electrode of the first sub-transistor and a gate electrode of the second sub-transistor.

The bottom gate electrode of the third transistor may be connected to a first electrode of the first sub-transistor and the first electrode of the first sub-transistor may be connected to the second electrode of the first transistor.

A channel of the first transistor may overlap a bottom gate electrode of the first transistor and the bottom gate electrode of the first transistor may be connected to a gate electrode of the first transistor.

A channel of the first transistor may overlap a bottom gate electrode of the first transistor and the bottom gate electrode of the first transistor may be connected to the first electrode of the first transistor.

According to one or more embodiments of the present disclosure, there is provided a tiled display device includes a plurality of display devices, and a connection member between the plurality of display devices. A display device from among the plurality of display devices includes a sub-pixel connected to a scan write line, a first data line, and a second data line. The sub-pixel includes a light emitting element, a first pixel driving unit configured to generate a control current according to a first data voltage of the first data line, a second pixel driving unit configured to generate a driving current applied to the light emitting element according to a second data voltage of the second data line, and a third pixel driving unit configured to apply the driving current to the light emitting element according to the control current of the first pixel driving unit. The second pixel driving unit includes a first transistor configured to generate the drive current according to the second data voltage, a second transistor configured to apply the second data voltage of second data line to a first electrode of the first transistor according to a scan write signal of the scan write line, and a third transistor connecting a gate electrode and a second electrode of the first transistor according to the scan write signal of the scan write line. The third transistor comprises a first sub-transistor and a second sub-transistor connected in series between the gate electrode and the second electrode of the first transistor. A channel of the first sub-transistor and a channel of the second sub-transistor overlap a bottom gate electrode of the third transistor.

According to the aforementioned and other embodiments of the present disclosure, light from the outside is blocked by a bottom gate electrode, and thus incident on the channel of the transistor may be prevented. Therefore, it is possible to prevent a plurality of device identifiers from being visually recognized in the inspection mode since the light leakage current of the transistor may be reduced.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
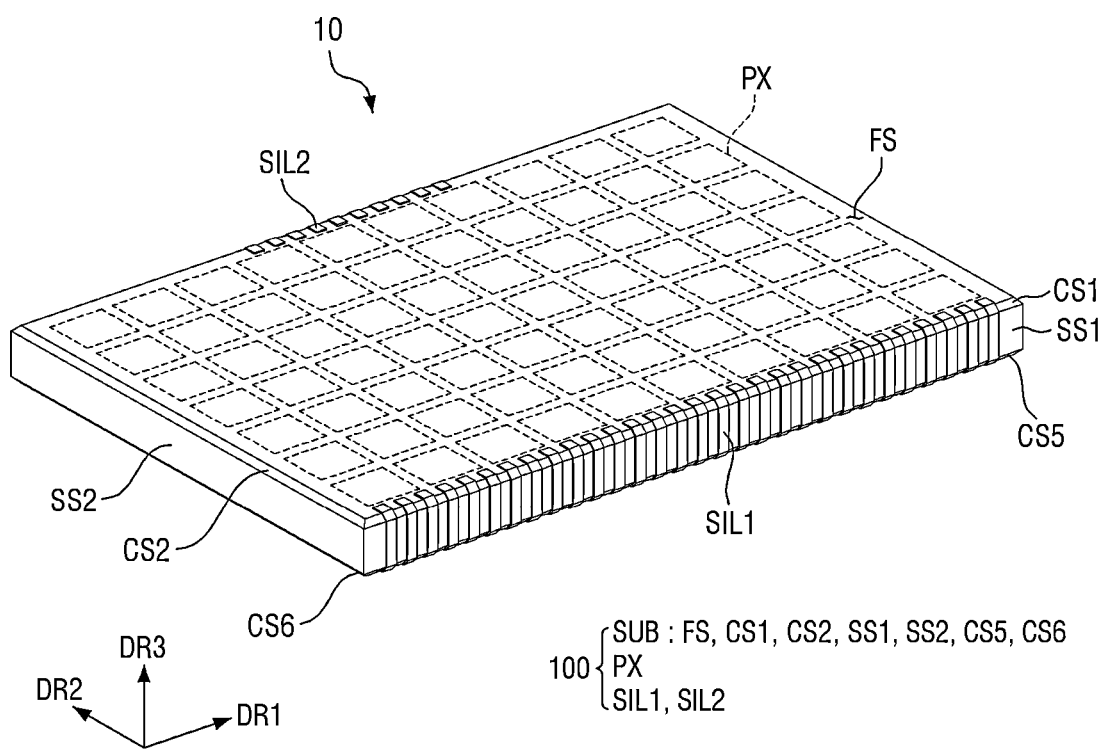
FIGS. 1 and 2 are perspective views illustrating a display device according to one or more embodiments.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that the present disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "in a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions 1 describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of the present disclosure, expressions such as "at least one of," "one of," and "selected from," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B. Further, the use of "may" when describing embodiments of the present disclosure refers to "one or more embodiments of the present disclosure".

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one 1 another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, for example, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to one or more embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning for example consistent with their meaning in the context of the relevant art and/or the present specification, and should not be interpreted in an idealized or overly formal sense, unless expressly so defined herein.

Figure 2:
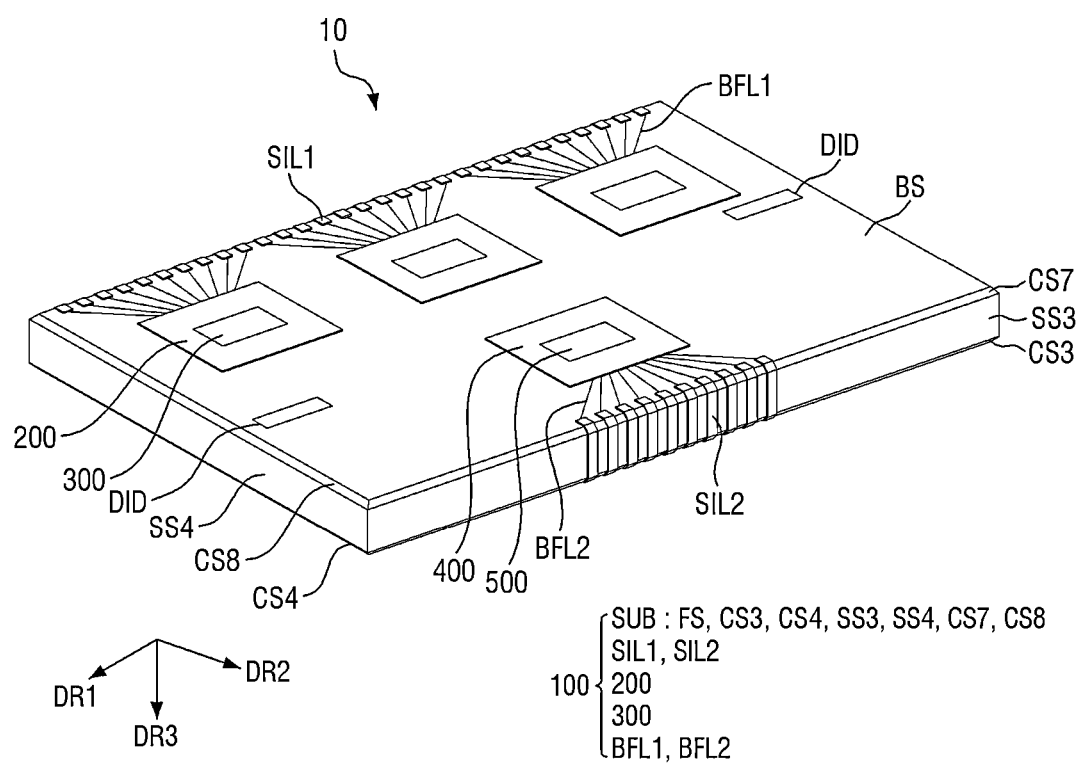

FIGS. 1 and 2 are perspective views illustrating a display device according to one or more embodiments.

Referring to FIGS. 1 and 2, a display device 10 is a device for displaying a moving image or a still image. The display device may be used as a display screen of various products such as televisions, laptop computers, monitors, billboards and the Internet of Things (IOT) as well as portable electronic devices such as mobile phones, smart phones, tablet personal computer (tablet PC), smart watches, watch phones, mobile communication terminals, electronic notebooks, electronic books, portable multimedia players (PMPs), navigation systems, and/or ultra mobile PCs (UMPCs).

The display device 10 according to one or more embodiments may include a display panel 100, a circuit board 200, and a source driving circuit 300.

The display panel 100 may include a substrate SUB, first bottom fan-out wirings BFL1, second bottom fan-out wirings BFL2, a plurality of pixels PX, a plurality of first side wirings SIL1, a plurality of second side wirings SIL2, and a plurality of device identifiers DID.

The substrate SUB may include a first surface FS, a second surface BS, a plurality of chamfered surfaces CS1 to CS8, and a plurality of side surfaces SS1 to SS4.

The first surface FS may be the front surface of the substrate SUB. The first surface FS may have a rectangular shape having a long side in the first direction DR1 and a short side in the second direction DR2.

The second surface BS may be a surface opposite the first surface FS. The second surface BS may be a rear surface of the substrate SUB. The second surface BS may have a rectangular shape having a long side in the first direction DR1 and a short side in the second direction DR2. The second surface BS may be a surface opposite the first surface FS.

The plurality of chamfered surfaces CS1 to CS8 refer to obliquely cut surfaces disposed between the first surface FS and the plurality of side surfaces SS1 to SS4 and between the second surface BS and the plurality of side surfaces SS1 to SS4 to prevent a chipping defect from occurring in the plurality of first side wirings SIL1 and the plurality of second side wirings SIL2. Because each of the plurality of first side wirings SIL1 and the plurality of second side wirings SIL2 may have a gentle bending angle due to the plurality of chamfered surfaces CS1 to CS8, chipping or cracking of the plurality of first side wirings SIL1 and the plurality of second side wirings SIL2 may be prevented.

The first chamfered surface CS1 may be extended from the first side of the first surface FS, for example, the lower side. The second chamfered surface CS2 may be extended from the second side of the first surface FS, for example, the left side. The third chamfered surface CS3 may be extended from the third side of the first surface FS, for example, the upper side. The fourth chamfered surface CS4 may be extended from the fourth side of the first surface FS, for example, the right side. An interior angle formed by the first surface FS and the first chamfered surface CS1, an interior angle formed by the first surface FS and the second chamfered surface CS2, an interior angle formed by the first surface FS and the third chamfered surface CS3, and an interior angle formed by the first surface FS and the fourth chamfered surface CS4 may be greater than 90 degrees.

The fifth chamfered surface CS5 may be extended from the first side of the second surface BS, for example, the lower side. The sixth chamfered surface CS6 may be extended from the second side of the second surface BS, for example, the left side. The seventh chamfered surface CS7 may be extended from the third side of the second surface BS, for example, the upper side. The eighth chamfered surface CS8 may be extended from the fourth side of the second surface BS, for example, the right side. An interior angle formed by the second surface BS and the fifth chamfered surface CS5, an interior angle formed by the second surface BS and the sixth chamfered surface CS6, an interior angle formed by the second surface BS and the seventh chamfered surface CS7, and an interior angle formed by the second surface BS and the eighth chamfered surface CS8 may be greater than 90 degrees.

The first side surface SS1 may be extended from the first chamfered surface CS1. The first chamfered surface CS1 may be disposed between the first surface FS and the first side surface SS1. The first side surface SS1 may be a lower surface of the substrate SUB.

The second side surface SS2 may be extended from the second chamfered surface CS2. The second chamfered surface CS2 may be disposed between the first surface FS and the second side surface SS2. The second side surface SS2 may be the left side of the substrate SUB.

The third side surface SS3 may be extended from the third chamfered surface CS3. The third chamfered surface CS3 may be disposed between the first surface FS and the third side surface SS3. The third side surface SS3 may be an upper surface of the substrate SUB.

The fourth side surface SS4 may be extended from the fourth chamfered surface CS4. The fourth chamfered surface CS4 may be disposed between the first surface FS and the fourth side surface SS4. The fourth side surface SS4 may be the right side of the substrate SUB.

The plurality of pixels PX may be disposed on the first surface FS of the substrate SUB to display an image. The plurality of pixels PX may be arranged in a matrix form in the first and second directions DR1 and DR2. A description of the plurality of pixels PX will be described later with reference to FIG. 3.

The plurality of first side wirings SIL1 may be disposed on at least one side surface of at least two chamfered surfaces from among the first surface FS, the second surface BS, and the plurality of chamfered surfaces CS1 to CS8 and may be disposed on at least one of the plurality of side surfaces SS1 to SS4. For example, the plurality of first side wirings SIL1 may be disposed on the first surface FS, the second surface BS, the first chamfered surface CS1, the fifth chamfered surface CS5, and the first side surface SS1 to connect the first pads disposed on the first side of the first surface FS and the first bottom fan-out wirings BFL1 of the second surface BS.

The plurality of second side wirings SIL2 may be disposed on at least one side surface of at least two chamfered surfaces from among the first surface FS, the second surface BS, and the plurality of chamfered surfaces CS1 to CS8 and may be disposed on at least one of the plurality of side surfaces SS1 to SS4. For example, the plurality of second side wirings SIL2 may be disposed on the first surface FS, the second surface BS, the third chamfered surface CS3, the seventh chamfered surface CS7, and the third side surface SS3 to connect the second pads disposed on the second side opposite to the first side of the first surface FS and the second bottom fan-out wirings BFL2 of the second surface BS.

Each of the plurality of first side wirings SIL1 connects the first pads disposed on the first surface FS and the first bottom fan-out wirings BFL1 disposed on the second surface BS. Each of the plurality of second side wirings SIL2 connects the second pads disposed on the first surface FS and the second bottom fan-out wirings BFL2 disposed on the second surface BS. The first pads and the second pads may correspond to front pads. The first pads may be connected to data lines connected to the pixels PX of the substrate SUB. Some of the second pads may be connected to the first power supply line disposed on the first surface FS of the substrate SUB, and another part may be connected to the global power supply line disposed on the first surface FS of the substrate SUB.

Each of the plurality of device identifiers DID may be an identification such as an identification number assigned to each display device 10 to distinguish the display device 10. The plurality of device identifiers DID may be disposed on the second surface BS of the substrate SUB. When viewed on a plane, the plurality of device identifiers DID may be spaced from the first bottom fan-out wirings BFL1, the second bottom fan-out wirings BFL2, the plurality of first side wirings SIL1, and the plurality of second side wirings SIL2. Also, the plurality of device identifiers DID may be spaced from the plurality of first circuit boards 200 and the second circuit board 400 when viewed on the plane. That is, the plurality of device identifiers DID may be in an electrically floating state.

Some of the plurality of device identifiers DID may be disposed adjacent to the sixth chamfered surface CS6 and others may be disposed adjacent to the eighth chamfered surface CS8. Some of the plurality of device identifiers DID may be disposed closer to the fifth chamfer surface CS5 than others. Also, some of the plurality of device identifiers DID may be disposed adjacent to the seventh chamfer surface CS7 compared to some above.

The plurality of device identifiers DID may be a rear metal layer formed of the same material as the first bottom fan-out wirings BFL1 and the second bottom fan-out wirings BFL2 by the same process. For example, the rear metal layer may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

A plurality of first circuit boards 200 may be disposed on the second surface BS of the substrate SUB. Each of the plurality of first circuit boards 200 may be connected to the first bottom fan-out wirings BFL1 disposed on the second surface BS of the substrate SUB by using a conductive adhesive member such as an anisotropic conductive film. The plurality of first circuit boards 200 may be electrically connected to the plurality of first side wirings SIL1 through the first bottom fan-out wirings BFL1. The plurality of first circuit boards 200 may be flexible printed circuit boards, printed circuit boards, and/or flexible films.

A second circuit board 400 may be disposed on the second surface BS of the substrate SUB. The second circuit board 400 may be connected to the second bottom fan-out wirings BFL2 disposed on the second surface BS of the substrate SUB by using the conductive adhesive member. The second circuit board 400 may be electrically connected to the plurality of second side wirings SIL2 through the second bottom fan-out wirings BFL2. The second circuit board 400 may be the flexible printed circuit board, the printed circuit board, and/or the flexible film.

Each of the source driving circuits 300 may generate data voltages and supply them to data lines through the first circuit board 200, the first bottom fan-out wirings BFL1, and the plurality of first side wirings SIL1. Each of the source driving circuits 300 may be formed as an integrated circuit (IC) and attached to a corresponding circuit board 200. Alternatively, the source driving circuit 300 may be directly attached to the second surface BS of the substrate SUB using a chip on glass (COG) method.

A power supply circuit 500 may generate and supply suitable voltage (e.g., predetermined voltages) to suitable voltage lines (e.g., predetermined voltage lines) through the second circuit board 400, the second bottom fan-out wirings BFL2, and the plurality of second side wirings SIL2. For example, the power supply circuit 500 may generate a first power voltage and supply it to the first power line through the second circuit board 400, the second bottom fan-out wirings BFL2, and the plurality of second side wirings SIL2. In addition, the power supply circuit 500 may generate a global power voltage and supply it to the global power line through the second circuit board 400, the second bottom fan-out wirings BFL2, and the plurality of second side wirings SIL2. The power supply circuit 500 may be formed as the integrated circuit (IC) and attached to the second circuit board 400. Alternatively, the power supply circuit 500 may be directly attached to the second surface BS of the substrate SUB using the chip on glass (COG) method.

As shown in FIGS. 1 and 2, the flexible film bent along the side surface of the substrate SUB may be removed by using the plurality of first side wirings SIL1 and the plurality of second side wirings SIL2. As a result, a bezel-less display device may be implemented.

Figure 3:
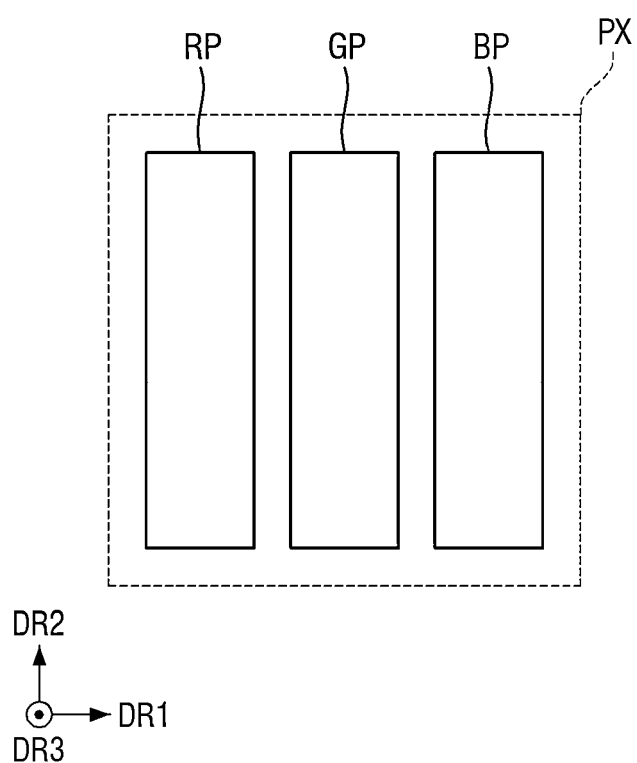
FIG. 3 is a layout diagram illustrating first to third sub-pixels of a pixel of a display device according to one or more embodiments.

FIG. 3 is a layout diagram illustrating first to third sub-pixels of a pixel of a display device according to one or more embodiments.

Referring to FIG. 3, each of the pixels PX may include a plurality of sub-pixels RP, GP, and BP. In FIG. 3, it is exemplified that each of the pixels PX includes three sub-pixels RP, GP, and BP, that is, a first sub-pixel RP, a second sub-pixel GP, and a third sub-pixel BP but the embodiments of the present disclosure are not limited thereto. Each of the first sub-pixel RP, the second sub-pixel GP, and the third sub-pixel BP may be connected to at least one of the PWM data lines DL, at least one of the first to third data lines RDL, GDL, and BDL, and at least one of the scan lines GWL, GIL, GCL, SWPL, PAEL, and PWEL.

Each of the first sub-pixel RP, the second sub-pixel GP, and the third sub-pixel BP may have a rectangular, square, or rhombus planar shape. For example, each of the first sub-pixel RP, the second sub-pixel GP, and the third sub-pixel BP may have a rectangular planar shape having a short side in the first direction DR1 and a long side in the second direction DR2. Alternatively, each of the first sub-pixel RP, the second sub-pixel GP, and the third sub-pixel BP may have a planar shape of a square or rhombus including sides having the same length in the first direction DR1 and the second direction DR2.

As shown in FIG. 3, the first sub-pixel RP, the second sub-pixel GP, and the third sub-pixel BP may be arranged along the first direction DR1. Alternatively, one of the second sub-pixel GP and the third sub-pixel BP and the first sub-pixel RP may be arranged along the first direction DR1, and the other one and the first sub-pixel RP may be arranged along the second direction DR2. For example, the first sub-pixel RP and the second sub-pixel GP may be arranged along the first direction DR1, and the first sub-pixel RP and the third sub-pixel BP may be arranged along the second direction DR2. Alternatively, one of the first sub-pixel RP and the third sub-pixel BP and the second sub-pixel GP may be arranged along the first direction DR1, and the other one and the third sub-pixel BP may be arranged along the second direction DR2.

The first sub-pixel RP may emit first light, the second sub-pixel GP may emit second light, and the third sub-pixel BP may emit third light. Here, the first light may be light in a red wavelength band, the second light may be light in a green wavelength band, and the third light may be light in a blue wavelength band. The red wavelength band may be a wavelength band of approximately 600 nm to 750 nm, the green wavelength band may be a wavelength band of approximately 480 nm to 560 nm, and the blue wavelength band may be a wavelength band of approximately 370 nm to 460 nm, but the embodiments of the present disclosure are not limited thereto.

Each of the first sub-pixel RP, the second sub-pixel GP, and the third sub-pixel BP may include an inorganic light emitting element having an inorganic semiconductor as a light emitting element emitting light. For example, the inorganic light emitting element may be a flip chip type micro light emitting diode (LED), but embodiments of the present disclosure are not limited thereto.

As shown in FIG. 3, the area of the first sub-pixel RP, the area of the second sub-pixel GP, and the area of the third sub-pixel BP may be substantially the same, but embodiments of the present disclosure are limited thereto. At least one of the area of the first sub-pixel RP, the area of the second sub-pixel GP, and the area of the third sub-pixel BP may be different from the other one. Alternatively, any two of the area of the first sub-pixel RP, the area of the second sub-pixel GP, and the area of the third sub-pixel BP may be substantially the same and the other one may be different from the above two. Alternatively, the area of the first sub-pixel RP, the area of the second sub-pixel GP, and the area of the third sub-pixel BP may be different from each other.

Figure 4:
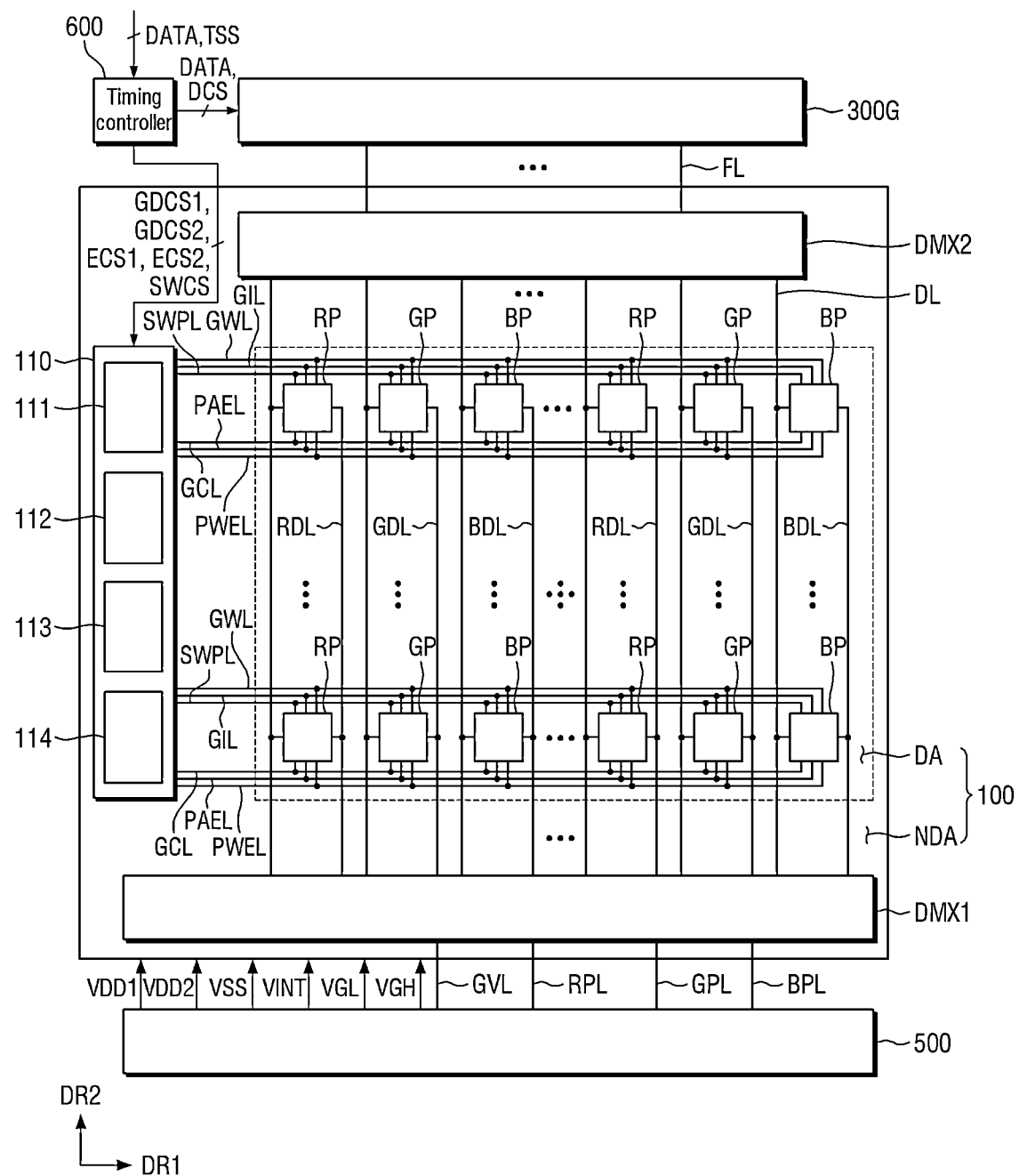
FIG. 4 is a block diagram illustrating a display device according to one or more embodiments.

FIG. 4 is a block diagram illustrating a display device according to one or more embodiments.

Referring to FIG. 4, the display device 10 includes a display panel 100, a scan driving circuit 110, a data driving circuit 300G, a timing control circuit 600, and a power supply circuit 500.

A display area DA of the display panel 100 may include sub-pixels RP, GP, and BP displaying an image, scan write lines GWL connected to the sub-pixels RP, GP, and BP, scan initialization lines GIL, scan control lines GCL, sweep signal lines SWPL, PWM light emitting lines PWEL, PAM light emitting lines PAEL, PWM data lines DL, first data lines RDL, second data lines GDL, and third data lines BDL.

The scan write lines GWL, scan initialization lines GIL, scan control lines GCL, sweep signal lines SWPL, PWM light emitting lines PWEL, and PAM light emitting lines PAEL may be extended in the first direction (X-axis direction) and may be disposed along the second direction (Y-axis direction) crossing the first direction (X-axis direction). The PWM data lines DL, the first data lines RDL, the second data lines GDL, and the third data lines BDL may be extended in the second direction (Y-axis direction) and may be extended in the first direction (X-axis direction). The first data lines RDL may be electrically connected to each other, the second data lines GDL may be electrically connected to each other, and the third data lines BDL may be electrically connected to each other.

The sub-pixels RP, GP, and BP may include first sub-pixels RP emitting a first light, second sub-pixels GP emitting a second light, and third sub-pixels BP emitting a third light. The first light indicates light in a red wavelength band, the second light indicates light in a green wavelength band, and the third light indicates light in a blue wavelength band. For example, the main peak wavelength of the first light may be located approximately 600 nm to 750 nm, the main peak wavelength of the second light may be located approximately 480 nm to 560 nm, and the main peak wavelength of the third light may be located approximately 370 nm to 460 nm.

Each of the sub-pixels RP, GP, and BP may be connected to one of the scan write lines GWL, one of the scan initialization lines GIL, one of the scan control lines GCL, one of the sweep signal lines SWL, one of the PWM light emitting lines PWEL, and one of the PAM light emitting lines PAEL. Also, each of the first sub-pixels RP may be connected to one of the PWM data lines DL and one of the first data lines RDL. Also, each of the second sub-pixels GP may be connected to one of the PWM data lines DL and one of the second data lines GDL. Also, each of the third sub-pixels BP may be connected to one of the PWM data lines DL and one of the third data lines BDL.

A non-display area NDA of the display panel 100 may include a scan driving circuit 110, a first demultiplexer DMX1, and a second demultiplexer DMX2.

The scan driving circuit 110 may be disposed on the display panel 100 to apply signals to scan write lines GWL, scan initialization lines GIL, scan control lines GCL, sweep signal lines SPWL, the PWM light emitting lines PWEL, and the PAM light emitting lines PAEL. FIG. 4 illustrates that the scan driving circuit 110 is disposed at one edge of the display panel 100 but is not limited thereto. The scan driving circuit 110 may be disposed on both edges of the display panel 100.

The scan driving circuit 110 may include a first scan signal driving circuit 111, a second scan signal driving circuit 112, a sweep signal driving circuit 113, and a light emitting signal driving circuit 114.

The first scan signal driving circuit 111 may receive a first scan driving control signal GDCS1 from the timing control circuit 600. The first scan signal driving circuit 111 may output scan initialization signals to scan initialization lines GIL and scan write signals to scan write lines GWL according to the first scan driving control signal GDCS1. That is, the first scan signal driving circuit 111 may output two scan signals, that is, scan initialization signals and scan write signals together.

The second scan signal driving circuit 112 may receive the second scan driving control signal GDCS2 from the timing control circuit 600. The second scan signal driving circuit 112 may output scan control signals to the scan control lines GCL according to the second scan driving control signal GDCS2.

The sweep signal driving circuit 113 may receive a first emitting control signal ECS1 and a sweep control signal SWCS from the timing control circuit 600. The sweep signal driving circuit 113 may output PWM light emitting signals to the PWM light emitting lines PWEL and output sweep signals to the sweep signal lines SWPL according to the first emitting control signal ECS1 and the sweep control signal SWCS. That is, the sweep signal driving circuit 113 may output PWM light emitting signals and sweep signals together.

The emitting signal driving circuit 114 may receive a second emitting control signal ECS2 from the timing control circuit 600. The light emitting signal driving circuit 114 may output PAM light emitting signals to the PAM light emitting lines PAEL according to the second light emitting control signal ECS2.

The first demultiplexer DMX1 switches the connection between each PWM data line DL and the global power line GVL. In addition, the first demultiplexer DMX1 switches the connection between each first data line RDL and a first data voltage line RPL, switches the connection between each second data line GDL and the second data voltage line GPL, and switches the connection between each third data line BDL and the third data voltage line BPL.

The second demultiplexer DMX2 may be disposed between the fan-out wirings FL and the PWM data lines DL. The second demultiplexer DMX2 may distribute the PWM data voltages applied to each fan-out line FL to Q (Q is an integer greater than or equal to 2) PWM data lines DL or Q first to third data lines RDL, GDL, and BDL.

The first demultiplexer DMX1 may be disposed adjacent to the second pads, and the second demux unit DMX2 may be disposed adjacent to the first pads. That is, the first demultiplexer DMX1 may be disposed adjacent to one side of the display panel 100, for example, a lower side of the display panel 100. The second demultiplexer DMX2 may be disposed adjacent to the other side of the display panel 100, for example, an upper side of the display panel 100.

The timing control circuit 600 receives digital video data DATA and timing signals TSS. The timing control circuit 600 may generate the first scan driving control signal GDCS1, a second scan driving control signal GDCS2, the first light emitting control signal ECS1, the second light emitting control signal ECS2, and a sweep control signal SWCS for controlling the operation timing of the scan driving circuit 110 according to the timing signals TSS. Also, the timing control circuit 600 may generate a source control signal DCS for controlling the operation timing of the data driving circuit 300G.

The timing control circuit 600 outputs the first scan driving control signal GDCS1, the second scan driving control signal GDCS2, the first emitting control signal ECS1, the second emitting control signal ECS2, and the sweep control signal SWCS to the scan driving circuit 110. The timing control circuit 600 outputs the digital video data DATA and the PWM control signal DCS to the data driving circuit 300G.

The data driving circuit 300G may include a plurality of source driving circuits 300. The data driving circuit 300G converts the digital video data DATA into analog PWM data voltages and outputs them to the fan-out wirings FL.

The power supply circuit 500 may generate and output a first data voltage to the first data voltage line RPL, may generate and output a second data voltage to the second data voltage line GPL, and may generate and output a third data voltage to the third data voltage line BPL. The power supply circuit 500 may generate and output the global power voltage to the global power line GVL.

In addition, the power supply circuit 500 may generate and output a plurality of power voltages to the display panel 100. For example, the power supply circuit 500 may output a first power voltage VDD1, a second power supply voltage VDD2, a third power voltage VSS, an initialization voltage VINT, a gate-on voltage VGL, and a gate-off voltage VGH to the display panel 100. The first power voltage VDD1 and the second power supply voltage VDD2 may be high potential driving voltages for driving light emitting elements of each of the sub-pixels RP, GP, and BP. The third power voltage VSS may be a low potential driving voltage for driving light emitting elements of each of the sub-pixels RP, GP, and BP. The initialization voltage VINT and the gate-off voltage VGH are applied to each of the sub-pixels RP, GP, and BP, and the gate-on voltage VGL and the gate-off voltage VGH may be applied to the scan driving circuit 110.

Figure 5:
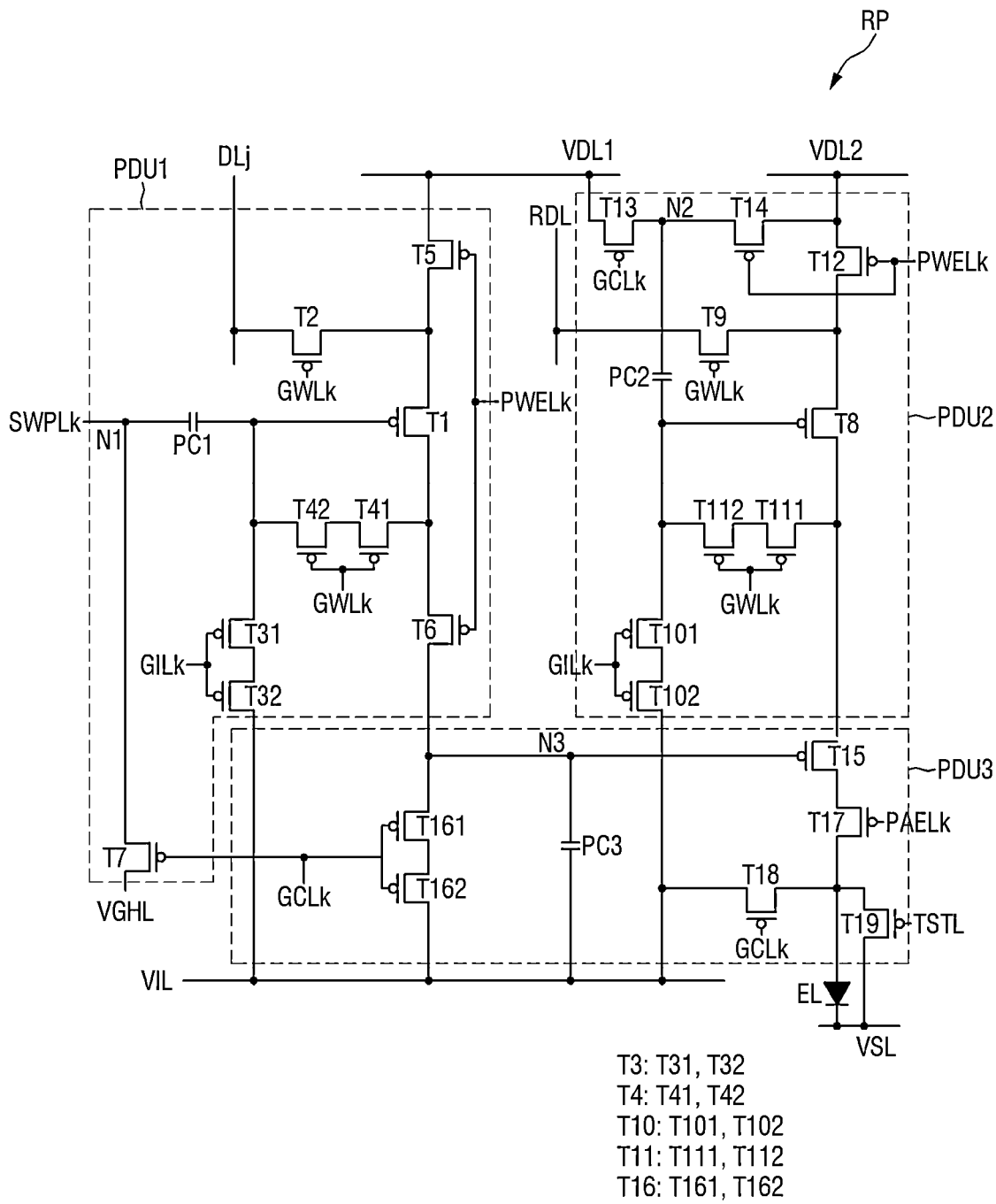
FIG. 5 is an equivalent circuit diagram illustrating a first sub-pixel according to one or more embodiments.

FIG. 5 is an equivalent circuit diagram illustrating a first sub-pixel according to one or more embodiments.

Referring to FIG. 5, the first sub-pixel RP according to an embodiment may be connected to a $k^{th}$ scan write line GWLk, a $k^{th}$ scan initialization line GILk, a $k^{th}$ scan control line GCLk, a $k^{th}$ sweep signal line SWPLk, a $k^{th}$ PWM light emitting line PWELk, and a $k^{th}$ PAM light emitting line PAELk. Also, the first sub-pixel RP may be connected to the $j^{th}$ PWM data line DLj and the first data line RDL. In addition, the first sub-pixel RP may be connected to the first power supply line VDL1 to which the first power voltage VDD1 is applied, the second power supply line VDL2 to which the second power supply voltage VDD2 is applied, a third power supply line VSL to which a third power supply voltage VSS is applied, an initialization voltage line VIL to which an initialization voltage VINT is applied, and a gate-off voltage line VGHL to which the gate-off voltage VGH is applied. In one or more embodiments, the $j^{th}$ PWM data line DLj may be referred to as a first data line, and the first data line RDL may be referred to as a second data line for convenience of description.

The first sub-pixel RP may include a light emitting element EL, a first pixel driving unit PDU1, a second pixel driving unit PDU2, and a third pixel driving unit PDU3.

The light emitting element EL emits light according to a driving current generated by the second pixel driving unit PDU2. The light emitting element EL may be disposed between the seventeenth transistor T17 and the third power supply line VSL. A first electrode of the light emitting element EL may be connected to the second electrode of the seventeenth transistor T17 and the second electrode may be connected to the third power supply line VSL. The first electrode of the light emitting element EL may be an anode electrode, and the second electrode may be a cathode electrode. A light emitting element EL may be an inorganic light emitting element including the first electrode, the second electrode, and the inorganic semiconductor disposed between the first electrode and the second electrode. For example, the light emitting element EL may be a micro light emitting diode formed of the inorganic semiconductor but is not limited thereto.

The first pixel driving unit PDU1 generates a control current according to the $j^{th}$ PWM data voltage of the $j^{th}$ PWM data line DLj to control a voltage of a third node N3 of the third pixel driving unit PDU3. Because a pulse width of the first driving current flowing through the light emitting element EL may be adjusted by the control current of the first pixel driving unit PDU1, the first pixel driving unit PDU1 may be a pulse width modulation PWM unit for performing pulse width modulation of the first driving current flowing through the light emitting element EL.

The first pixel driving unit PDU1 may include the first to seventh transistors T1 to T7 and a first capacitor PC1.

The first transistor T1 controls the control current flowing between the first electrode and the second electrode according to the PWM data voltage applied to a gate electrode.

The second transistor T2 is turned-on by a $k^{th}$ scan write signal of a $k^{th}$ scan write line GWLk to supply the PWM data voltage of the $j^{th}$ PWM data line DLj to the first electrode of the first transistor T1. The gate electrode of the second transistor T2 may be connected to the $k^{th}$ scan write line GWLk, the first electrode may be connected to the $j^{th}$ PWM data line DLj, and the second electrode may be connected to the first electrode of the first transistor T1.

The third transistor T3 is turned-on by a $k^{th}$ scan initialization signal of the $k^{th}$ scan initialization line GILk to connect the initialization voltage line VIL to the gate electrode of the first transistor T1. In this case, the gate-on voltage VGL of the $k^{th}$ scan initialization signal may be different from the initialization voltage VINT of the initialization voltage line VIL. By way of example, because the difference voltage between the gate-on voltage VGL and the initialization voltage VINT is greater than the threshold voltage of the third transistor T3, the third transistor T3 may be stably turned-on even after the initialization voltage VINT is applied to the gate electrode of the first transistor T1. Accordingly, when the third transistor T3 is turned-on, the initialization voltage VINT may be stably applied to the gate electrode of the first transistor T1 regardless of the threshold voltage of the third transistor T3.

The third transistor T3 may include a plurality of transistors connected in series. For example, the third transistor T3 may include a first sub-transistor T31 and a second sub-transistor T32. Accordingly, it is possible to prevent the voltage of the gate electrode of the first transistor T1 from leaking through the third transistor T3. The gate electrode of the first sub-transistor T31 may be connected to the $k^{th}$ scan initialization line GILk, the first electrode may be connected to the gate electrode of the first transistor T1, and the second electrode may be connected to the first electrode of the second sub-transistor T32. The gate electrode of the second sub-transistor T32 may be connected to the $k^{th}$ scan initialization line GILk, the first electrode may be connected to the second electrode of the first sub-transistor T31, and the second electrode may be connected to the initialization voltage line VIL.

The fourth transistor T4 is turned-on by the $k^{th}$ scan write signal of the $k^{th}$ scan write line GWLk to connect the gate electrode of the first transistor T1 to the second electrode of the first transistor T1. Accordingly, the first transistor T1 may operate as a diode (e.g., the first transistor T1 may be diode-connected) while the fourth transistor T4 is turned-on.

The fourth transistor T4 may include the plurality of transistors connected in series. For example, the fourth transistor T4 may include a third sub-transistor T41 and a fourth sub-transistor T42. Accordingly, it is possible to prevent the voltage of the gate electrode of the first transistor T1 from leaking through the fourth transistor T4. The gate electrode of the third sub-transistor T41 may be connected to the $k^{th}$ scan write line GWLk, the first electrode may be connected to the second electrode of the first transistor T1, and the second electrode may be connected to the first electrode of the fourth sub transistor T42. The gate electrode of the fourth sub-transistor T42 may be connected to the $k^{th}$ scan write line GWLk, the first electrode may be connected to the second electrode of the third sub-transistor T41, and the second electrode may be connected to the gate electrode of the first transistor T1.

The fifth transistor T5 is turned-on by the $k^{th}$ PWM light emitting signal of the $k^{th}$ PWM light emitting line PWELk to connect the first electrode of the first transistor T1 to the first power supply line VDL1. The gate electrode of the fifth transistor T5 may be connected to the $k^{th}$ PWM light emitting line PWELk, the first electrode may be connected to the first power supply line VDL1, and the second electrode may be connected to the first electrode of the first transistor T1.

The sixth transistor T6 is turned-on by the $k^{th}$ PWM light emitting signal of the $k^{th}$ PWM light emitting line PWELk to connect the second electrode of the first transistor T1 to the third node N3 of the third pixel driving unit PDU3. The gate electrode of the sixth transistor T6 may be connected to the $k^{th}$ PWM light emitting line PWELk, the first electrode may be connected to the second electrode of the first transistor T1, and the second electrode may be connected to the third node N3 of the third pixel driving unit PDU3.

The seventh transistor T7 is turned-on by the $k^{th}$ scan control signal of the $k^{th}$ scan control line GCLk to supply the gate-off voltage VGH of the gate-off voltage line VGHL to the first node N1 connected to the $k^{th}$ sweep signal line SWPLk. Accordingly, a voltage change of the gate electrode of the first transistor T1 may be prevented from being reflected to the $k^{th}$ sweep signal of the $k^{th}$ sweep signal line SWPLk by the first capacitor PC1 during the period in which the initialization voltage VINT is applied to the gate electrode of the first transistor T1 and the period in which the PWM data voltage of the $j^{th}$ PWM data line DLj and the threshold voltage Vth1 of the first transistor T1 are programmed. The gate electrode of the seventh transistor T7 may be connected to the $k^{th}$ scan control line GCLk, the first electrode may be connected to the gate-off voltage line VGHL, and the second electrode may be connected to the first node N1.

The first capacitor PC1 may be disposed between the gate electrode of the first transistor T1 and the first node N1. One electrode of the first capacitor PC1 may be connected to the gate electrode of the first transistor T1, and the other electrode may be connected to the first node N1.

The first node N1 may be a contact point of the $k^{th}$ sweep signal line SWPLk, the second electrode of the seventh transistor T7, and the other electrode of the first capacitor PC1.

The second pixel driving unit PDU2 generates the driving current applied to the light emitting element EL according to the first PWM data voltage of the first data line RDL. The second pixel driving unit PDU2 may be a pulse amplitude modulation unit (PAM unit) that performs pulse amplitude modulation. The second pixel driving unit PDU2 may be a constant current generator generating a constant driving current according to the first PWM data voltage.

In addition, the second pixel driving unit PDU2 of each of the first sub-pixels RP may receive the same first PWM data voltage and generate the same driving current regardless of the luminance of the first sub-pixel RP. Similarly, the second pixel driving unit PDU2 of each of the second sub-pixels GP may receive the same second PWM data voltage and generate the same driving current regardless of the luminance of the second sub-pixel GP. The third pixel driving unit PDU3 of each of the third sub-pixels BP may receive the same third PWM data voltage and generate the same driving current regardless of the luminance of the third sub-pixel BP.

The second pixel driving unit PDU2 may include eighth to fourteenth transistors T8 to T14 and a second capacitor PC2.

The eighth transistor T8 controls the driving current flowing to the light emitting element EL according to the voltage applied to the gate electrode.

The ninth transistor T9 is turned-on by a $k^{th}$ scan write signal of a $k^{th}$ scan write line GWLk to supply the first PWM data voltage of the first data line RDL to the first electrode of the eighth transistor T8. The gate electrode of the ninth transistor T9 may be connected to the $k^{th}$ scan write line GWLk, the first electrode may be connected to the first data line RDL, and the second electrode may be connected to the first electrode of the eighth transistor T8.

The tenth transistor T10 is turned-on by a $k^{th}$ scan initialization signal of a $k^{th}$ scan initialization line GILk to connect the initialization voltage line VIL to the gate electrode of the eighth transistor T8. Accordingly, the gate electrode of the eighth transistor T8 may be discharged to the initialization voltage VINT of the initialization voltage line VIL during the turned-on period of the tenth transistor T10. In this case, the gate-on voltage VGL of the $k^{th}$ scan initialization signal may be different from the initialization voltage VINT of the initialization voltage line VIL. By way of example, because the difference voltage between the gate-on voltage VGL and the initialization voltage VINT is greater than the threshold voltage of the tenth transistor T10, the tenth transistor T10 may be stably turned-on even after the initialization voltage VINT is applied to the gate electrode of the eighth transistor T8. Accordingly, when the tenth transistor T10 is turned-on, the initialization voltage VINT may be stably applied to the gate electrode of the eighth transistor T8 regardless of the threshold voltage of the tenth transistor T10.

The tenth transistor T10 may include the plurality of transistors connected in series. For example, the tenth transistor T10 may include a fifth sub-transistor T101 and a sixth sub-transistor T102. Accordingly, it is possible to prevent the voltage of the gate electrode of the eighth transistor T8 from leaking through the tenth transistor T10. The gate electrode of the fifth sub-transistor T101 may be connected to the $k^{th}$ scan initialization line GILk, the first electrode may be connected to the gate electrode of the eighth transistor T8, and the second electrode may be connected to the first electrode of the sixth sub transistor T102. The gate electrode of the sixth sub-transistor T102 may be connected to the $k^{th}$ scan initialization line GILk, the first electrode may be connected to the second electrode of the fifth sub-transistor T101, and the second electrode may be connected to the initialization voltage line VIL.

The eleventh transistor T11 is turned-on by the $k^{th}$ scan write signal of the $k^{th}$ scan write line GWLk and connects the gate electrode of the eleventh transistor T11 to the second electrode of the eighth transistor T8. Accordingly, the eighth transistor T8 may operate as a diode (e.g., the eighth transistor T8 is diode-connected) while the eleventh transistor T11 is turned-on.

The eleventh transistor T11 may include the plurality of transistors connected in series. For example, the eleventh transistor T11 may include a seventh sub-transistor T111 and an eighth sub-transistor T112. Accordingly, it is possible to prevent the voltage of the gate electrode of the eighth transistor T8 from leaking through the eleventh transistor T11. The gate electrode of the seventh sub-transistor T111 may be connected to the $k^{th}$ scan write line GWLk, the first electrode may be connected to the second electrode of the eighth transistor T8, and the second electrode may be connected to the first electrode of the eighth sub transistor T112. The gate electrode of the eighth sub-transistor T112 may be connected to the $k^{th}$ scan write line GWLk, the first electrode may be connected to the second electrode of the seventh sub-transistor T111, and the second electrode may be connected to the gate electrode of the eighth transistor T8.

The twelfth transistor T12 is turned-on by the $k^{th}$ PWM light emitting signal of the $k^{th}$ PWM light emitting line PWELk to connect the first electrode of the eighth transistor T8 to the second power supply line VDL2. The gate electrode of the twelfth transistor T12 may be connected to the $k^{th}$ PWM light emitting line PWELk, the first electrode may be connected to the second power line supply VDL2, and the second electrode may be connected to the first electrode of the eighth transistor T8.

The thirteenth transistor T13 is turned-on by the $k^{th}$ scan control signal of the $k^{th}$ scan control line GCLk and connects the first power supply line VDL1 to the second node N2. The gate electrode of the thirteenth transistor T13 may be connected to the $k^{th}$ scan control line GCLk, the first electrode may be connected to the first power supply line VDL1, and the second electrode may be connected to the second node N2.

The fourteenth transistor T14 is turned-on by the $k^{th}$ PWM light emitting signal of the $k^{th}$ PWM light emitting line PWELk and connects the second power supply line VDL2 to the second node N2. Accordingly, when the fourteenth transistor T14 is turned-on, the second power supply voltage VDD2 of the second power supply line VDL2 may be supplied to the second node N2. The gate electrode of the fourteenth transistor T14 may be connected to the $k^{th}$ PWM light emitting line PWELk, the first electrode may be connected to the second power supply line VDL2, and the second electrode may be connected to the second node N2.

The second capacitor PC2 may be disposed between the gate electrode of the eighth transistor T8 and the second node N2. One electrode of the second capacitor PC2 may be connected to the gate electrode of the eighth transistor T8, and the other electrode thereof may be connected to the second node N2.

The second node N2 may be the contact point of the second electrode of the thirteenth transistor T13, the second electrode of the fourteenth transistor T14, and the other electrode of the second capacitor PC2.

The third pixel driving unit PDU3 adjusts the period in which the driving current is applied to the light emitting element EL according to the voltage of the third node N3.

The third pixel driving unit PDU3 may include fifteenth to nineteenth transistors T15 to T19 and a third capacitor PC3.

The fifteenth transistor T15 is turned-on or turned-off depending on the voltage of the third node N3. When the fifteenth transistor T15 is turned-on, the driving current of the eighth transistor T8 may be supplied to the light emitting element EL. Also, when the fifteenth transistor T15 is turned-off, the driving current of the eighth transistor T8 may not be supplied to the light emitting element EL. Therefore, the turned-on period of the fifteenth transistor T15 may be substantially the same as the emission period of the light emitting element EL. The gate electrode of the fifteenth transistor T15 may be connected to the third node N3, the first electrode may be connected to the second electrode of the eighth transistor T8, and the second electrode may be connected to the first electrode of the seventeenth transistor T17.

The sixteenth transistor T16 is turned-on by the $k^{th}$ scan control signal of the $k^{th}$ scan control line GCLk to connect the initialization voltage line VIL to the third node N3. Accordingly, the third node N3 may be discharged to the initialization voltage of the initialization voltage line VIL during the turned-on period of the sixteenth transistor T16.

The sixteenth transistor T16 may include the plurality of transistors connected in series. For example, the sixteenth transistor T16 may include a ninth sub-transistor T161 and a tenth sub-transistor T162. Accordingly, it is possible to prevent the voltage of the third node N3 from leaking through the sixteenth transistor T16. The gate electrode of the ninth sub-transistor T161 may be connected to the $k^{th}$ scan control line GCLk, the first electrode may be connected to the third node N3, and the second electrode may be connected to the first electrode of the tenth sub-transistor T162. The gate electrode of the tenth sub-transistor T162 may be connected to the $k^{th}$ scan control line GCLk, the first electrode may be connected to the second electrode of the ninth sub-transistor T161, and the second electrode may be connected to the initialization voltage line VIL.

The seventeenth transistor T17 is turned-on by a $k^{th}$ PAM emission signal of the $k^{th}$ PAM light emitting line PAELk to connect the second electrode of the fifteenth transistor T15 to the first electrode of the light emitting element EL. The gate electrode of the seventeenth transistor T17 may be connected to the $k^{th}$ PAM light emitting line PAELk, the first electrode may be connected to the second electrode of the fifteenth transistor T15, and the second electrode may be connected to the first electrode of the light emitting element EL.

The eighteenth transistor T18 is turned-on by the $k^{th}$ scan control signal of the $k^{th}$ scan control line GCLk to connect the initialization voltage line VIL to the first electrode of the light emitting element EL. Accordingly, the first electrode of the light emitting element EL may be discharged to the initialization voltage of the initialization voltage line VIL during the turned-on period of the eighteenth transistor T18. The gate electrode of the eighteenth transistor T18 may be connected to the $k^{th}$ scan control line GCLk, the first electrode may be connected to the first electrode of the light emitting element EL, and the second electrode may be connected to the initialization voltage line VIL.

The nineteenth transistor T19 is turned-on by a test signal of a test signal line TSTL to connect the first electrode of the light emitting element EL to the third power supply line VSL. The gate electrode of the nineteenth transistor T19 may be connected to the test signal line TSTL, the first electrode may be connected to the first electrode of the light emitting element EL, and the second electrode may be connected to the third power supply line VSL.

The third capacitor PC3 may be disposed between the third node N3 and the initialization voltage line VIL. One electrode of the third capacitor PC3 may be connected to the third node N3, and the other electrode thereof may be connected to the initialization voltage line VIL.

The third node N3 may be the contact point of the second electrode of the sixth transistor T6, the gate electrode of the fifteenth transistor T15, the first electrode of the ninth sub-transistor T161, and one electrode of the third capacitor PC3.

One of the first electrode and the second electrode of each of the first to nineteenth transistors T1 to T19 may be a source electrode, and the other may be a drain electrode. The active layer of each of the first to nineteenth transistors T1 to T19 may be formed of one of poly silicon, amorphous silicon, and/or an oxide semiconductor. When the active layer of each of the first to nineteenth transistors T1 to T19 is polysilicon, it may be formed through a low temperature polysilicon (LTPS) process.

In addition, in FIG. 5, it has been mainly described that each of the first to nineteenth transistors T1 to T19 is formed of a P-type MOSFET, but one or more embodiments of the present disclosure are not limited thereto. For example, each of the first to nineteenth transistors T1 to T19 may be formed of an N-type MOSFET.

Alternatively, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, the seventh sub-transistor T111 and the eighth sub-transistor T112 of the eleventh transistor T11 in the first sub-pixel RP may be formed of the N-type MOSFET to increase the ability of the light emitting element EL to express black by blocking leakage current. In this case, the gate electrode of the third sub-transistor T41 and the gate electrode of the fourth sub-transistor T42 of the fourth transistor T4 and the gate electrode of the seventh sub-transistor T111 and the gate electrode of the eighth sub-transistor T112 of the eleventh transistor T11 may be connected to the $k^{th}$ control signal GNLk. The $k^{th}$ scan initialization signal GILk and the $k^{th}$ control signal GNLk may have pulses generated as gate-off voltages VGH. In addition, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the active layers of the seventh sub-transistor T111 and the eighth sub-transistor T112 of the eleventh transistor T11 are formed of the oxide semiconductor and the remaining transistors may be formed of polysilicon.

Alternatively, one of the first sub-transistor T31 and the second sub-transistor T32 of the third transistor T3 may be formed of the N-type MOSFET, and the other may be formed of the P-type MOSFET. In this case, a transistor formed of the N-type MOSFET from among the first sub-transistor T31 and the second sub-transistor T32 of the third transistor T3 may be formed of the oxide semiconductor, a transistor formed of an N-type MOSFET is formed of the oxide semiconductor, and a transistor formed of the P-type MOSFET may be formed of polysilicon.

Alternatively, one of the third sub-transistor T41 and the fourth sub-transistor T42 of the fourth transistor T4 may be formed of the N-type MOSFET, and the other may be formed of the P-type MOSFET. In this case, a transistor formed of an N-type MOSFET from among the third sub-transistor T41 and the fourth sub-transistor T42 of the fourth transistor T4 may be formed of the oxide semiconductor, and a transistor formed of the P-type MOSFET may be formed of polysilicon.

Alternatively, one of the fifth sub-transistor T101 and the sixth sub-transistor T102 of the tenth transistor T10 may be formed of the N-type MOSFET, and the other may be formed of the P-type MOSFET. In this case, a transistor formed of the N-type MOSFET from among the fifth sub-transistor T101 and the sixth sub-transistor T102 of the tenth transistor T10 may be formed of the oxide semiconductor, and a transistor formed of the P-type MOSFET may be formed of polysilicon.

Alternatively, one of the seventh sub-transistor T111 and the eighth sub-transistor T112 of the eleventh transistor T11 may be formed of the N-type MOSFET, and the other may be formed of the P-type MOSFET. In this case, a transistor formed of the N-type MOSFET from among the seventh sub-transistor T111 and the eighth sub-transistor T112 of the eleventh transistor T11 may be formed of the oxide semiconductor, and a transistor formed of the P-type MOSFET may be formed of polysilicon.

In one or more embodiments, the second sub-pixel GP and the third sub-pixel BP according to one or more embodiments may be substantially the same as the first sub-pixel RP described in connection with FIG. 2. Therefore, descriptions of the second sub-pixel GP and the third sub-pixel BP according to one or more embodiments are omitted.

Figure 6:
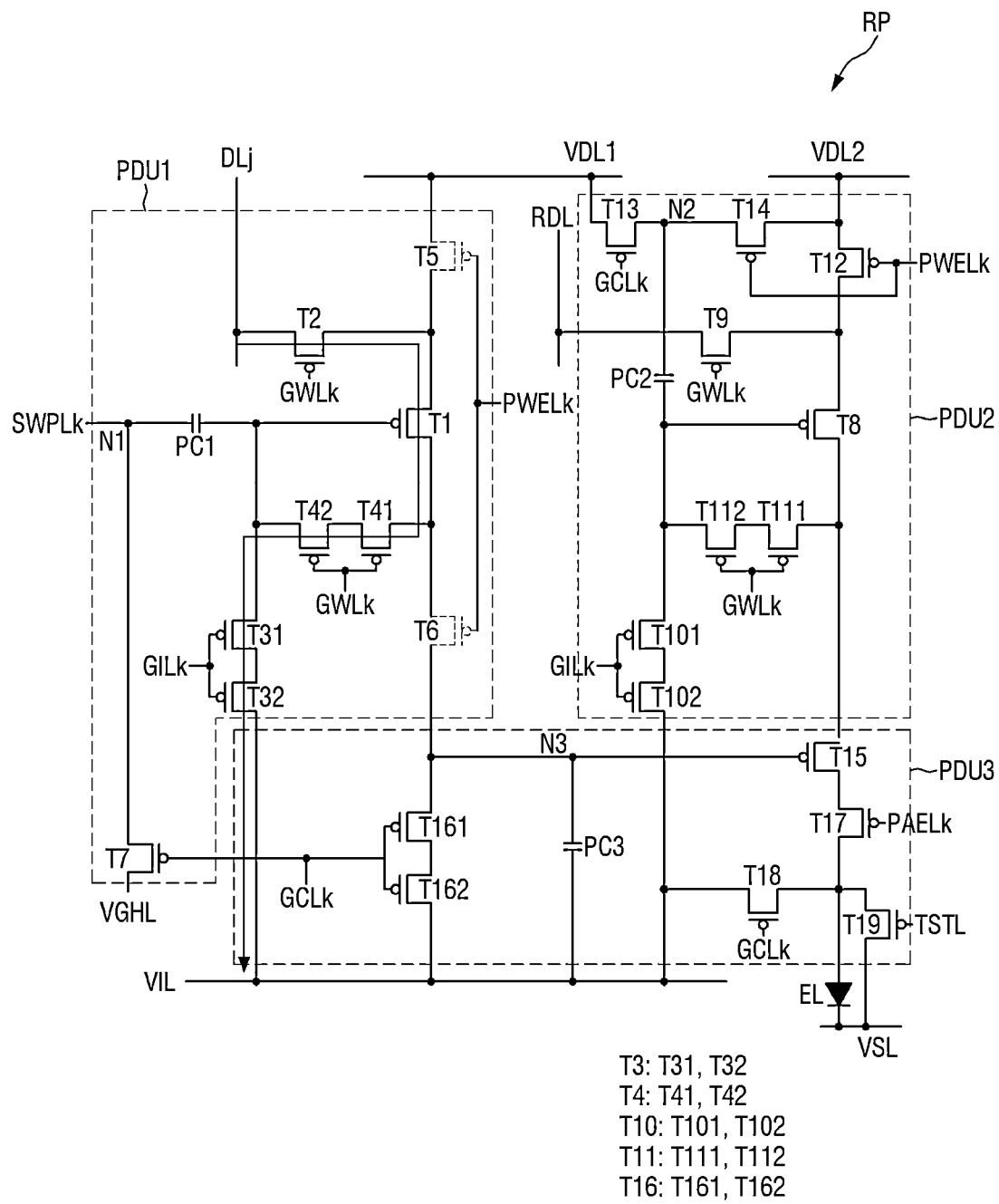
FIG. 6 is an equivalent circuit diagram illustrating an operation of a first sub-pixel in an inspection mode according to one or more embodiments.

FIG. 6 is an equivalent circuit diagram illustrating an operation of a first sub-pixel in an inspection mode according to one or more embodiments.

Referring to FIG. 6, the inspection mode is the mode to check short circuits and open (or disconnected) paths of currents flowing through the first transistor T1, the third transistor T3, and the fourth transistor T4 of the first pixel driving unit PDU1. In the inspection mode, the first transistor T1, the second transistor T2, the third transistor T3, the fourth transistor T4, and the seventh transistor T7 of the first pixel driving unit PDU1 may be turned-on and the fifth transistor T5 and the sixth transistor T6 of the first pixel driving unit PDU1 may be turned-off.

Due to the turn-on of the first transistor T1, the second transistor T2, the third transistor T3, and the fourth transistor T4 in the inspection mode, a current may flow from the first pixel driving unit PDU1 to the initialization voltage line VIL through the second transistor T2, the first transistor T1, the fourth transistor T4, and the third transistor T3, from the $j^{th}$ data line DLj. The short circuits and open (or disconnected) paths of currents flowing through the first transistor T1, the fourth transistor T4, and the third transistor T3, of the first pixel driving unit PDU1 may be inspected as the current is sensed.

For example, when the current value is 0, it may be determined that the open (or disconnection) has occurred in the path of a current flowing through the first transistor T1, the fourth transistor T4, and the third transistor T3, of the first pixel driving unit PDU1. In addition, when the current value is greater than the first threshold value, it may be determined that the short circuit has occurred in the paths of the current flowing through the first transistor T1, the fourth transistor T4, and the third transistor T3, of the first pixel driving unit PDU1. That is, when the current value is greater than 0 and less than or equal to the first threshold value, it may be determined that there is no short circuit or open (or disconnected) path of the current flowing through the first transistor T1, the fourth transistor T4, and the third transistor T3, of the first pixel driving unit PDU1.

Figure 7:
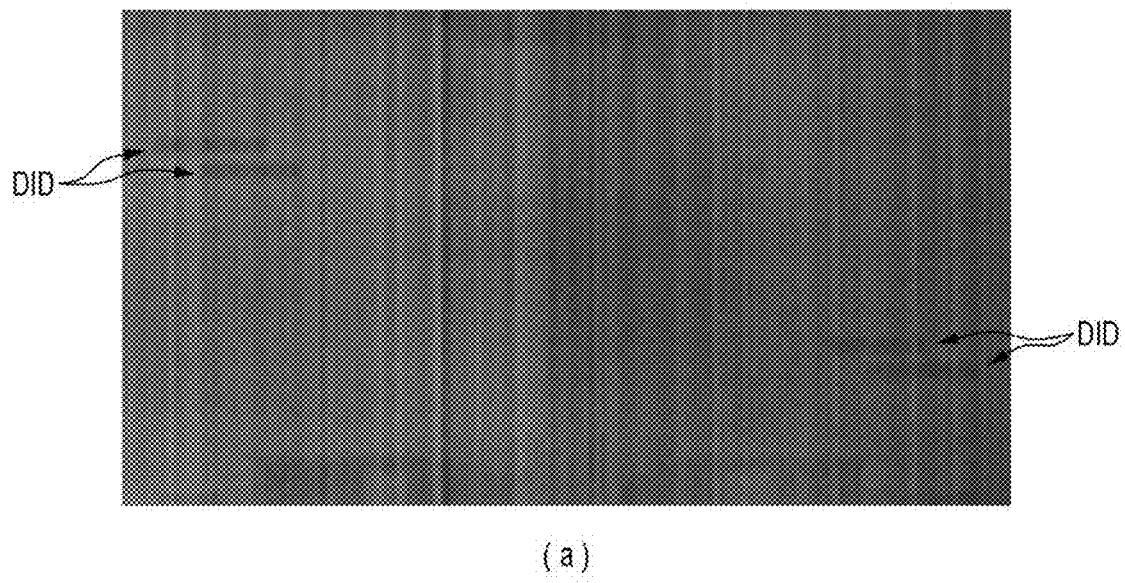
FIG. 7 are images illustrating a rear surface of a display device depending on whether the light is present or not in an inspection mode according to one or more embodiments.
Figure 7:
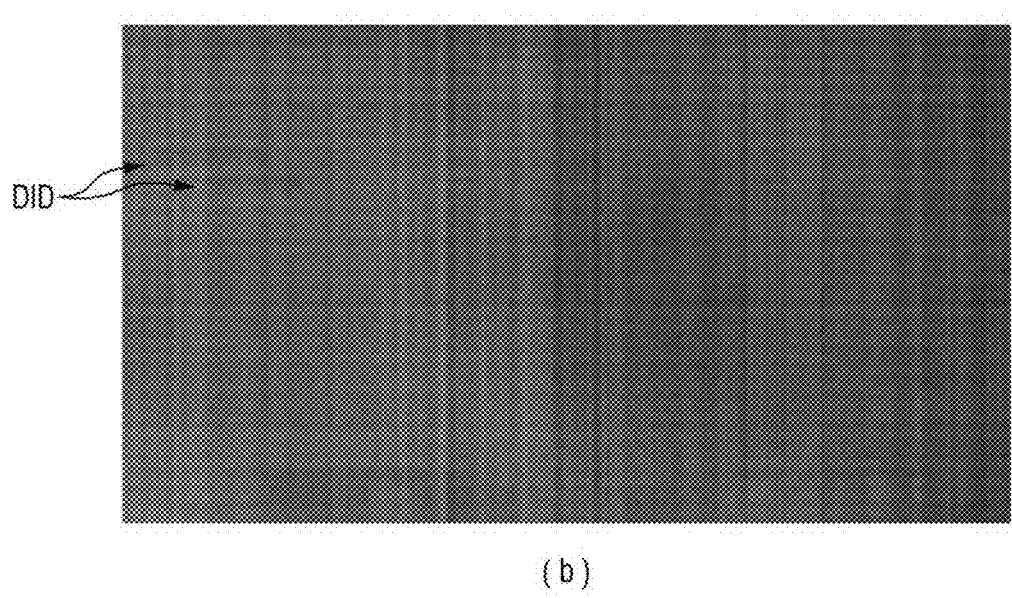

FIG. 7 are images illustrating a rear surface of a display device depending on whether the light is present or not in an inspection mode according to one or more embodiments. FIG. 7(a) is a current pattern image of the display device when lighting is present, and FIG. 7(b) is a current pattern image of the display device when lighting is absent.

Referring to FIG. 7, a plurality of electrically floated device identifiers DID may be visually recognized according to the current flowing through the first transistor T1, the fourth transistor T4, and the third transistor T3, of the first pixel driving unit PDU1. Specifically, when there is lighting as shown in (a) of FIG. 7, the plurality of device identifiers DID may be better visually recognized than when there is no lighting as shown in (b) of FIG. 7.

Figure 8:
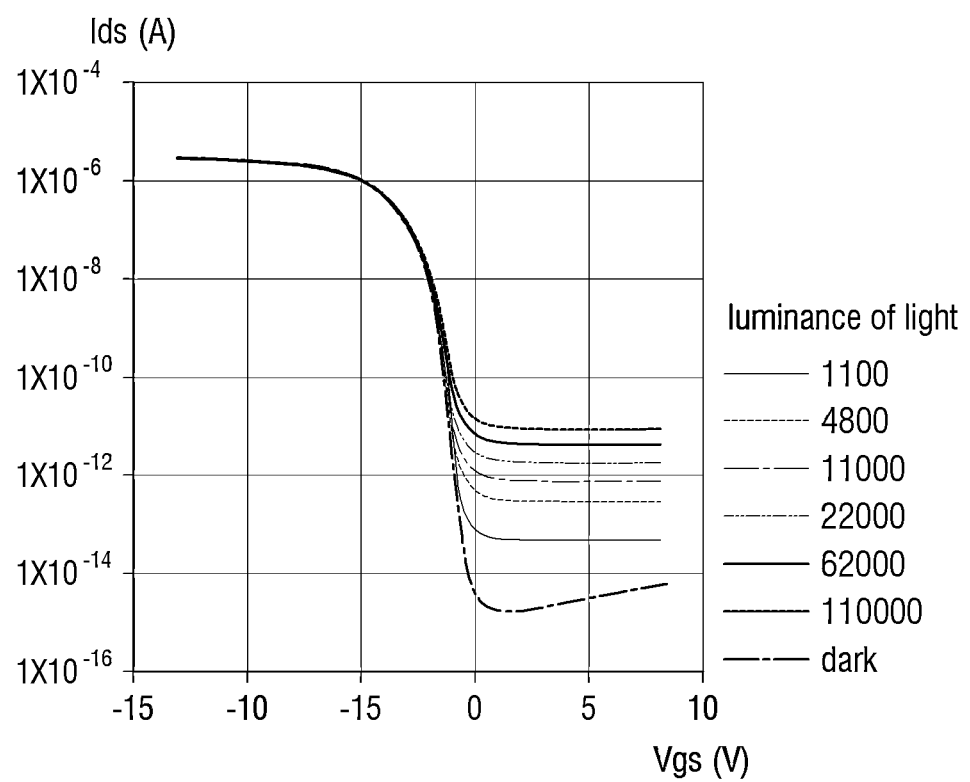
FIG. 8 is a graph illustrating the light leakage current depending on the luminance of the light according to the voltage between the gate and the source of the fourth transistor.

FIG. 8 is a graph illustrating the light leakage current depending on the luminance of the light according to the voltage between the gate and the source of the fourth transistor.

In FIG. 8, the X-axis shows the voltage between the gate and source of the fourth transistor T4 and the Y-axis shows the current Isd flowing from the first electrode to the second electrode of the fourth transistor T4.

Referring to FIG. 8, the off current of the fourth transistor T4 increases as the luminance of lighting increases. That is, the light leakage current of the fourth transistor T4 is proportional to the luminance of the light. Therefore, a plurality of device identifiers DID may be identified as shown in FIG. 7(a) due to an increase in the light leakage current of the fourth transistor T4. Therefore, it is necessary to reduce the light leakage current of the fourth transistor T4.

Similarly, when the light leakage current of the first transistor T1 and the third transistor T3 located in the current path increases in the inspection mode, a case in which the plurality of device identifiers DID are identified may occur. Therefore, it is necessary to reduce the light leakage current of the first transistor T1 and the third transistor T3 as well as the fourth transistor T4.

Figure 9:
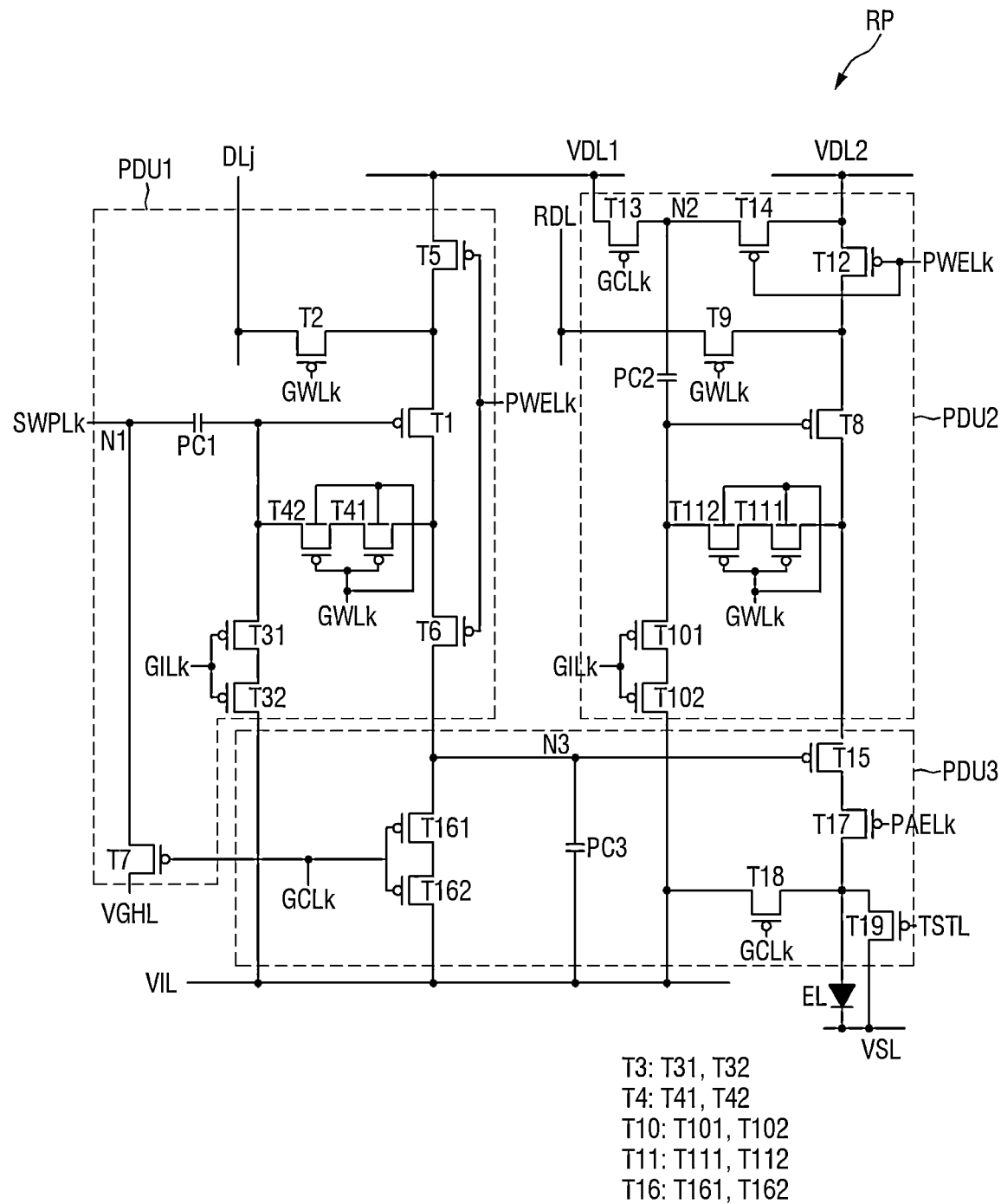
FIG. 9 is an equivalent circuit diagram illustrating a first sub-pixel according to one or more embodiments.

FIG. 9 is an equivalent circuit diagram illustrating a first sub-pixel according to one or more embodiments.

The embodiment of FIG. 9 is different from the embodiment of FIG. 5 in that the third sub-transistor T41 and the fourth sub-transistor T42 of the fourth transistor T4 include a bottom gate electrode, and the seventh sub-transistor T111 and the eighth sub-transistor T112 of the eleventh transistor T11 include the bottom gate electrode. In FIG. 9, differences from the embodiment of FIG. 5 will be mainly described.

Referring to FIG. 9, the bottom gate electrode of the third sub-transistor T41 and the bottom gate electrode of the fourth sub-transistor T42 of the fourth transistor T4 may be electrically connected to each other. For example, the bottom gate electrode of the third sub-transistor T41 and the bottom gate electrode of the fourth sub-transistor T42 of the fourth transistor T4 may be connected to the $k^{th}$ scan write line GWLk. In this case, the bottom gate electrode of the third sub-transistor T41 and the bottom gate electrode of the fourth sub-transistor T42 of the fourth transistor T4 may be connected to the gate electrode (or the top gate electrode) of the third sub-transistor T41 and the gate electrode (or the top gate electrode) of the fourth sub-transistor T42 of the fourth transistor T4. Therefore, the bottom gate electrode of the third sub-transistor T41 and the bottom gate electrode of the fourth sub-transistor T42 of the fourth transistor T4 may have the same potential as the gate electrode (or the top gate electrode) of the third sub-transistor T41 and the gate electrode (or the top gate electrode) of the fourth sub-transistor T42 of the fourth transistor T4. That is, the voltage of the bottom gate electrode and the voltage of the gate electrode (or the top gate electrode) of the third sub-transistor T41 are synchronized, and the voltage of the bottom gate electrode and the voltage of the gate electrode (or the top gate electrode) of the fourth sub-transistor T42 may be synchronized.

The bottom gate electrode of the seventh sub-transistor T111 and the bottom gate electrode of the eighth sub-transistor T112 of the eleventh transistor T11 may be electrically connected to each other. For example, the bottom gate electrode of the seventh sub-transistor T111 and the bottom gate electrode of the eighth sub-transistor T112 of the eleventh transistor T11 may be connected to the $k^{th}$ scan write line GWLk. In this case, the bottom gate electrode of the seventh sub-transistor T111 and the bottom gate electrode of the eighth sub-transistor T112 of the eleventh transistor T11 may be connected to the gate electrode (or the top gate electrode) of the seventh sub-transistor T111 and the gate electrode (or the top gate electrode) of the eighth sub-transistor T112 of the eleventh transistor T11. Therefore, the bottom gate electrode of the seventh sub-transistor T111 and the bottom gate electrode of the eighth sub-transistor T112 of the eleventh transistor T11 may have the same potential as the gate electrode (or the top gate electrode) of the seventh sub-transistor T111 and the gate electrode (or the top gate electrode) of the eighth sub-transistor T112 of the eleventh transistor T11. That is, the voltage of the bottom gate electrode and the voltage of the gate electrode (or the top gate electrode) of the seventh sub-transistor T111 are synchronized, and the voltage of the bottom gate electrode and the voltage of the gate electrode (or the top gate electrode) of the eighth sub-transistor T112 may be synchronized.

Figure 10:
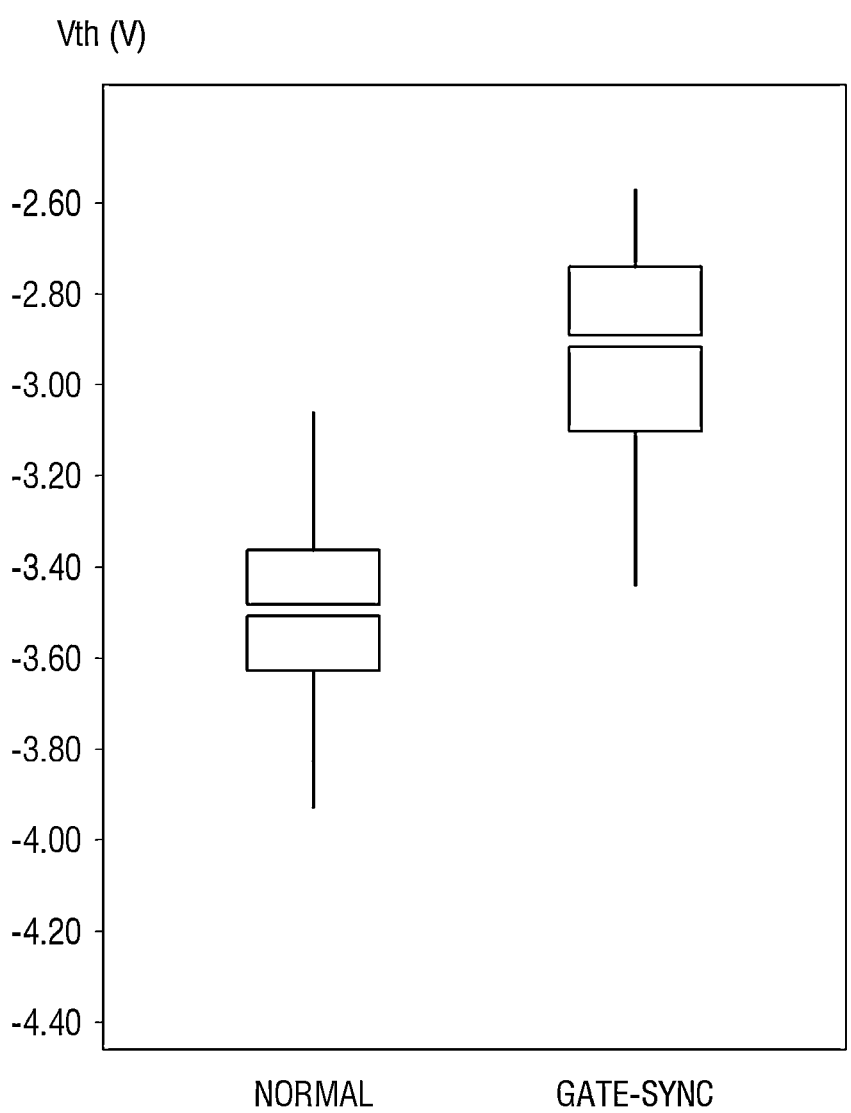
FIG. 10 is a graph illustrating a threshold voltage of a fourth transistor depending on the presence or absence of a bottom gate electrode according to one or more embodiments.
Figure 11:
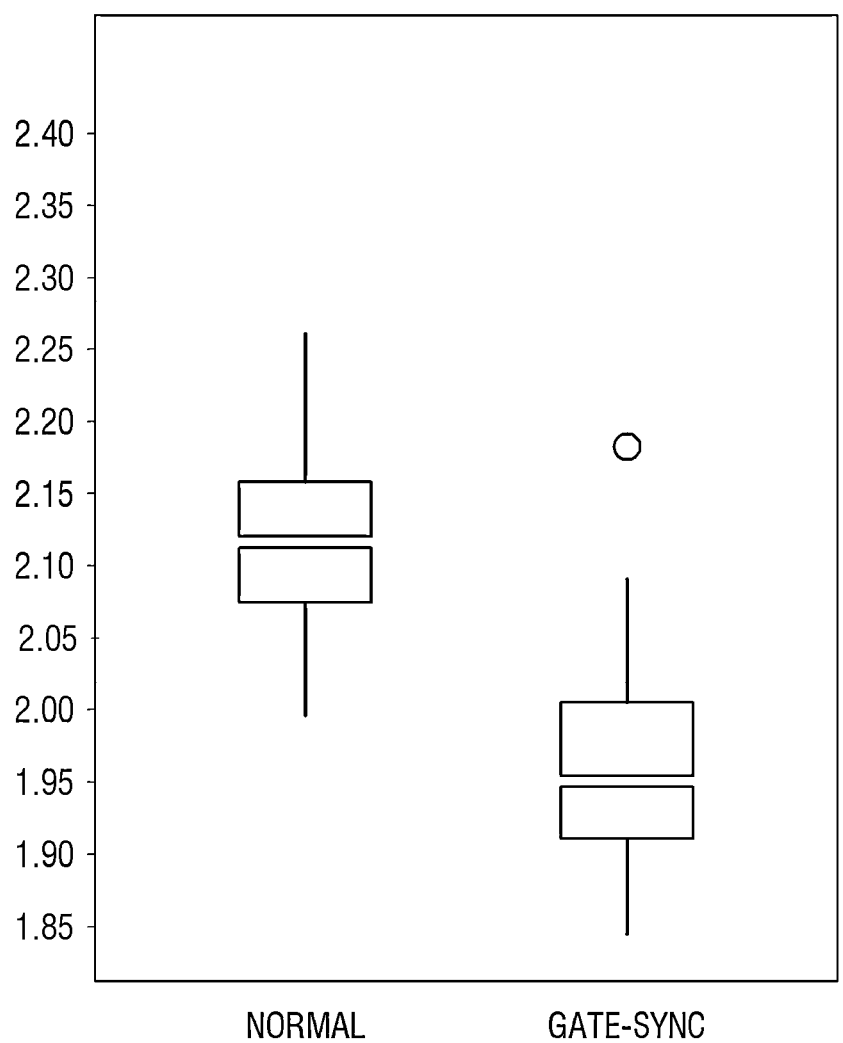
FIG. 11 is a graph illustrating a driving voltage range of a fourth transistor depending on the presence or absence of a bottom gate electrode according to one or more embodiments.

FIG. 10 is a graph illustrating a threshold voltage of a fourth transistor depending on the presence or absence of a bottom gate electrode according to one or more embodiments. FIG. 11 is a graph illustrating a driving voltage range of a fourth transistor depending on the presence or absence of a bottom gate electrode according to one or more embodiments.

In FIGS. 10 and 11, the presence or absence of the bottom gate electrode is represented on the X-axis. In FIG. 10, the Y-axis represents the threshold voltage of the fourth transistor T4, and in FIG. 11, the Y-axis represents the driving voltage range of the fourth transistor T4.

Referring to FIGS. 10 and 11, when the bottom gate electrode of the fourth transistor T4 is electrically connected to the top gate electrode (GATE-SYNC), the threshold voltage Vth of the fourth transistor T4 may be shifted more positively than the threshold voltage Vth of the fourth transistor T4 that does not include the bottom gate electrode (NORMAL). In addition, when the bottom gate electrode of the fourth transistor T4 is electrically connected to the top gate electrode (GATE-SYNC), the driving voltage range (e.g., DR range) of the fourth transistor T4 may be lower than the driving voltage range DR range of the fourth transistor T4 that does not include the bottom gate electrode (NORMAL). However, when the bottom gate electrode of the fourth transistor T4 is electrically connected to the top gate electrode (GATE-SYNC), the width of the driving voltage range DR range of the fourth transistor T4 may be similar to the width of the driving voltage range DR range of the fourth transistor T4 not including the bottom gate electrode.

FIGS. 10 and 11 illustrate that the bottom gate electrode of the third sub-transistor T41 of the fourth transistor T4 is connected to the gate electrode (or the top gate electrode) of the third sub-transistor T41 when the bottom gate electrode of the fourth transistor T4 is electrically connected to the top gate electrode (GATE-SYNC) and the bottom gate electrode of the fourth sub-transistor T42 is electrically connected to the gate electrode (or top gate electrode) of the fourth sub-transistor T42.

Figure 12:
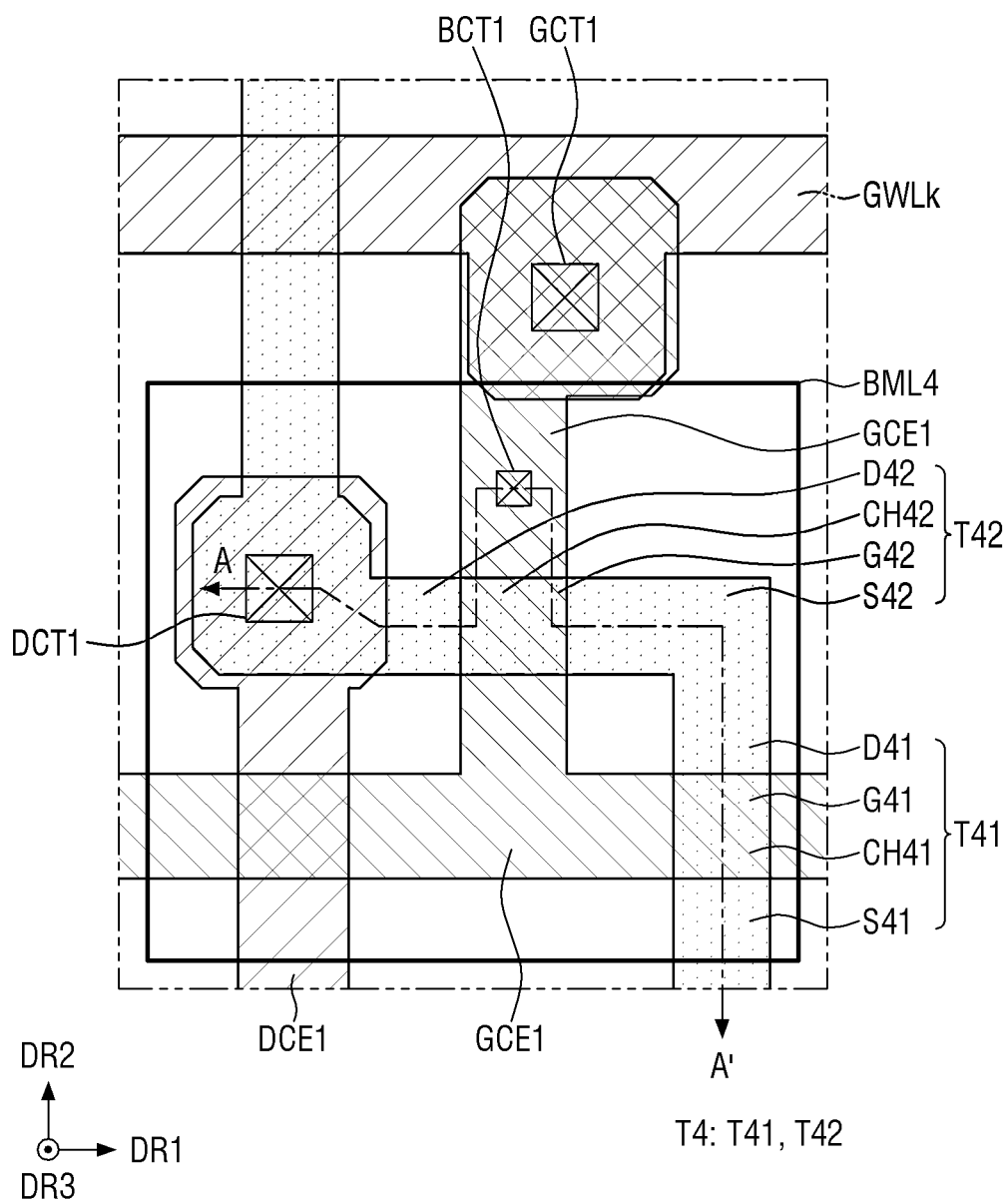
FIG. 12 is a layout diagram illustrating a fourth transistor of a first sub-pixel according to one or more embodiments.

FIG. 12 is a layout diagram illustrating a fourth transistor of a first sub-pixel according to one or more embodiments.

Referring to FIG. 12, the third sub-transistor T41 of the fourth transistor T4 includes a third sub-channel CH41, a third sub-gate electrode G41, a fourth bottom gate electrode BML4, a third sub-source electrode S41, and a third sub-drain electrode D41. The third sub-channel CH41 may overlap the third sub-gate electrode G41 and the fourth bottom gate electrode BML4 in the third direction DR3. The third sub-source electrode S41 may be disposed on one side of the third sub-channel CH41, and the third sub-drain electrode D31 may be disposed on the other side of the third sub-channel CH41.

The fourth sub-transistor T42 of the fourth transistor T4 includes a fourth sub-channel CH42, a fourth sub-gate electrode G42, a fourth bottom gate electrode BML4, a fourth sub-source electrode S42, and a fourth sub-drain electrode D42. The fourth sub-channel CH42 may overlap the fourth sub-gate electrode G42 and the fourth bottom gate electrode BML4 in the third direction DR3. The fourth sub-source electrode S42 may be disposed on one side of the fourth sub-channel CH42, and the fourth sub-drain electrode D42 may be disposed on the other side of the fourth sub-channel CH42. The fourth sub-source electrode S42 may be connected to a third sub-drain electrode D41. The fourth sub-drain electrode D42 may be connected to a first source connection electrode DCE1 through a first source contact hole DCT1.

The third sub-gate electrode G41 and the fourth sub-gate electrode G42 may be integrally formed with the first gate connection electrode GCE1. The first gate connection electrode GCE1 may be connected to the $k^{th}$ scan write line GWLk through a first gate contact hole GCT1. The first gate connection electrode GCE1 may be connected to the fourth bottom gate electrode BML4 through a first lower contact hole BCT1.

The fourth bottom gate electrode BML4 may overlap the third sub-channel CH41, the third sub-source electrode S41, and the third sub-drain electrode D41 of the third sub-transistor T41 and the fourth sub-channel CH42, the fourth sub-source electrode S42, and the fourth sub-drain electrode D42 of the fourth sub-transistor T42. Light incident from the outside is blocked by the fourth bottom gate electrode BML4, so it may not be incident to the third sub-channel CH41 of the third sub-transistor T41 and the fourth sub-channel CH42 of the fourth sub-transistor T42. Therefore, it is possible to prevent the plurality of device identifiers DID from being visually recognized in the inspection mode because the light leakage current of the third sub-transistor T41 and the light leakage current of the fourth sub-transistor T42 may be reduced.

Figure 13:
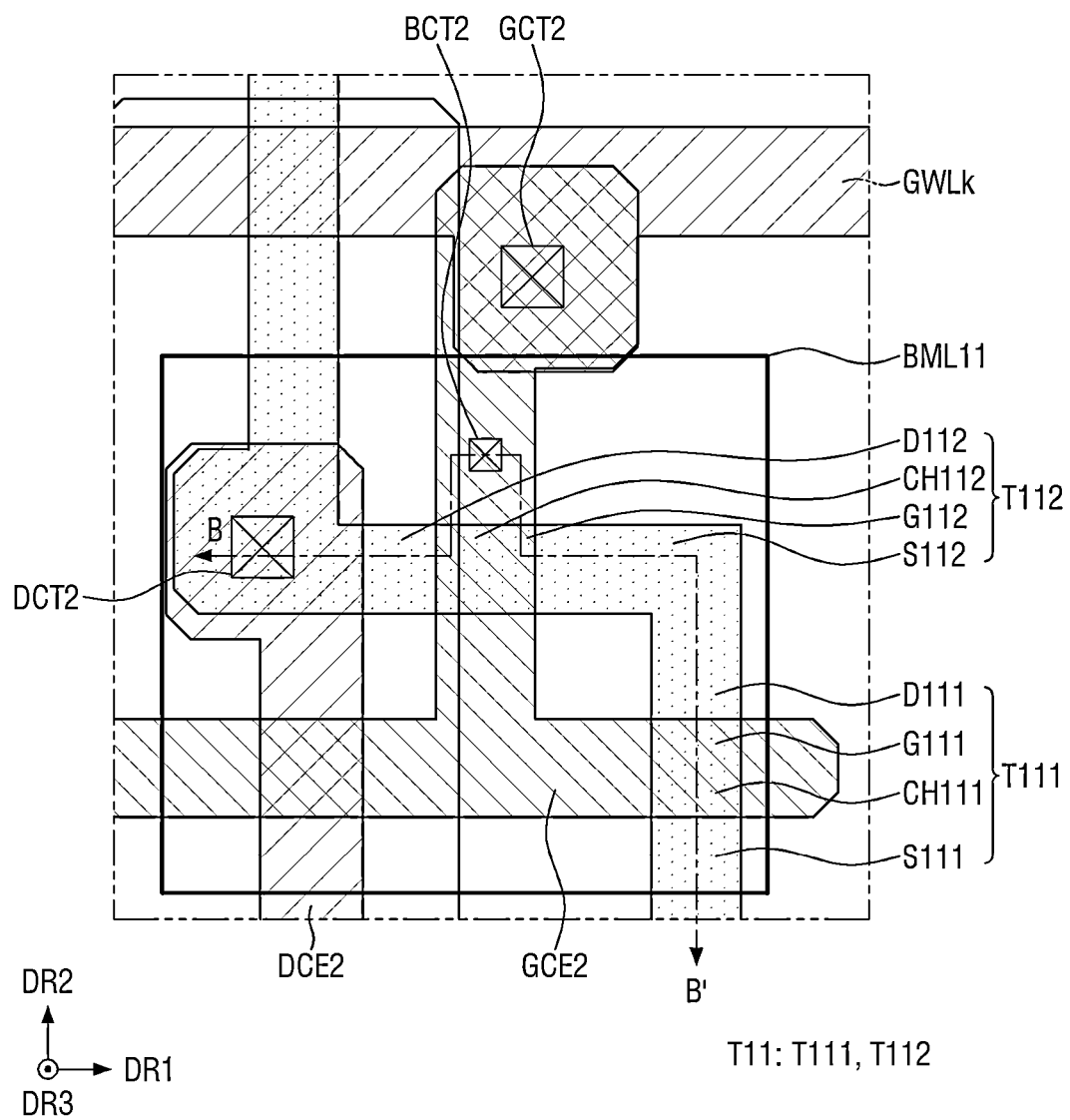
FIG. 13 is a layout diagram illustrating an eleventh transistor of a first sub-pixel according to one or more embodiments.

FIG. 13 is a layout diagram illustrating an eleventh transistor of a first sub-pixel according to one or more embodiments.

Referring to FIG. 13, the seventh sub-transistor T111 of the eleventh transistor T11 includes a seventh sub-channel CH111, a seventh sub-gate electrode G111, an eleventh bottom gate electrode BML11, a seventh sub-source electrode S111, and a seventh sub-drain electrode D111. The seventh sub-channel CH111 may overlap the seventh sub-gate electrode G111 and the eleventh bottom gate electrode BML11 in the third direction DR3. The seventh sub-gate electrode G111 may be integrally formed with the second gate connection electrode GCE2. The seventh sub-source electrode S111 may be disposed on one side of the seventh sub-channel CH111, and the seventh sub-drain electrode D111 may be disposed on the other side of the seventh sub-channel CH111.

The eighth sub-transistor T112 of the eleventh transistor T11 includes an eighth sub-channel CH112, an eighth sub-gate electrode G112, the eleventh bottom gate electrode BML11, an eighth sub-source electrode S112, and an eighth sub-drain electrode D112. The eighth sub-channel CH112 may overlap the eighth sub-gate electrode G112 and the eleventh bottom gate electrode BML11 in the third direction DR3. The eighth sub-gate electrode G112 may be integrally formed with the second gate connection electrode GCE2. The eighth sub-source electrode S112 may be disposed on one side of the eighth sub-channel CH112, and the eighth sub-drain electrode D112 may be disposed on the other side of the eighth sub-channel CH112. The eighth sub-source electrode S112 may be connected to the seventh sub-drain electrode D111, and the eighth sub-drain electrode D112 may be connected to a second source connection electrode DCE2 through a second source contact hole DCT2.

The seventh sub-gate electrode G111 and the eighth sub-gate electrode G112 may be integrally formed with the second gate connection electrode GCE2. The second gate connection electrode GCE2 may be connected to the $k^{th}$ scan write line GWLk through a second gate contact hole GCT2. The second gate connection electrode GCE2 may be connected to the eleventh bottom gate electrode BML11 through a second lower contact hole BCT2.

The eleventh bottom gate electrode BML11 may overlap the seventh sub-channel CH111, the seventh sub-source electrode S111, and the seventh sub-drain electrode D111 of the seventh sub-transistor T111, and the eighth sub-channel CH112, the eighth sub-source electrode S112, and the eighth sub-drain electrode D112 of the eighth sub-transistor T112. Light incident from the outside is blocked by the eleventh bottom gate electrode BML11 so it may not be incident to the seventh sub-channel CH111 of the seventh sub-transistor T111 and the eighth sub-channel CH112 of the eighth sub-transistor T112. Therefore, it is possible to prevent the plurality of device identifiers DID from being visually recognized in the inspection mode because the light leakage current of the seventh sub-transistor T111 and the light leakage current of the eighth sub-transistor T112 may be reduced.

Figure 14:
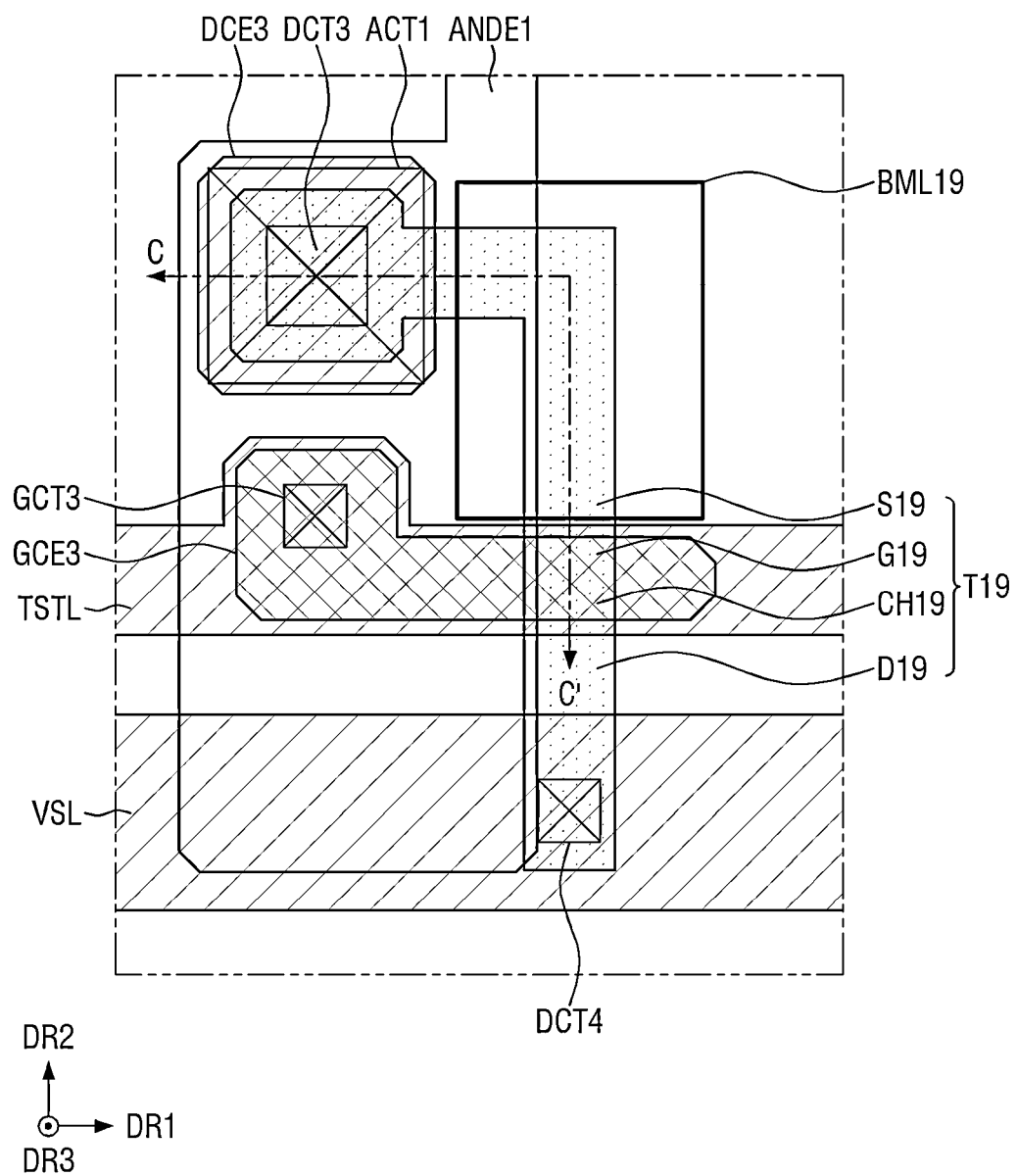
FIG. 14 is a layout diagram illustrating a nineteenth transistor of a first sub-pixel according to one or more embodiments.

FIG. 14 is a layout diagram illustrating a nineteenth transistor of a first sub-pixel according to another embodiment.

Referring to FIG. 14, the nineteenth transistor T19 includes a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth source electrode S19 may be disposed on one side of the nineteenth channel CH19, and the nineteenth drain electrode D19 may be disposed on the other side of the nineteenth channel CH19.

The nineteenth source electrode S19 may be connected to a third source connection electrode DCE3 through a third source contact hole DCT3. The nineteenth drain electrode D19 may be connected to the third power supply line VSL through a fourth source contact hole DCT4.

The nineteenth gate electrode G19 may be integrally formed with the third gate connection electrode GCE3. The third gate connection electrode GCE3 may be connected to the test signal line TSTL through a third gate contact hole GCT3.

A first anode connection electrode ANDE1 may be connected to the third source connection electrode DCE3 through a first anode contact hole ACT1.

A light blocking layer BML19 may be in an electrically floating state. The light blocking layer BML19 may not be electrically connected to other electrodes or other wires. The light blocking layer BML19 may overlap the nineteenth source electrode S19. The light blocking layer BML19 may be a structure for blocking light from the light emitting element EL from being reflected by the rear surface metal layer and incident to a channel of a transistor.

Figure 15:
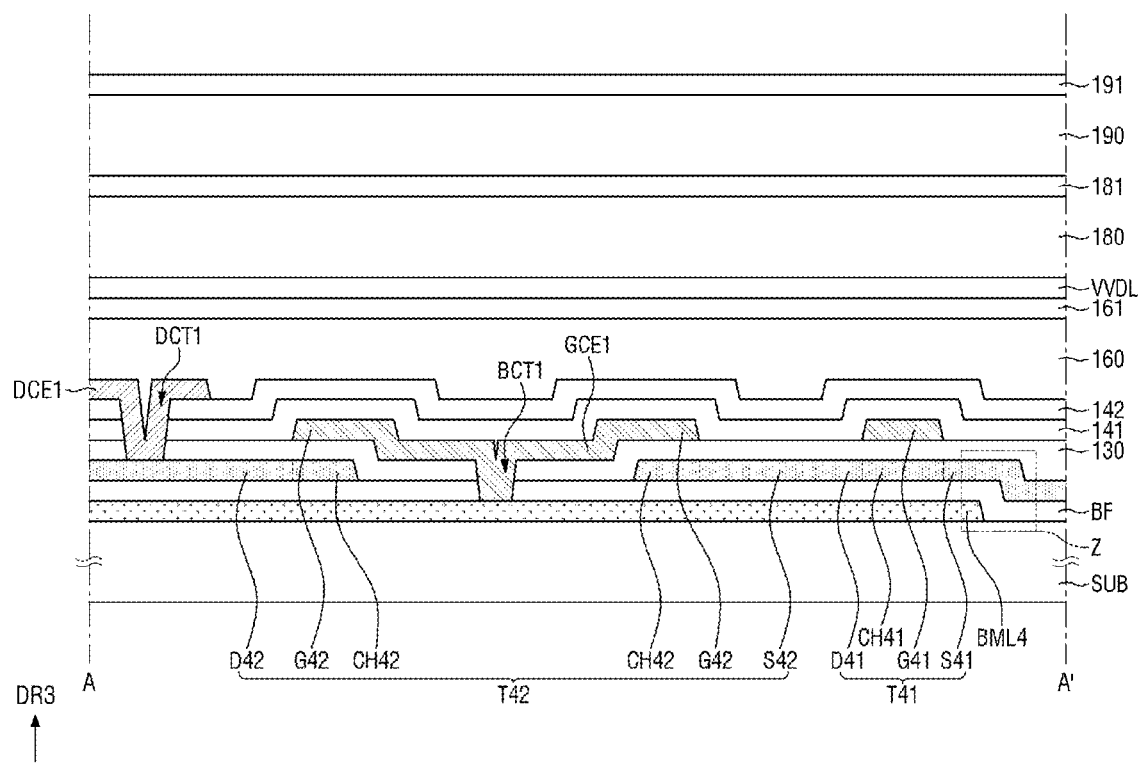
FIG. 15 is a cross-sectional view illustrating an example of a display panel taken along the line A-A' of FIG. 12.
Figure 16:
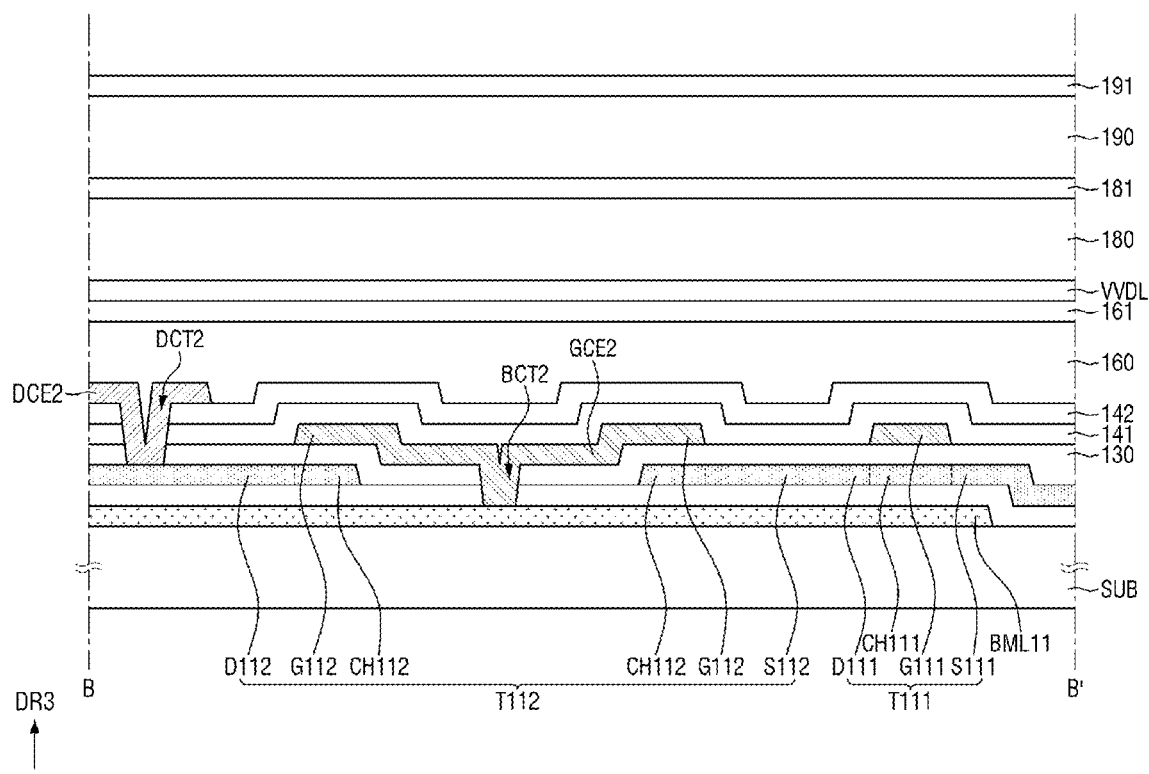
FIG. 16 is a cross-sectional view illustrating an example of a display panel taken along the line B-B' of FIG. 13.
Figure 17:
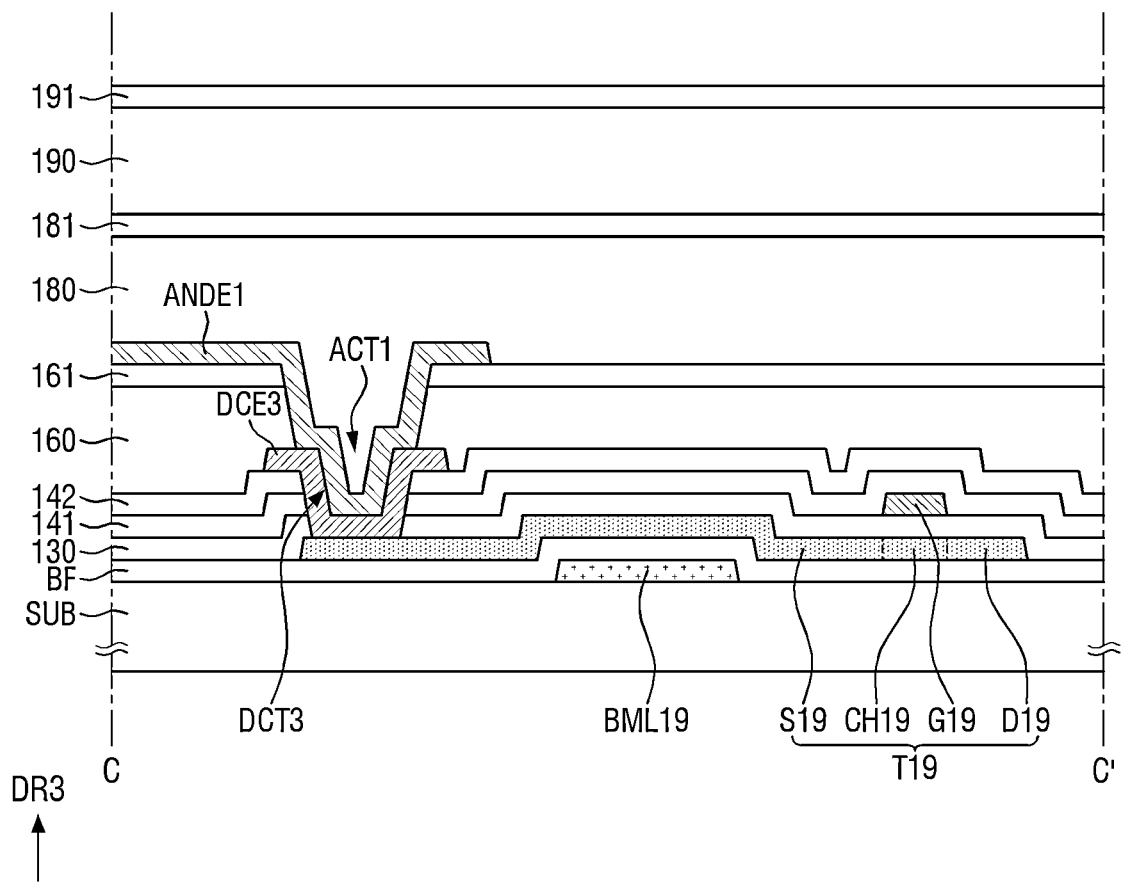
FIG. 17 is a cross-sectional view illustrating an example of a display panel taken along the line C-C' of FIG. 14.

FIG. 15 is a cross-sectional view illustrating an example of a display panel taken along the line A-A' of FIG. 12. FIG. 16 is a cross-sectional view illustrating an example of a display panel taken along the line B-B' of FIG. 13. FIG. 17 is a cross-sectional view illustrating an example of a display panel taken along the line C-C' of FIG. 14.

Referring to FIGS. 15 to 17, the substrate SUB may include (e.g., may be formed of) an insulating material such as glass or polymer resin. For example, when the substrate SUB consists of a polymer resin, it may include polyimide. The substrate SUB may be a flexible substrate capable of being bent, folded, or rolled.

A light blocking metal layer such as the fourth bottom gate electrode BML4 of the fourth transistor T4, the eleventh bottom gate electrode BML11 of the eleventh transistor T11, and the light blocking layer BML19 may be disposed on the substrate SUB. The light blocking metal layer may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

A buffer film BF may be disposed on the light blocking metal layer. The buffer film BF may be made of a plurality of inorganic layers alternately stacked. For example, the buffer film BF may be formed as a multilayer in which one or more inorganic layers of a silicon nitride layer, a silicon oxynitride layer, a silicon oxide layer, a titanium oxide layer, and/or an aluminum oxide layer are alternately stacked.

An active layer may be disposed on the buffer film BF. The active layer includes the first to nineteenth channels CH1 to CH19, the first to nineteenth source electrodes S1 to S19, and the first to nineteenth drain electrodes D1 to D19 of the first to nineteenth transistors T1 to T19. The active layer may include polycrystalline silicon, single crystal silicon, low temperature polycrystalline silicon, amorphous silicon, or an oxide semiconductor. The first to nineteenth source electrodes S1 to S19 and the first to nineteenth drain electrodes D1 to D19 may be regions having conductivity by doping a silicon semiconductor or an oxide semiconductor with ions or impurities.

FIGS. 15 to 17 illustrate only the third sub-channel CH41 of the third sub-transistor T41 of the fourth transistor T4, the third sub-source electrode S41, and the third sub-drain electrode D41, the fourth sub-channel CH42 of the fourth sub-transistor T42 of the fourth transistor T4, the fourth sub-source electrode S42, and the fourth sub-drain electrode D42, the seventh sub-channel CH111 of the seventh sub-transistor T111 of the eleventh transistor T11, the seventh sub-source electrode S111, and the seventh sub-drain electrode D111, the eighth sub-channel CH112 of the eighth sub-transistor T112 of the eleventh transistor T11, the eighth sub-source electrode S112, and the eighth sub-drain electrode D112, and the nineteenth channel CH19, the nineteenth source electrode S19, and the nineteenth drain electrode D19 of the nineteenth transistor T19 as the active layer.

A gate insulating film 130 may be disposed on the active layer. The gate insulating film 130 may be formed of an inorganic layer, for example, a silicon nitride layer, a silicon oxynitride layer, a silicon oxide layer, a titanium oxide layer, and/or an aluminum oxide layer.

A first gate metal layer may be disposed on the gate insulating film 130. The first gate metal layer includes the first to nineteenth gate electrodes G1 to G19 and the first to third gate connection electrodes GCE1 to GCE3 of the first to nineteenth transistors T1 to T19. The first gate metal layer may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

FIGS. 15 to 17 illustrate only the third sub-gate electrode G41 of the third sub-transistor T41 of the fourth transistor T4, the fourth sub-gate electrode G42 of the fourth sub-transistor T42 of the fourth transistor T4, the seventh sub-gate electrode G111 of the seventh sub-transistor T111 of the eleventh transistor T11, the eighth sub-gate electrode G112 of the eighth sub-transistor T112 of the eleventh transistor T11, and the nineteenth gate electrode G19 of the nineteenth transistor T19 as the first gate metal layer.

The third sub-channel CH41 of the third sub-transistor T41 overlaps the third sub-gate electrode G41 but does not overlap the third sub-source electrode S41 and the third sub-drain electrode D41 in the third direction DR3. The fourth sub-channel CH42 of the fourth sub-transistor T42 overlaps the fourth sub-gate electrode G42 but does not overlap the fourth sub-source electrode S42 and the fourth sub-drain electrode D42 in the third direction DR3. The seventh sub-channel CH111 of the seventh sub-transistor T111 overlaps the seventh sub-gate electrode G111 but does not overlap the seventh sub-source electrode S111 and the seventh sub-drain electrode D111 in the third direction DR3. The eighth sub-channel CH112 of the eighth sub-transistor T112 overlaps the eighth sub-gate electrode G112 but does not overlap the eighth sub-source electrode S112 and the eighth sub-drain electrode D112 in the third direction DR3. The nineteenth channel CH19 of the nineteenth transistor T19 overlaps the nineteenth gate electrode G19 but does not overlap the nineteenth source electrode S19 and the nineteenth drain electrode D19 in the third direction DR3.

A first interlayer insulating film 141 may be disposed on the first gate metal layer. The first interlayer insulating film 141 may be formed of the inorganic layer, for example, the silicon nitride layer, the silicon oxynitride layer, the silicon oxide layer, the titanium oxide layer, or the aluminum oxide layer.

A second gate metal layer may be disposed on the first interlayer insulating film 141. The second gate metal layer may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

A second interlayer insulating film 142 may be disposed on the first interlayer insulating film 141. The second interlayer insulating film 142 may be formed of the inorganic layer, for example, the silicon nitride layer, the silicon oxynitride layer, the silicon oxide layer, the titanium oxide layer, and/or the aluminum oxide layer.

A first source metal layer may be disposed on the second interlayer insulating film 142. The first source metal layer may include the $k^{th}$ scan write line GWLk, the test signal line TSTL, the third power supply line VSL, and first to third source connection electrodes DCE1 to DCE3. The first source metal layer may be formed as a single layer or multiple layers made of one or more selected from among molybdenum (Mo), aluminum (Al), chromium (Cr), gold (Au), titanium (Ti), nickel (Ni), neodymium (Nd) and/or copper (Cu), and/or an alloy thereof.

The $k^{th}$ scan write line GWLk may be connected to the first gate connection electrode GCE1 and the second gate connection electrode GCE2 through the first gate contact hole GCT1 and the second gate contact hole GCT2 penetrating a first interlayer insulating film 141 and a second interlayer insulating film 142. The test signal line TSTL may be connected to the nineteenth gate electrode G19 through the third gate contact hole GCT3 penetrating the first interlayer insulating film 141 and the second interlayer insulating film 142. The third power supply line VSL may be connected to the nineteenth drain electrode D19 through a fourth source contact hole DCT4 penetrating the gate insulating film 130, the first interlayer insulating film 141, and the second interlayer insulating film 142.

A first data connection electrode DCE1 may be connected to the fourth sub-drain electrode D42 through a first data contact hole DCT1 penetrating the gate insulating film 130, the first interlayer insulating film 141, and the second interlayer insulating film 142. A second data connection electrode DCE2 may be connected to the eighth sub-drain electrode D112 through a second data contact hole DCT2 penetrating the gate insulating film 130, the first interlayer insulating film 141, and the second interlayer insulating film 142. A third data connection electrode DCE3 may be connected to the nineteenth source electrode S19 through a third data contact hole DCT3 penetrating the gate insulating film 130, the first interlayer insulating film 141, and the second interlayer insulating film 142.

A first planarization film 160 may be disposed on the first source metal layer. The first planarization film 160 may be formed of an organic layer such as acryl resin, epoxy resin, phenolic resin, polyamide resin, and/or polyimide resin.

A first inorganic insulating film 161 may be disposed on the first planarization film 160. The first inorganic insulating film 161 may be formed of an inorganic layer, such as a silicon nitride layer, a silicon oxy nitride layer, a silicon oxide layer, a titanium oxide layer, and/or an aluminum oxide layer.

A second source metal layer may be disposed on the first inorganic insulating film 161. The second source metal layer may include a first vertical power supply line WDL and the first anode connection electrode ANDE1. The second source metal layer may be formed as a single layer or multiple layers made of one or more selected from among molybdenum (Mo), aluminum (Al), chromium (Cr), gold (Au), titanium (Ti), nickel (Ni), neodymium (Nd) and/or copper (Cu), and/or an alloy thereof.

The first anode connection electrode ANDE1 may be connected to the third source connection electrode DCE3 through a first anode contact hole ACT1 penetrating the first planarization film 160 and the first inorganic insulating film 161. A second planarization film 180 may be disposed on the second source metal layer. The second planarization film 180 may be formed of the organic layer such as acryl resin, epoxy resin, phenolic resin, polyamide resin, and/or polyimide resin.

A second inorganic insulating film 181 may be disposed on the second planarization film 180. The second inorganic insulating film 181 may be formed of the inorganic layer, such as the silicon nitride layer, the silicon oxy nitride layer, the silicon oxide layer, the titanium oxide layer, and/or the aluminum oxide layer.

A third source metal layer may be disposed on the second inorganic insulating film 181. The third source metal layer may be formed as a single layer or multiple layers made of one or more selected from among molybdenum (Mo), aluminum (Al), chromium (Cr), gold (Au), titanium (Ti), nickel (Ni), neodymium (Nd), and/or copper (Cu), and/or an alloy thereof.

A third planarization film 190 may be disposed on the third source metal layer. The third planarization film 190 may be formed of the organic layer such as acryl resin, epoxy resin, phenolic resin, polyamide resin, and/or polyimide resin.

A third inorganic insulating film 191 may be disposed on the third planarization film 190. The third inorganic insulating film 191 may be formed of the inorganic layer, such as the silicon nitride layer, the silicon oxy nitride layer, the silicon oxide layer, the titanium oxide layer, and/or the aluminum oxide layer.

Figure 18:
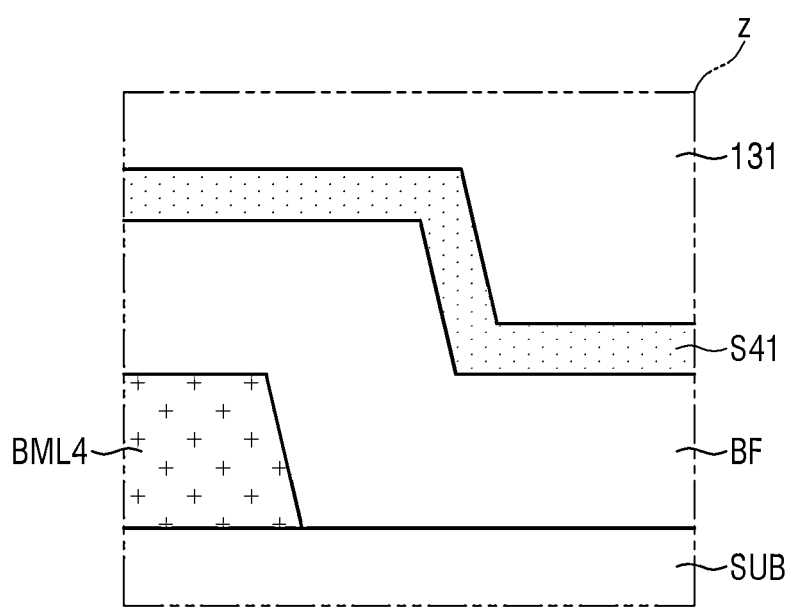
FIG. 18 is a cross-sectional view illustrating the area Z of FIG. 15 in detail.

FIG. 18 is a cross-sectional view illustrating an area Z of FIG. 15 in detail.

Referring to FIG. 18, as the thickness of the fourth bottom gate electrode BML4 increases, a level difference between the buffer film BF at one end of the fourth bottom gate electrode BML4 may increase. As the step of the buffer film BF increases, the possibility that the fourth bottom gate electrode BML4 is disconnected in the step region of the buffer film BF is high because the step coverage of the fourth sub-source electrode S41 is not good. Step coverage refers to the ratio of the extent to which a thin film is applied to an inclined part to the extent to which a thin film is applied to a flat part.

Figure 19:
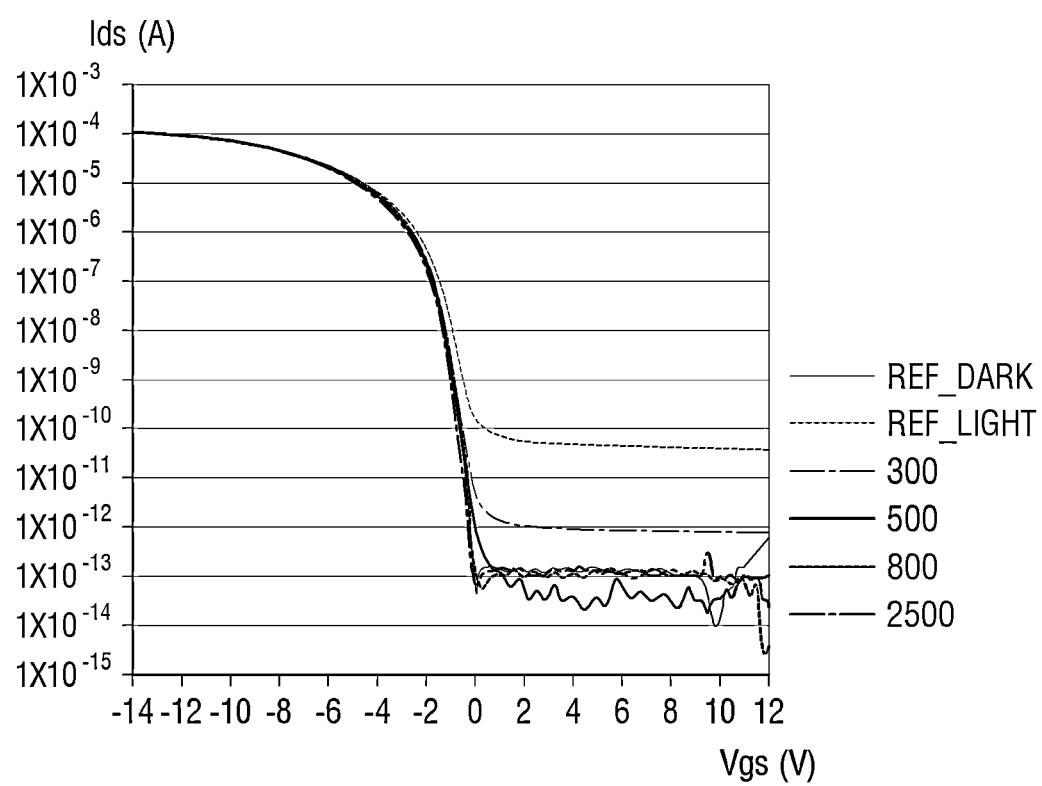
FIG. 19 is a graph illustrating the driving current according to the gate voltage of the fourth transistor for each thickness of the fourth bottom gate electrode.

FIG. 19 is a graph illustrating the driving current according to the gate voltage of the fourth transistor for each thickness of the fourth bottom gate electrode.

In FIG. 19, the X-axis represents the gate voltage of the fourth transistor T4, and the Y-axis represents the current Ids of the fourth transistor T4.

Referring to FIG. 19, when the thickness of the fourth bottom gate electrode BML4 is approximately 500 Å or more, the off current of the fourth transistor T4 may be similar to the off current of the fourth transistor T4 when there is no illumination without the fourth bottom gate electrode BML. That is, when the thickness of the fourth bottom gate electrode BML4 is approximately 500 Å or more, the light leakage current may be greatly reduced.

Referring to FIG. 19, the thickness of the fourth bottom gate electrode BML4 is preferably about 500 Å or more when light leakage current is considered. However, referring to FIG. 18, the step coverage of the fourth sub-source electrode S41 is disadvantageous as the thickness of the fourth bottom gate electrode BML4 increases. Therefore, considering FIGS. 18 and 19, it is preferable that the thickness of the fourth bottom gate electrode BML4 is approximately 500 Å or more and 800 Å or less.

Figure 20:
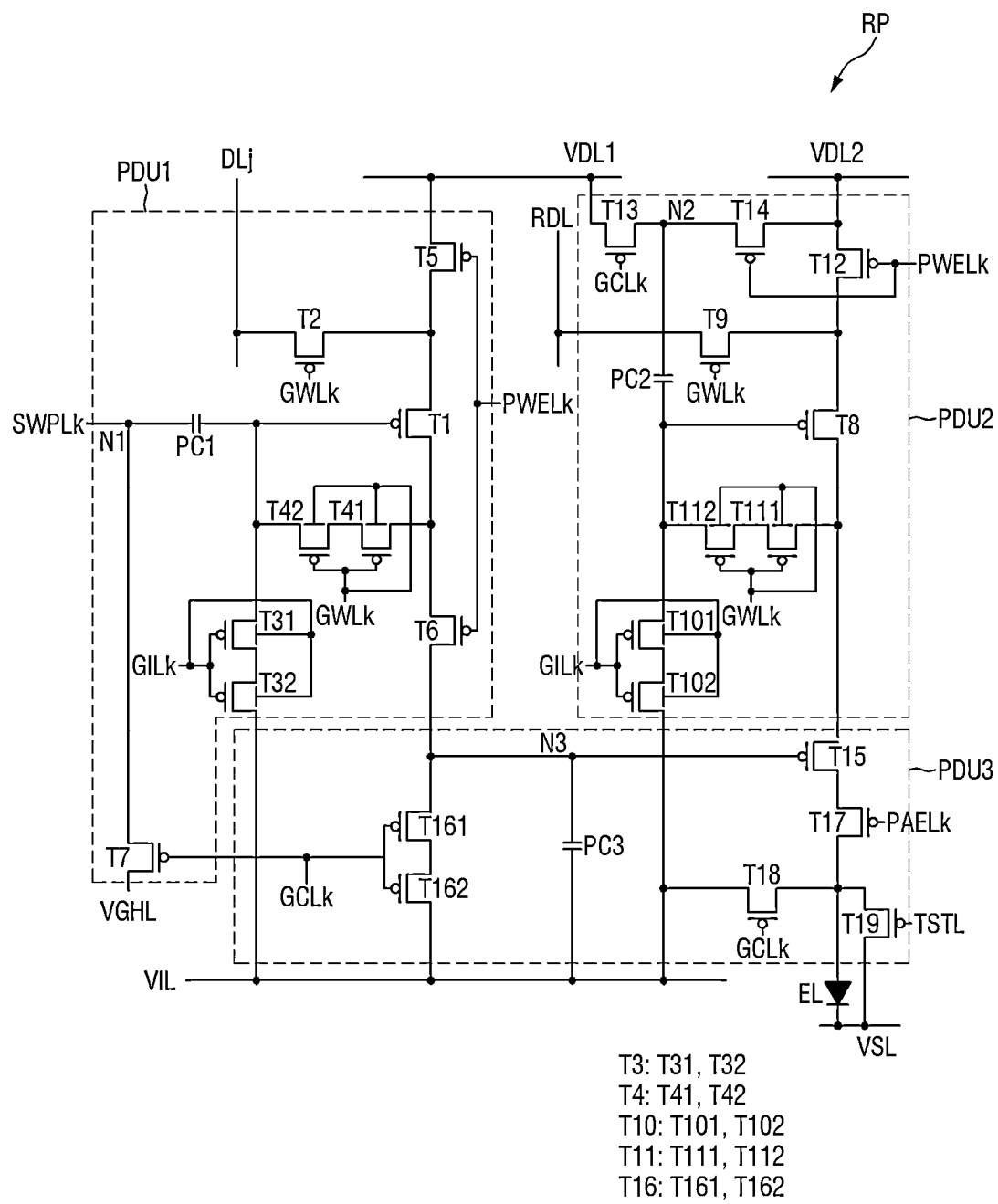
FIG. 20 is an equivalent circuit diagram illustrating a first sub-pixel according to one or more embodiments.

FIG. 20 is an equivalent circuit diagram illustrating a first sub-pixel according to one or more embodiments.

The embodiment of FIG. 20 is different from the embodiment of FIG. 9 in that the first sub-transistor T31 and the second sub-transistor T32 of the third transistor T3 include bottom gate electrodes, and the fifth sub-transistor T101 and the sixth sub-transistor T102 of the tenth transistor T10 include the bottom gate electrode.

Referring to FIG. 20, the bottom gate electrode of the first sub-transistor T31 of the third transistor T3 and the bottom gate electrode of the second sub-transistor T32 may be electrically connected to each other. For example, the bottom gate electrode of the first sub-transistor T31 of the third transistor T3 and the bottom gate electrode of the second sub-transistor T32 may be connected to the $k^{th}$ scan initialization line GILk. In this case, the bottom gate electrode of the first sub-transistor T31 and the bottom gate electrode of the second sub-transistor T32 of the third transistor T3 may be connected to the gate electrode (or the top gate electrode) of the first sub-transistor T31 and the gate electrode (or the top gate electrode) of the second sub-transistor T32 of the third transistor T3. Therefore, the bottom gate electrode of the first sub-transistor T31 and the bottom gate electrode of the second sub-transistor T32 of the third transistor T3 may have the same potential as the gate electrode (or the top gate electrode) of the first sub-transistor T31 and the gate electrode (or the top gate electrode) of the second sub-transistor T32 of the third transistor T3. That is, the voltage of the bottom gate electrode and the voltage of the gate electrode (or the top gate electrode) of the first sub-transistor T31 may be synchronized, and the voltage of the bottom gate electrode and the voltage of the gate electrode (or the top gate electrode) of the second sub-transistor T32 may be synchronized.

The bottom gate electrode of the fifth sub-transistor T101 and the bottom gate electrode of the sixth sub-transistor T102 of the tenth transistor T10 may be electrically connected to each other. For example, the bottom gate electrode of the fifth sub-transistor T101 and the bottom gate electrode of the sixth sub-transistor T102 of the tenth transistor T10 may be connected to the $k^{th}$ scan initialization line GILk. In this case, the bottom gate electrode of the fifth sub-transistor T101 and the bottom gate electrode of the sixth sub-transistor T102 of the tenth transistor T10 may be connected to the gate electrode (or the top gate electrode) of the fifth sub-transistor T101 and the gate electrode (or the top gate electrode) of the sixth sub-transistor T102 of the tenth transistor T10. Therefore, the bottom gate electrode of the fifth sub-transistor T101 and the bottom gate electrode of the sixth sub-transistor T102 of the tenth transistor T10 may have the same potential as the gate electrode (or the top gate electrode) of the fifth sub-transistor T101 and the gate electrode (or the top gate electrode) of the sixth sub-transistor T102 of the tenth transistor T10. That is, the voltage of the bottom gate electrode and the voltage of the gate electrode (or top gate electrode) of the fifth sub-transistor T101 may be synchronized and the voltage of the bottom gate electrode and the voltage of the gate electrode (or the top gate electrode) of the sixth sub-transistor T102 may be synchronized.

Figure 21:
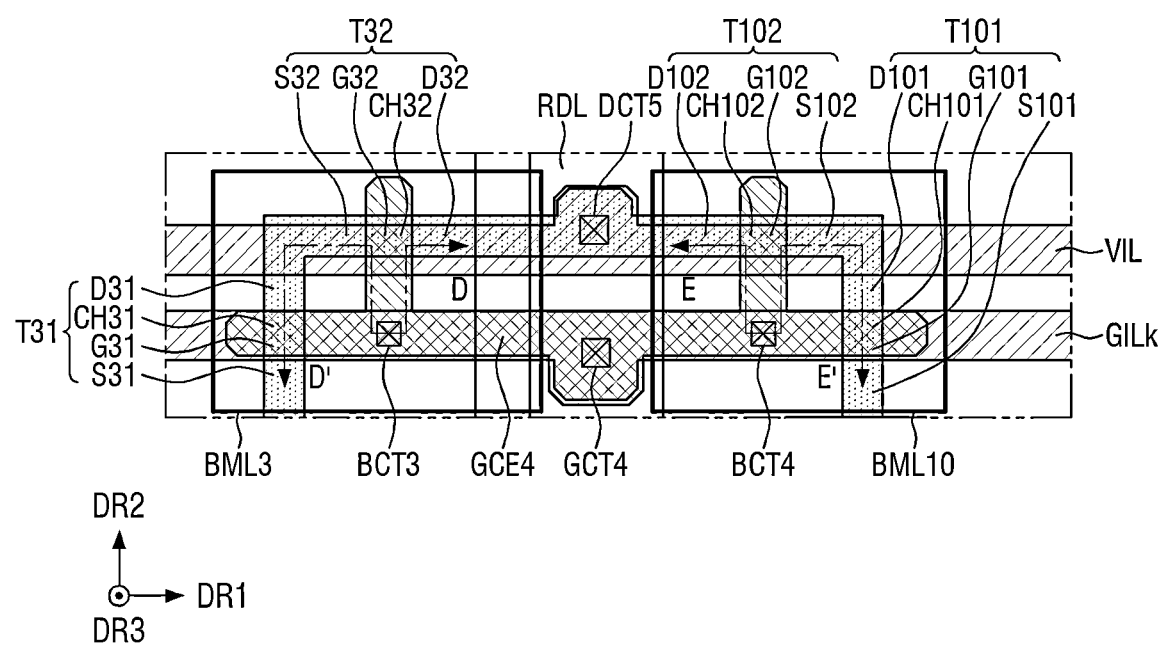
FIG. 21 is a layout diagram illustrating a third transistor and a tenth transistor of a first sub-pixel according to one or more embodiments.

FIG. 21 is a layout diagram illustrating a third transistor and a tenth transistor of a first sub-pixel according to one or more embodiments.

Referring to FIG. 21, the first sub-transistor T31 of the third transistor T3 includes a first sub-channel CH31, a first sub-gate electrode G31, a third bottom gate electrode BML3, a first sub-source electrode S31, and a first sub-drain electrode D31. The first sub-channel CH31 may overlap the first sub-gate electrode G31 and the third bottom gate electrode BML3 in the third direction DR3. The first sub-source electrode S31 may be disposed on one side of the first sub-channel CH31, and the first sub-drain electrode D31 may be disposed on the other side of the first sub-channel CH31.

The second sub-transistor T32 of the third transistor T3 includes a second sub-channel CH32, a second sub-gate electrode G32, the third bottom gate electrode BML3, a second sub-source electrode S32, and a second sub-drain electrode D32. The second sub-channel CH32 may overlap the second sub-gate electrode G32 and the third bottom gate electrode BML3 in the third direction DR3. The second sub-source electrode S32 may be disposed on one side of the second sub-channel CH32, and the second sub-drain electrode D32 may be disposed on the other side of the second sub-channel CH32. The second sub-source electrode S32 may be connected to the first sub-drain electrode D31, and the second sub-drain electrode D32 may be connected to the initialization voltage line VIL through a fifth source contact hole DCT5.

The fifth sub-transistor T101 of the tenth transistor T10 includes a fifth sub-channel CH101, a fifth sub-gate electrode G101, a tenth bottom gate electrode BML10, a fifth sub-source electrode S101, and a fifth sub-drain electrode D101. The fifth sub-channel CH101 may overlap the fifth sub-gate electrode G101 and the tenth bottom gate electrode BML10 in the third direction DR3. The fifth sub-source electrode S101 may be disposed on one side of the fifth sub-channel CH101, and the fifth sub-drain electrode D101 may be disposed on the other side of the fifth sub-channel CH101.

The sixth sub-transistor T102 of the tenth transistor T10 includes a sixth sub-channel CH102, a sixth sub-gate electrode G102, the tenth bottom gate electrode BML10, a sixth sub-source electrode S102, and a sixth sub-drain electrode D102. The sixth sub-channel CH102 may overlap the sixth sub-gate electrode G102 and the tenth bottom gate electrode BML10 in the third direction DR3. The sixth sub-source electrode S102 may be disposed on one side of the sixth sub-channel CH102, and the sixth sub-drain electrode D102 may be disposed on the other side of the sixth sub-channel CH102. The sixth sub-source electrode S102 may be connected to the fifth sub-drain electrode D101, and the sixth sub-drain electrode D102 may be connected to the initialization voltage line VIL through the fifth source contact hole DCT5.

The first sub-gate electrode G31, the second sub-gate electrode G32, the fifth sub-gate electrode G101, and the sixth sub-gate electrode G102 may be integrally formed with a fourth gate connection electrode GCE4. The fourth gate connection electrode GCE4 may be connected to the $k^{th}$ scan initialization line GILk through a fourth gate contact hole GCT4. The fourth gate connection electrode GCE4 may be connected to the third bottom gate electrode BML3 through a third lower contact hole BCT3. The fourth gate connection electrode GCE4 may be connected to the tenth bottom gate electrode BML10 through a fourth lower contact hole BCT4.

The third bottom gate electrode BML3 may overlap the first sub-channel CH31, the first sub-source electrode S31, and the first sub-drain electrode D31 of the first sub-transistor T31, and the second sub-channel CH32, the second sub-source electrode S32, and the second sub-drain electrode D32 of the second sub-transistor T32. Light incident from the outside may not be incident to the first sub-channel CH31 of the first sub-transistor T31 and the second sub-channel CH32 of the second sub-transistor T32 because it is blocked by the third bottom gate electrode BML3.

The tenth bottom gate electrode BML10 may overlap the fifth sub-channel CH101, the fifth sub-source electrode S101, and the fifth sub-drain electrode D101 of the fifth sub-transistor T101, and the sixth sub-channel CH102, the sixth sub-source electrode S102, and the sixth sub-drain electrode D102 of the sixth sub-transistor T102. Light incident from the outside may not be incident to the fifth sub-channel CH101 of the fifth sub-transistor T101 and the sixth sub-channel CH102 of the sixth sub-transistor T102 because it is blocked by the tenth bottom gate electrode BML10.

Therefore, it is possible to prevent the plurality of device identifiers DID from being visually recognized in the inspection mode because the light leakage current of the fifth sub-transistor T101 and the light leakage current of the sixth sub-transistor T102 may be reduced.

Figure 22:
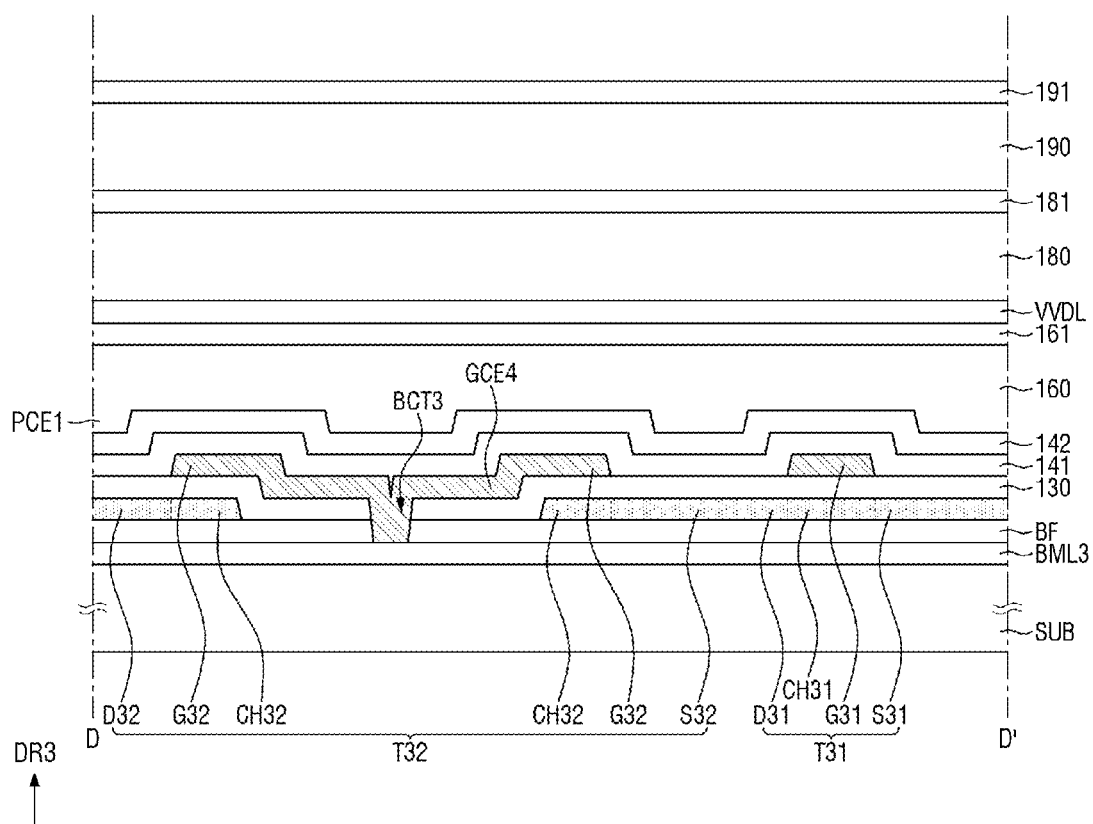
FIG. 22 is a cross-sectional view illustrating an example of a display panel taken along the line D-D' of FIG. 21.
Figure 23:
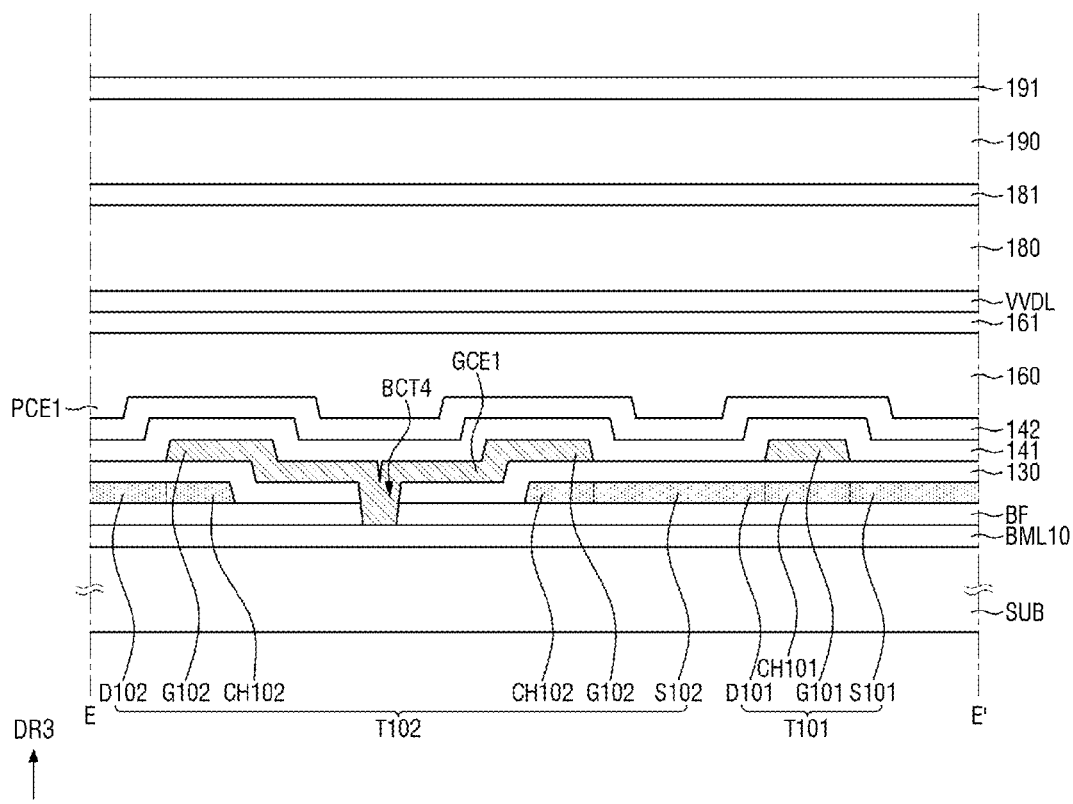
FIG. 23 is a cross-sectional view illustrating an example of a display panel taken along the line E-E' of FIG. 21.

FIG. 22 is a cross-sectional view illustrating an example of a display panel taken along the line D-D' of FIG. 21. FIG. 23 is a cross-sectional view illustrating an example of a display panel taken along the line E-E' of FIG. 21.

In the embodiments of FIGS. 22 and 23, the description is focused on the first sub-transistor T31, the second sub-transistor T32 of the third transistor T3, and the fifth sub-transistor T101 and the sixth sub-transistor T102 of the tenth transistor T10 and descriptions overlapping those of the embodiments of FIGS. 15 to 17 will be omitted.

Referring to FIGS. 22 and 23, the light blocking metal layer may further include the third bottom gate electrode BML3 and the tenth bottom gate electrode BML10.

The first gate metal layer may further include the fourth gate connection electrode GCE4. The fourth gate connection electrode GCE4 may be connected to the third bottom gate electrode BML3 through the third lower contact hole BCT3 penetrating the buffer film BF and the gate insulating film 130. The fourth gate connection electrode GCE4 may be connected to the tenth bottom gate electrode BML10 through the fourth lower contact hole BCT4 penetrating the buffer film BF and the gate insulating film 130.

The first sub-channel CH31 of the first sub-transistor T31 overlaps the first sub-gate electrode G31 but does not overlap the first sub-source electrode S31 and the first sub-drain electrode D31 in the third direction DR3. The second sub-channel CH32 of the second sub-transistor T32 overlaps the second sub-gate electrode G32 but does not overlap the second sub-source electrode S32 and the second sub-drain electrode D32 in the third direction DR3. The fifth sub-channel CH101 of the fifth sub-transistor T101 overlaps the fifth sub-gate electrode G101 but does not overlap the fifth sub-source electrode S101 and the fifth sub-drain electrode D101 in the third direction DR3. The sixth sub-channel CH102 of the sixth sub-transistor T102 overlaps the sixth sub-gate electrode G102 but does not overlap the sixth sub-source electrode S102 and the sixth sub-drain electrode D102 in the third direction DR3.

Figure 24:
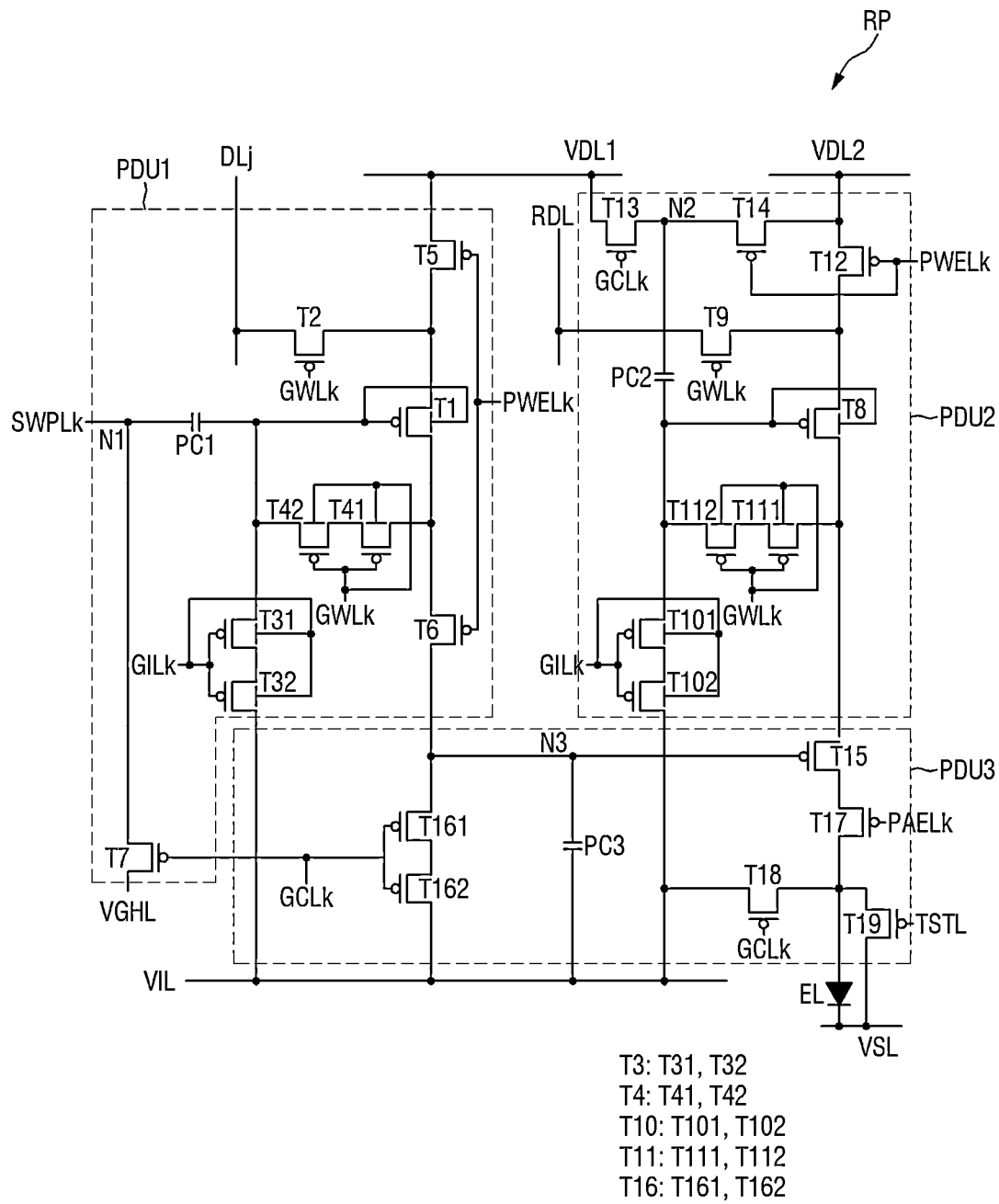
FIG. 24 is an equivalent circuit diagram illustrating a first sub-pixel according to one or more embodiments.

FIG. 24 is an equivalent circuit diagram illustrating a first sub-pixel according to one or more embodiments.

The embodiment of FIG. 24 is different from the embodiment of FIG. 20 in that the first transistor T1 includes the bottom gate electrode and the eighth transistor T8 includes the bottom gate electrode. The embodiment of FIG. 24 will be described focusing on differences from the embodiment of FIG. 20.

Referring to FIG. 24, the bottom gate electrode of the first transistor T1 may be connected to the gate electrode (or the top gate electrode) of the first transistor T1. Therefore, the bottom gate electrode of the first transistor T1 may have the same potential as the gate electrode (or the top gate electrode) of the first transistor T1. That is, the voltage of the bottom gate electrode and the voltage of the gate electrode (or the top gate electrode) of the first transistor T1 may be synchronized.

The bottom gate electrode of the eighth transistor T8 may be connected to the gate electrode (or the top gate electrode) of the eighth transistor T8. Therefore, the bottom gate electrode of the eighth transistor T8 may have the same potential as the gate electrode (or the top gate electrode) of the eighth transistor T8. That is, the voltage of the bottom gate electrode and the voltage of the gate electrode (or the top gate electrode) of the eighth transistor T8 may be synchronized.

Figure 25:
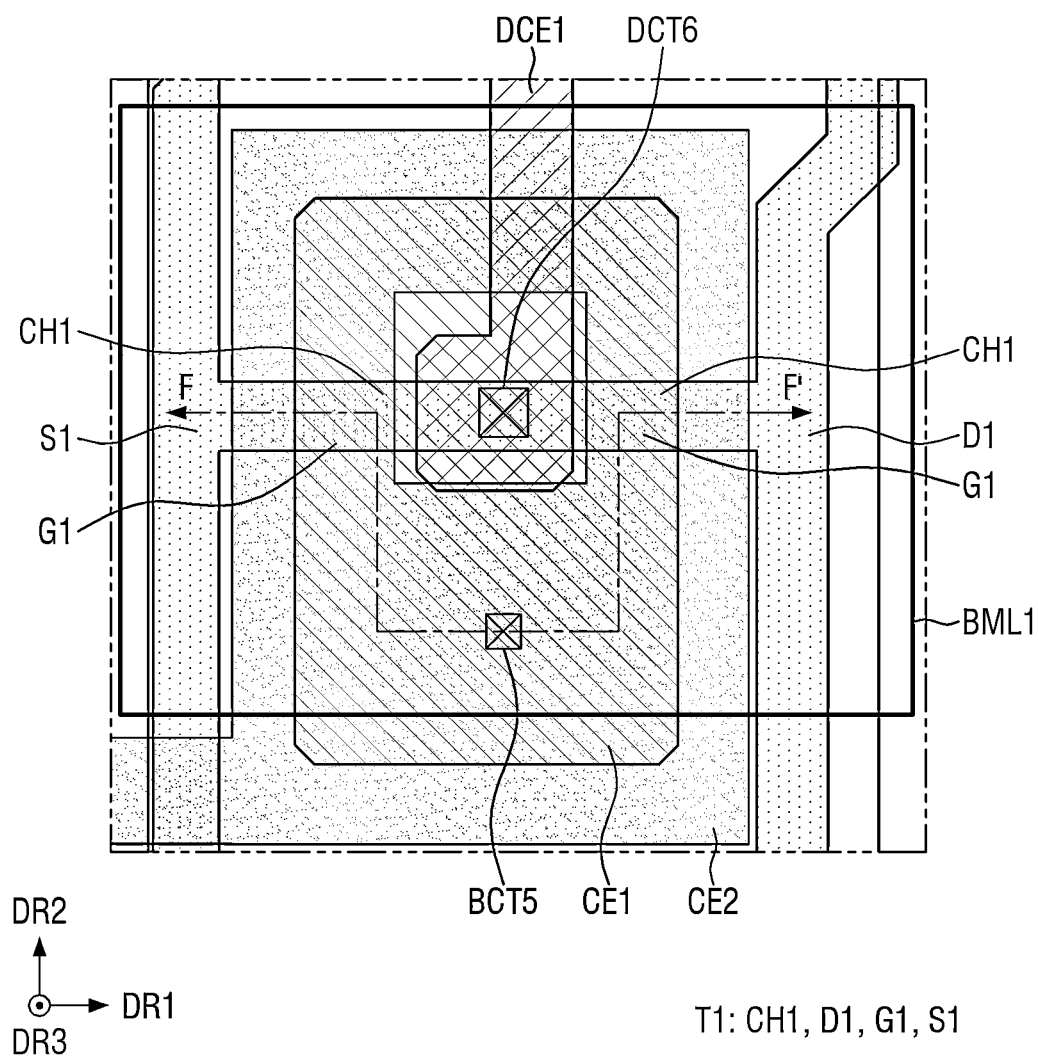
FIG. 25 is a layout diagram illustrating a first transistor of a first sub-pixel according to one or more embodiments.

FIG. 25 is a layout diagram illustrating a first transistor of a first sub-pixel according to one or more embodiments.

Referring to FIG. 25, the first transistor T1 includes a first channel CH1, a first gate electrode G1, a first bottom gate electrode BML1, a first source electrode S1, and a first drain electrode D1. The first channel CH1 may be extended in the first direction DR1. The first channel CH1 may overlap the first gate electrode G1 and the first bottom gate electrode BML1 in the third direction DR3. The first gate electrode G1 may be connected to the first source connection electrode DCE1 through a sixth source contact hole DCT6. The first source electrode S1 may be disposed on one side of the first channel CH1, and the first drain electrode D1 may be disposed on the other side of the first channel CH1.

A first capacitor electrode CE1 may be integrally formed with the first gate electrode G1. The first capacitor electrode CE1 may overlap a second capacitor electrode CE2 in the third direction DR3. An overlapping area of the first capacitor electrode CE1 and the second capacitor electrode CE2 in the third direction DR3 may be defined as the first capacitor PC1. The first capacitor electrode CE1 may be connected to the first bottom gate electrode BML1 through a fifth lower contact hole BCT5.

The first bottom gate electrode BML1 may overlap the first channel CH1, the first source electrode S1, and the first drain electrode D1 of the first transistor T1. Light incident from the outside may not be incident to the first channel CH1 of the first transistor T1 because it is blocked by the first bottom gate electrode BML1. Therefore, it is possible to prevent the plurality of device identifiers DID from being visually recognized in the inspection mode because the light leakage current of the first transistor T1 may be reduced.

Figure 26:
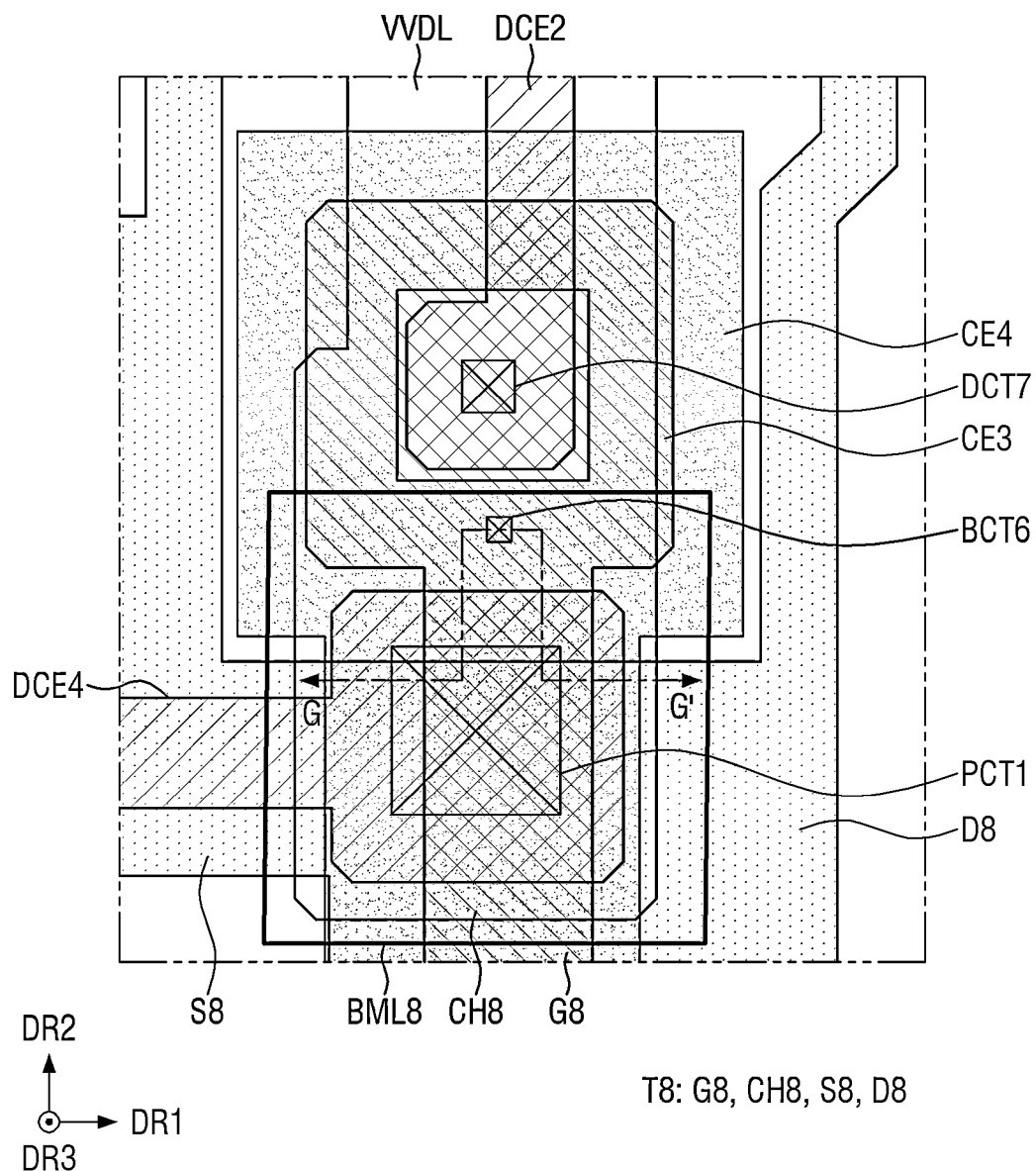
FIG. 26 is a layout diagram illustrating an eighth transistor of a first sub-pixel according to one or more embodiments.

FIG. 26 is a layout diagram illustrating an eighth transistor of a first sub-pixel according to one or more embodiments.

The eighth transistor T8 includes an eighth channel CH8, an eighth gate electrode G8, an eighth bottom gate electrode BML8, an eighth source electrode S8, and an eighth drain electrode D8. The eighth channel CH8 may overlap the eighth gate electrode G8 and the eighth bottom gate electrode BML8 in the third direction DR3. The eighth gate electrode G8 may be connected to the second source connection electrode DCE2 through a seventh source contact hole DCT7. The eighth source electrode S8 may be disposed on one side of the eighth channel CH8, and the eighth drain electrode D8 may be disposed on the other side of the eighth channel CH8.

The third capacitor electrode CE3 may be integrally formed with the eighth gate electrode G8. The third capacitor electrode CE3 may overlap a fourth capacitor electrode CE4 in the third direction DR3. An overlapping area of the third capacitor electrode CE3 and the fourth capacitor electrode CE4 in the third direction DR3 may be defined as the second capacitor PC2. The third capacitor electrode CE3 may be connected to the eighth bottom gate electrode BML8 through a sixth lower contact hole BCT6.

The first vertical power supply line VVDL of the second power supply line VDL2 may be connected to a fourth source connection electrode DCE4 through a first power contact hole PCT1.

The eighth bottom gate electrode BML8 may overlap the eighth channel CH8, the eighth source electrode S8, and the eighth drain electrode D8 of the eighth transistor T8. Light incident from the outside may not be incident to the eighth channel CH8 of the eighth transistor T8 because it is blocked by the eighth bottom gate electrode BML8. Therefore, it is possible to prevent the plurality of device identifiers DID from being visually recognized in the inspection mode because the light leakage current of the eighth transistor T8 may be reduced.

Figure 27:
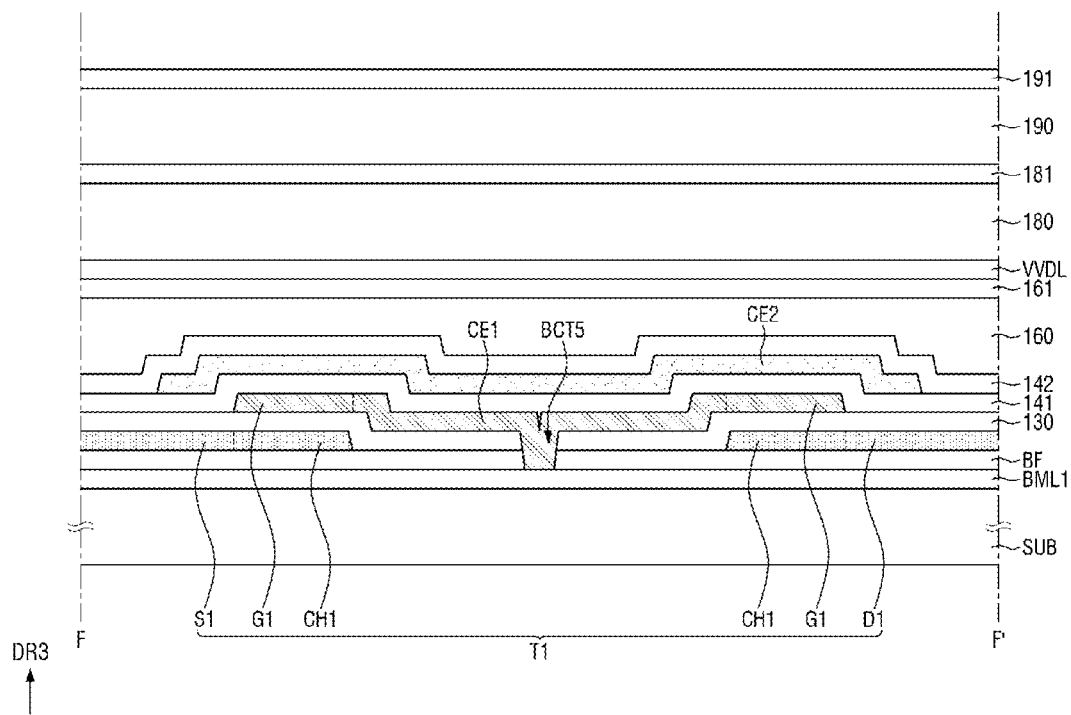
FIG. 27 is a cross-sectional view illustrating an example of a display panel taken along the line F-F' of FIG. 25.
Figure 28:
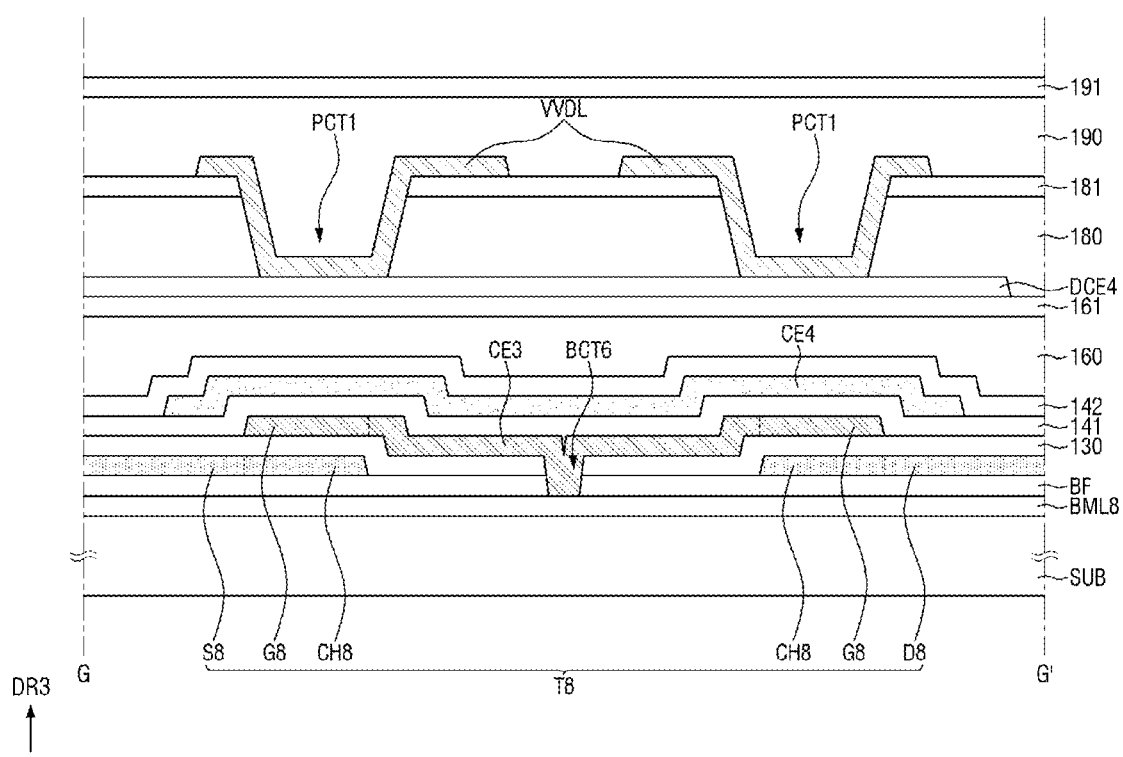
FIG. 28 is a cross-sectional view illustrating an example of a display panel taken along the line G-G' of FIG. 26.

FIG. 27 is a cross-sectional view illustrating an example of a display panel taken along the line F-F' of FIG. 25. FIG. 28 is a cross-sectional view illustrating an example of a display panel taken along the line G-G' of FIG. 26.

In the embodiments of FIGS. 27 and 28, the first transistor T1 and the eighth transistor T8 will be mainly described, and descriptions overlapping those of the embodiments of FIGS. 15 to 17 will be omitted.

Referring to FIGS. 27 and 28, the light blocking metal layer may further include the first bottom gate electrode BML1 and the eighth bottom gate electrode BML8.

The first gate metal layer may further include the first capacitor electrode CE1 and the third capacitor electrode CE3. The first capacitor electrode CE1 may be connected to the first bottom gate electrode BML1 through a fifth lower contact hole BCT5 penetrating the buffer film BF and the gate insulating film 130. The third capacitor electrode CE3 may be connected to the eighth bottom gate electrode BML8 through a sixth lower contact hole BCT6 penetrating the buffer film BF and the gate insulating film 130.

The second gate metal layer may include the second capacitor electrode CE2 and the fourth capacitor electrode CE4. The first capacitor electrode CE1, the second capacitor electrode CE2, and the first interlayer insulating film 141 interposed between the first capacitor electrode CE1 and the second capacitor electrode CE2 may constitute the first capacitor PC1. The third capacitor electrode CE3, the fourth capacitor electrode CE4, and the first interlayer insulating film 141 interposed between the third and fourth capacitor electrodes CE3 and CE4 may constitute the second capacitor PC2.

The first source connection electrode DCE1 may be connected to the first gate electrode GE1 through the sixth source contact hole DCT6 penetrating the first interlayer insulating film 141 and the second interlayer insulating film 142. The second source connection electrode DCE2 may be connected to the eighth gate electrode GE8 through the seventh source contact hole DCT7 penetrating the first interlayer insulating film 141 and the second interlayer insulating film 142.

The first source metal layer may further include the fourth source connection electrode DCE4, and the second source metal layer may further include a first vertical power supply line WDL. The first vertical power supply line WDL may be connected to the fourth source connection electrode DCE4 through the first power contact hole PCT1 penetrating the second planarization film 180 and the second inorganic insulating film 181.

The first channel CH1 of the first transistor T1 overlaps the first gate electrode G1 but does not overlap the first source electrode S1 and the first drain electrode D1 in the third direction DR3. The eighth channel CH8 of the eighth transistor T8 overlaps the eighth gate electrode G8 but does not overlap the eighth source electrode S8 and the eighth drain electrode D8 in the third direction DR3.

Figure 29:
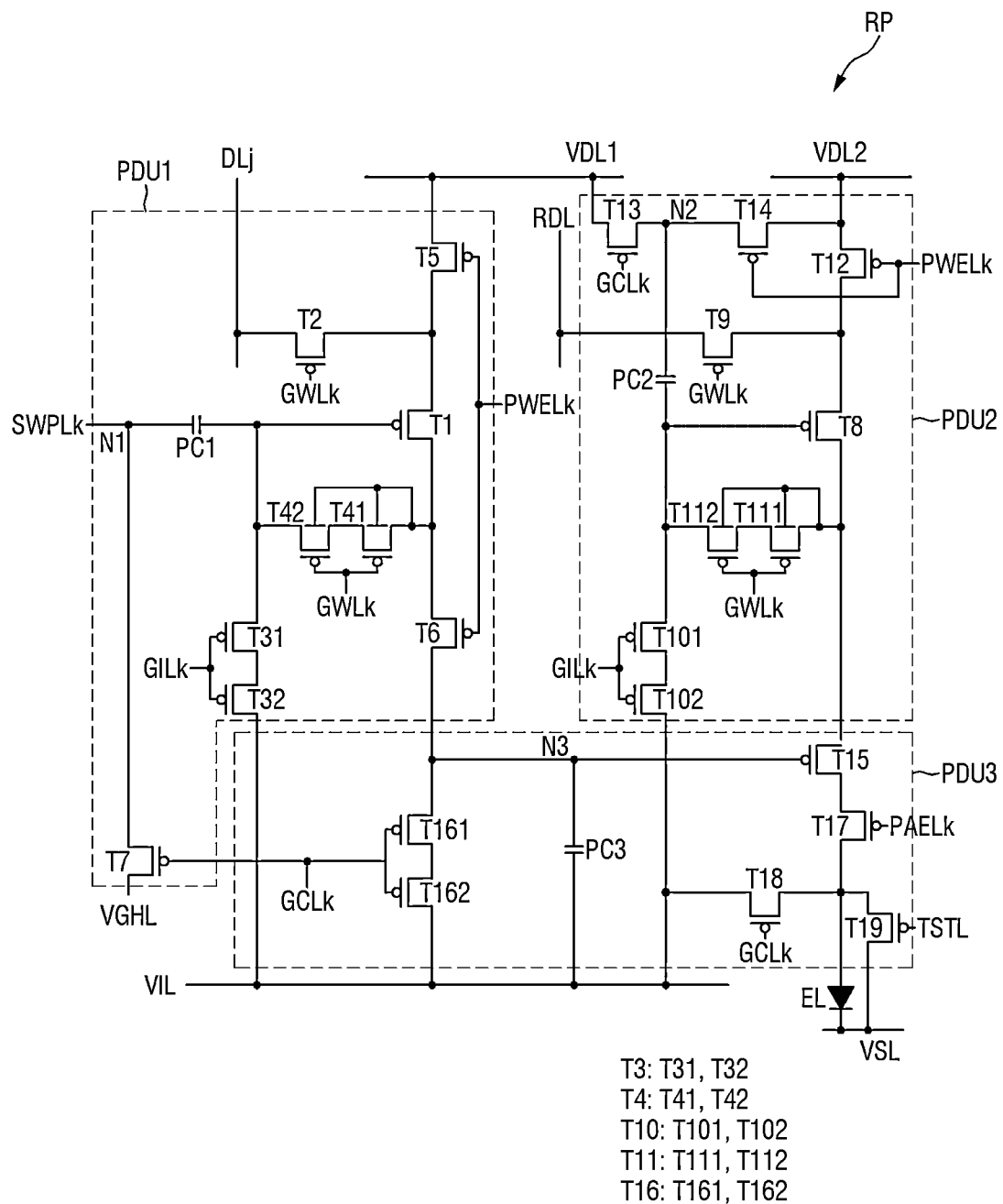
FIG. 29 is an equivalent circuit diagram illustrating a first sub-pixel according to one or more embodiments.

FIG. 29 is an equivalent circuit diagram illustrating a first sub-pixel according to one or more embodiments.

The embodiment of FIG. 29 is different from the embodiment of FIG. 5 in that the third sub-transistor T41 and the fourth sub-transistor T42 of the fourth transistor T4 include the bottom gate electrode, and the seventh sub-transistor T111 and the eighth sub-transistor T112 of the eleventh transistor T11 include the bottom gate electrode. In FIG. 29, differences from the embodiment of FIG. 5 will be mainly described.

Referring to FIG. 29, the bottom gate electrode of the third sub-transistor T41 of the fourth transistor T4 and the bottom gate electrode of the fourth sub-transistor T42 may be electrically connected to each other. For example, the bottom gate electrode of the third sub-transistor T41 of the fourth transistor T4 and the bottom gate electrode of the fourth sub-transistor T42 may be connected to the first electrode of the third sub-transistor T41. The first electrode of the third sub-transistor T41 may be connected to the second electrode of the first transistor T1 and the first electrode of the sixth transistor T6.

The bottom gate electrode of the third sub-transistor T41 of the fourth transistor T4 and the bottom gate electrode of the fourth sub-transistor T42 may have the same potential as the first electrode of the third sub-transistor T41. That is, the voltage of the bottom gate electrode of the third sub-transistor T41 of the fourth transistor T4 and the voltage of the bottom gate electrode of the fourth sub-transistor T42 may be synchronized with the voltage of the first electrode of the third sub-transistor T41.

The bottom gate electrode of the seventh sub-transistor T111 of the eleventh transistor T11 and the bottom gate electrode of the eighth sub-transistor T112 may be electrically connected to each other. For example, the bottom gate electrode of the seventh sub-transistor T111 of the eleventh transistor T11 and the bottom gate electrode of the eighth sub-transistor T112 may be connected to the first electrode of the seventh sub-transistor T111. The first electrode of the seventh sub-transistor T111 may be connected to the second electrode of the eighth sub-transistor T8 and the first electrode of the fifteenth transistor T15.

In this case, the bottom gate electrode of the seventh sub-transistor T111 of the eleventh transistor T11 and the bottom gate electrode of the eighth sub-transistor T112 may have the same potential as the first electrode of the seventh sub-transistor T111. That is, the voltage of the bottom gate electrode of the seventh sub-transistor T111 and the voltage of the bottom gate electrode of the eighth sub-transistor T112 may be synchronized with the voltage of the first electrode of the seventh sub-transistor T111.

Figure 30:
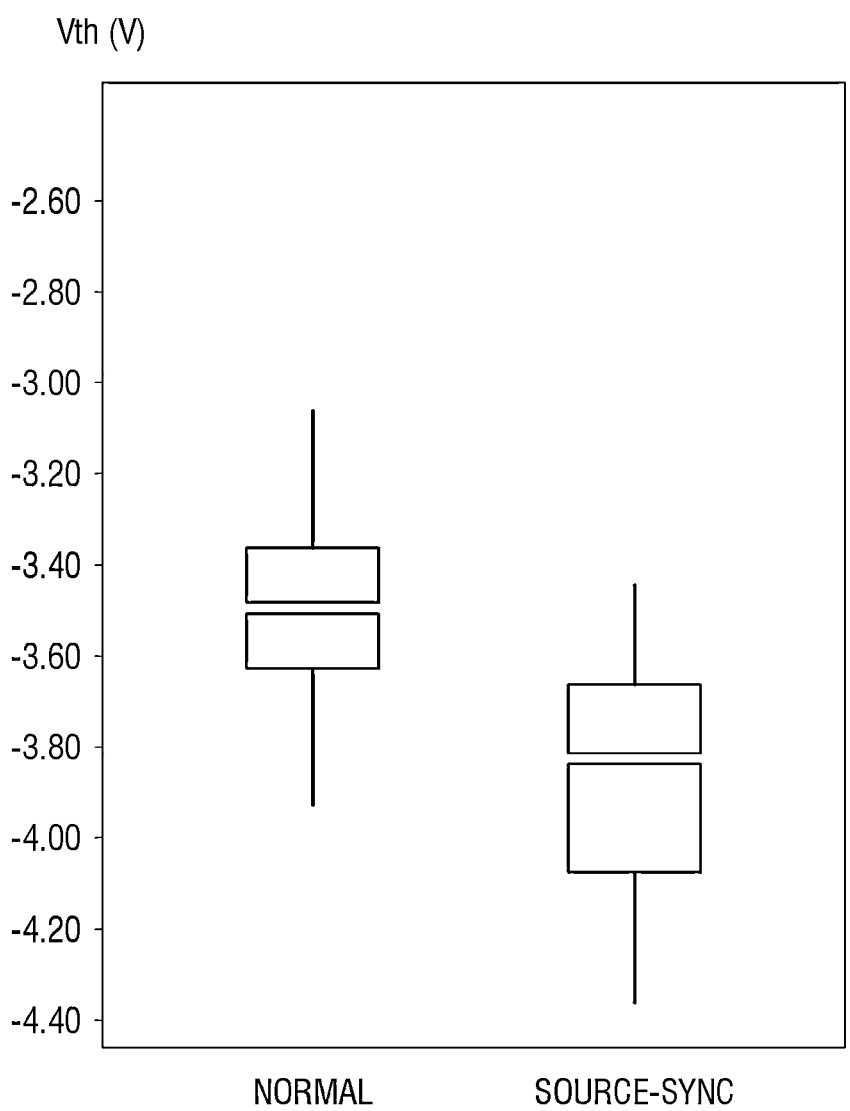
FIG. 30 is a graph illustrating a threshold voltage of a fourth transistor depending on the presence or absence of a bottom gate electrode according to one or more embodiments.
Figure 31:
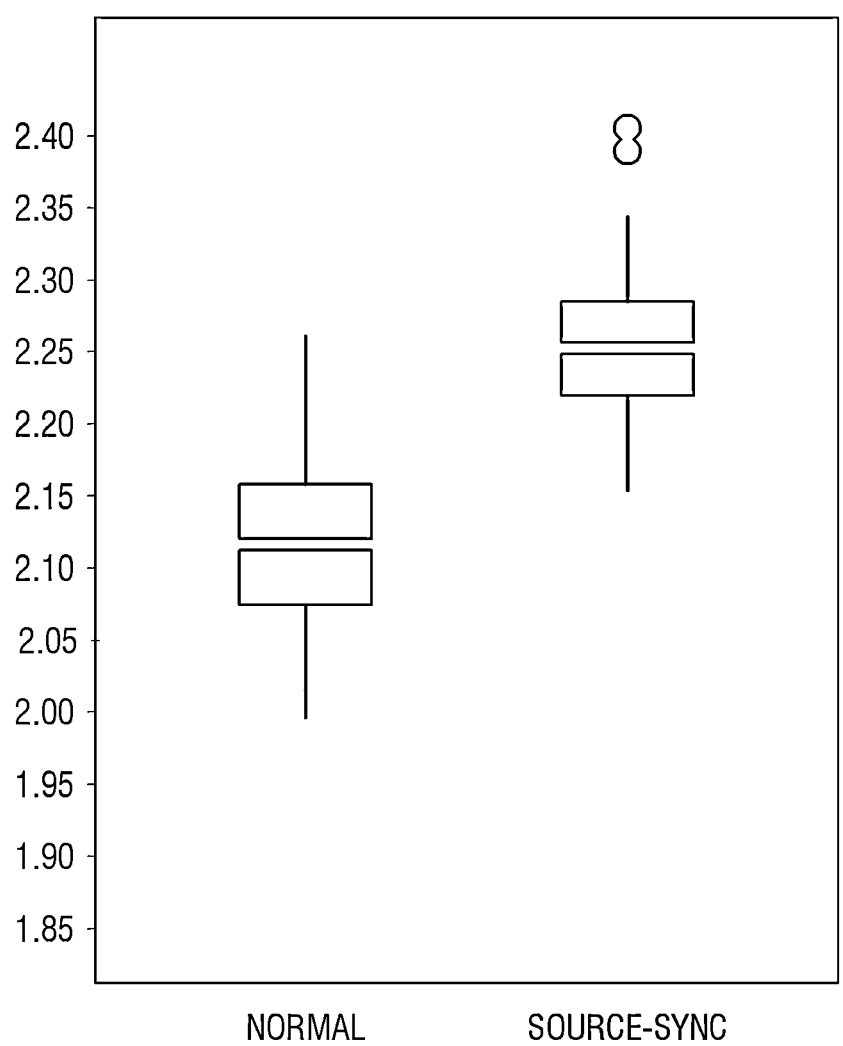
FIG. 31 is a graph illustrating a driving voltage range of a fourth transistor depending on the presence or absence of a bottom gate electrode according to one or more embodiments.

FIG. 30 is a graph illustrating a threshold voltage of a fourth transistor depending on the presence or absence of a bottom gate electrode according to one or more embodiments. FIG. 31 is a graph illustrating a driving voltage range of a fourth transistor depending on the presence or absence of a bottom gate electrode according to one or more embodiments.

In FIGS. 30 and 31, the X-axis represents the presence or absence of the bottom gate electrode. In FIG. 30, the Y-axis represents the threshold voltage of the fourth transistor T4, and the Y-axis represents the driving voltage range of the fourth transistor T4 in FIG. 31.

Referring to FIGS. 30 and 31, when the bottom gate electrode of the fourth transistor T4 is electrically connected to a first electrode of the fourth transistor T4 (SOURCE-SYNC), the threshold voltage Vth of the fourth transistor T4 may be shifted more negatively than the threshold voltage Vth of the fourth transistor T4 when the fourth transistor T4 does not include the bottom gate electrode (NORMAL). In addition, when the bottom gate electrode of the fourth transistor T4 is electrically connected to the first electrode of the fourth transistor T4 (SOURCE-SYNC), the driving voltage range DR range of the fourth transistor T4 may be higher than the driving voltage range DR range of the fourth transistor T4 when the fourth transistor T4 does not include the bottom gate electrode (NORMAL). However, when the bottom gate electrode of the fourth transistor T4 is electrically connected to the first electrode of the fourth transistor T4 (SOURCE-SYNC), the width of the driving voltage range DR range of the fourth transistor T4 may be similar to the width of the driving voltage range DR range of the fourth transistor T4 when the fourth transistor T4 does not include the bottom gate electrode (NORMAL).

In FIGS. 30 and 31, the case where the bottom gate electrode of the fourth transistor T4 is electrically connected to the first electrode of the fourth transistor T4 (SOURCE-SYNC) indicates that the bottom gate electrode of the third sub-transistor T41 of the fourth transistor T4 and the bottom gate electrode of the fourth sub-transistor T42 are electrically connected to the first electrode of the third sub-transistor T41.

Figure 32:
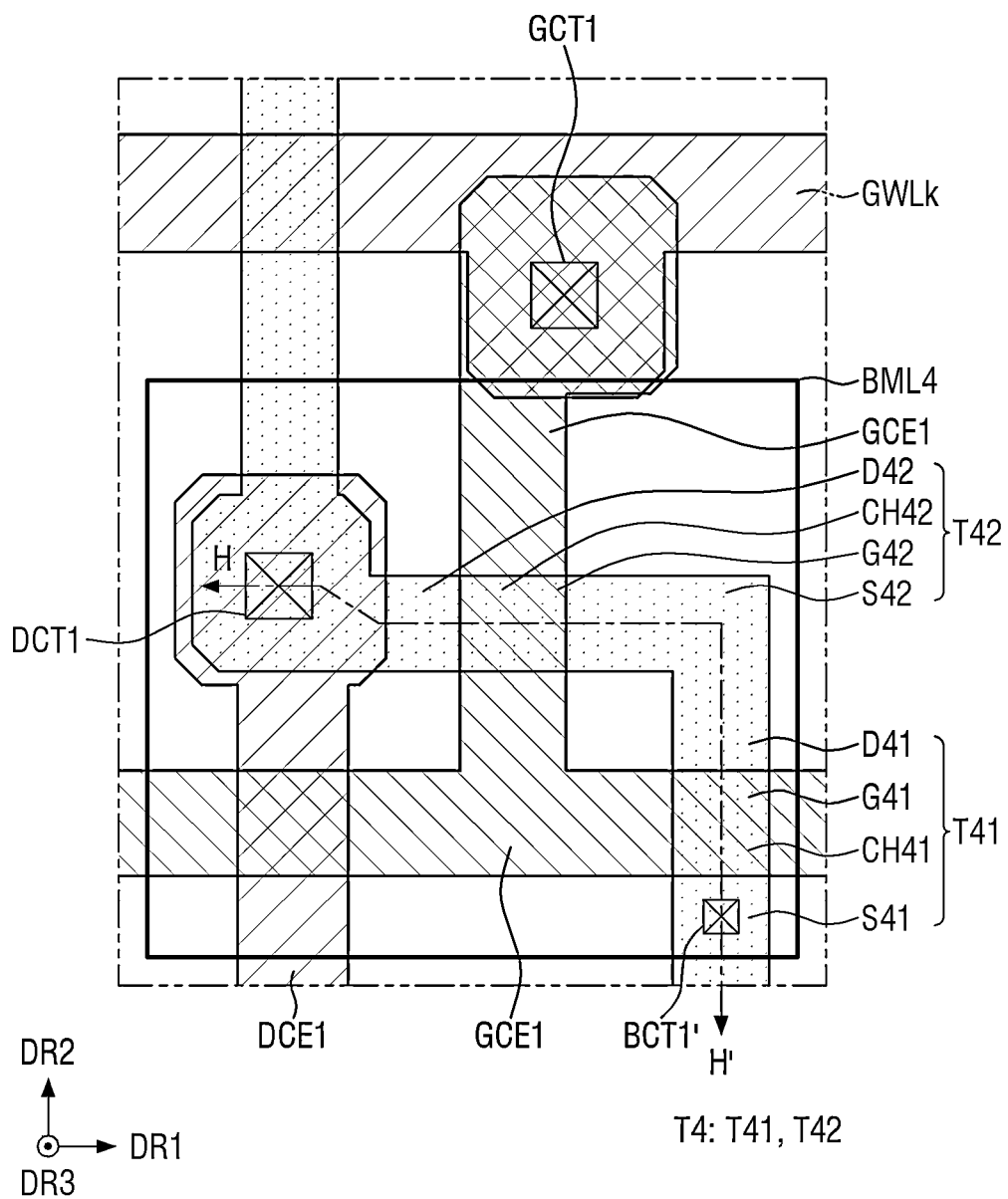
FIG. 32 is a layout diagram illustrating a fourth transistor of a first sub-pixel according to one or more embodiments.

FIG. 32 is a layout diagram illustrating a fourth transistor of a first sub-pixel according to one or more embodiments.

The embodiment of FIG. 32 is different from the embodiment of FIG. 12 in that the third sub-source electrode S41 of the third sub-transistor T41 is connected to the fourth bottom gate electrode BML4. In the embodiment of FIG. 32, overlapping descriptions with those of the embodiment of FIG. 12 are omitted.

Referring to FIG. 32, the third sub-source electrode S41 of the third sub-transistor T41 of the fourth transistor T4 may be connected to the fourth bottom gate electrode BML4 through a first lower contact hole BCT1'.

The fourth bottom gate electrode BML4 may overlap the third sub-channel CH41, the third sub-source electrode S41, and the third sub-drain electrode D41 of the third sub-transistor T41 and the fourth sub-channel CH42, the fourth sub-source electrode S42, and the fourth sub-drain electrode D42 of the fourth sub-transistor T42. Light incident from the outside may not be incident to the third sub-channel CH41 of the third sub-transistor T41 and the fourth sub-channel CH42 of the fourth sub-transistor T42 because it is blocked by the fourth bottom gate electrode BML4. Therefore, it is possible to prevent the plurality of device identifiers DID from being visually recognized in the inspection mode because the light leakage current of the third sub-transistor T41 and the light leakage current of the fourth sub-transistor T42 may be reduced.

Figure 33:
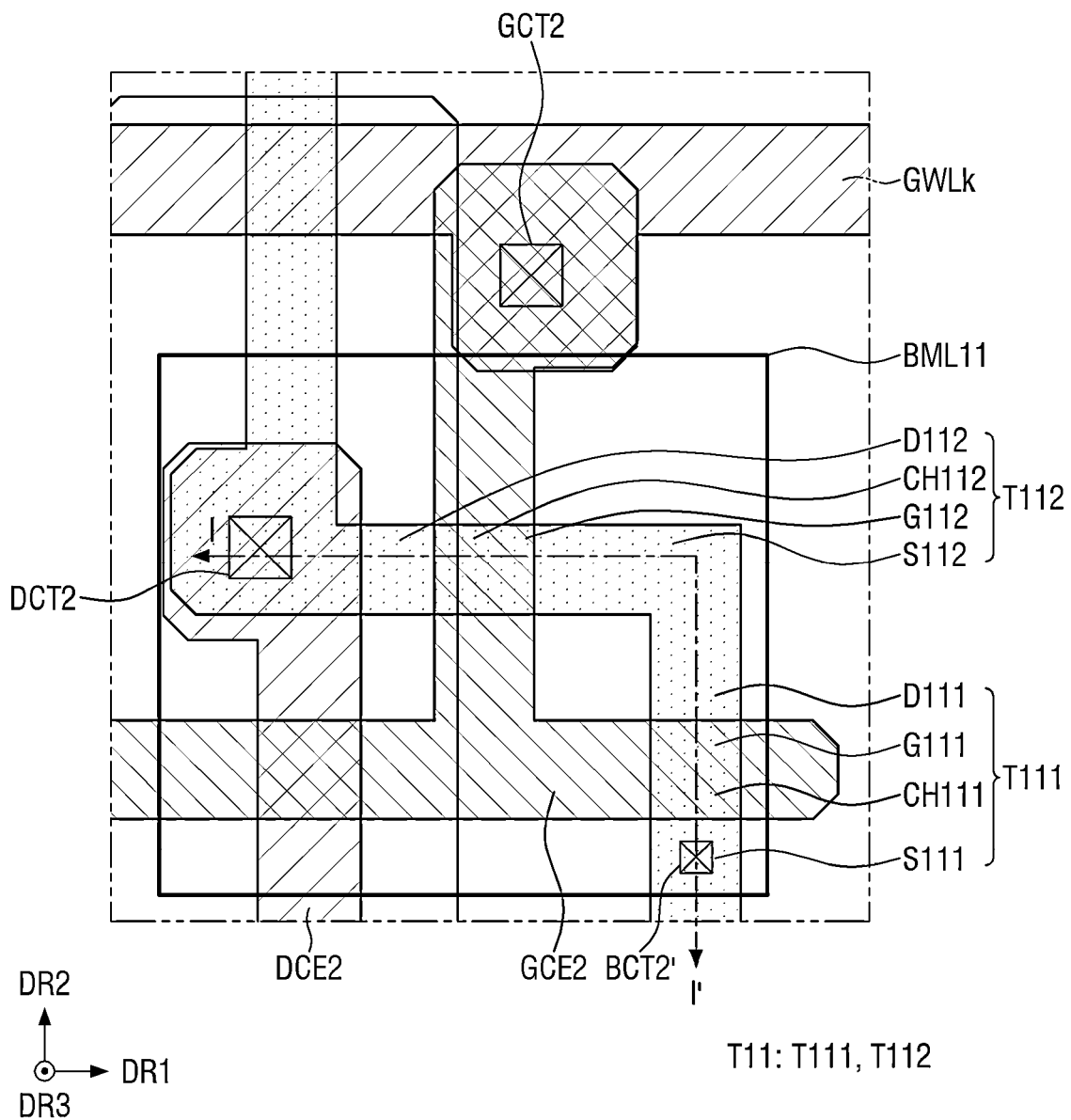
FIG. 33 is a layout diagram illustrating an eleventh transistor of a first sub-pixel according to one or more embodiments.

FIG. 33 is a layout diagram illustrating an eleventh transistor of a first sub-pixel according to one or more embodiments.

The embodiment of FIG. 33 is different from the embodiment of FIG. 13 in that the seventh sub-source electrode S111 of the seventh sub-transistor T111 is connected to the eleventh bottom gate electrode BML11. In the embodiment of FIG. 33, overlapping descriptions with those of the embodiment of FIG. 13 are omitted.

Referring to FIG. 33, the seventh sub-source electrode S111 of the seventh sub-transistor T111 may be connected to the eleventh bottom gate electrode BML11 through a second lower contact hole BCT2'.

The eleventh bottom gate electrode BML11 may overlap the seventh sub-channel CH111, the seventh sub-source electrode S111, and the seventh sub-drain electrode D111 of the seventh sub-transistor T111, and the eighth sub-channel CH112, the eighth sub-source electrode S112, and the eighth sub-drain electrode D112 of the eighth sub-transistor T112. Light incident from the outside may not be incident to the seventh sub-channel CH111 of the seventh sub-transistor T111 and the eighth sub-channel CH112 of the eighth sub-transistor T112 because it is blocked by the eleventh bottom gate electrode BML11. Therefore, it is possible to prevent the plurality of device identifiers DID from being visually recognized in the inspection mode because the light leakage current of the seventh sub-transistor T111 and the light leakage current of the eighth sub-transistor T112 may be reduced.

Figure 34:
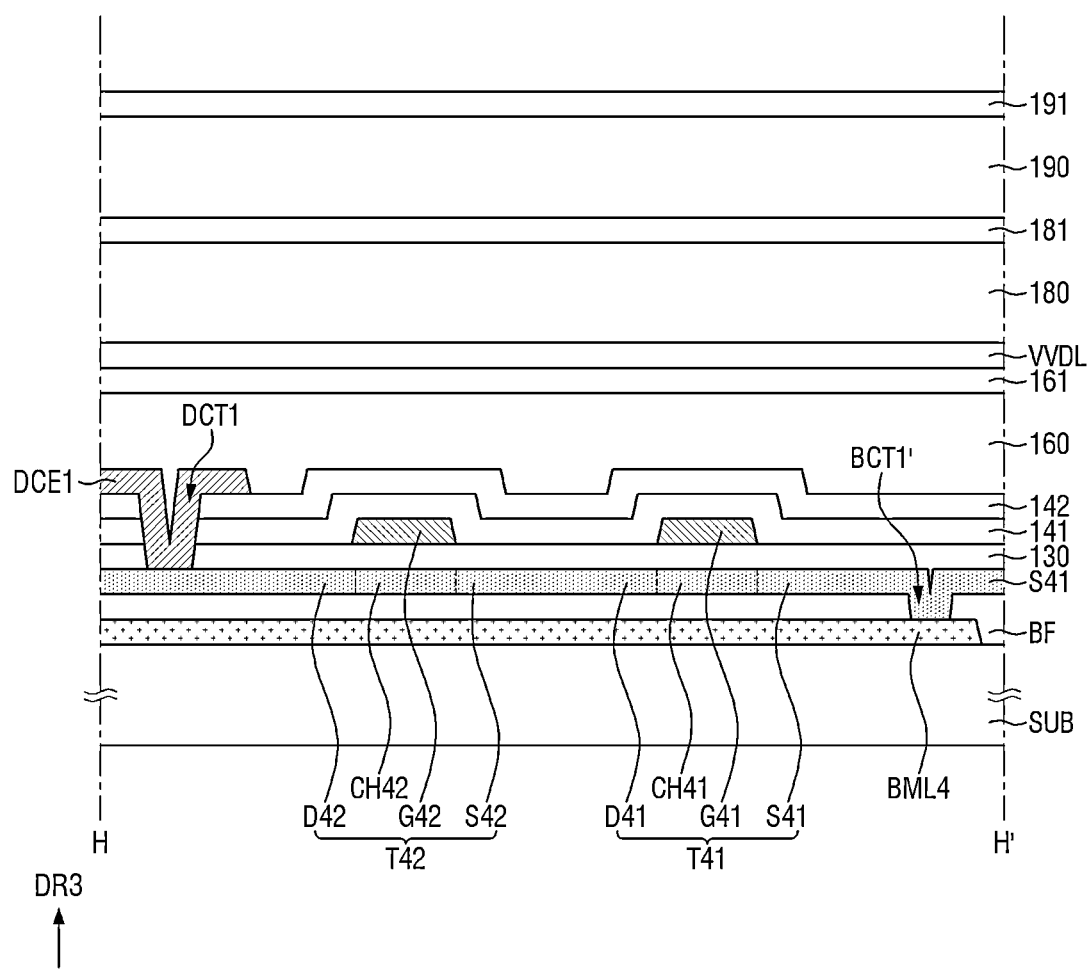
FIG. 34 is a cross-sectional view of the display panel taken along the line H-H' of FIG. 32.
Figure 35:
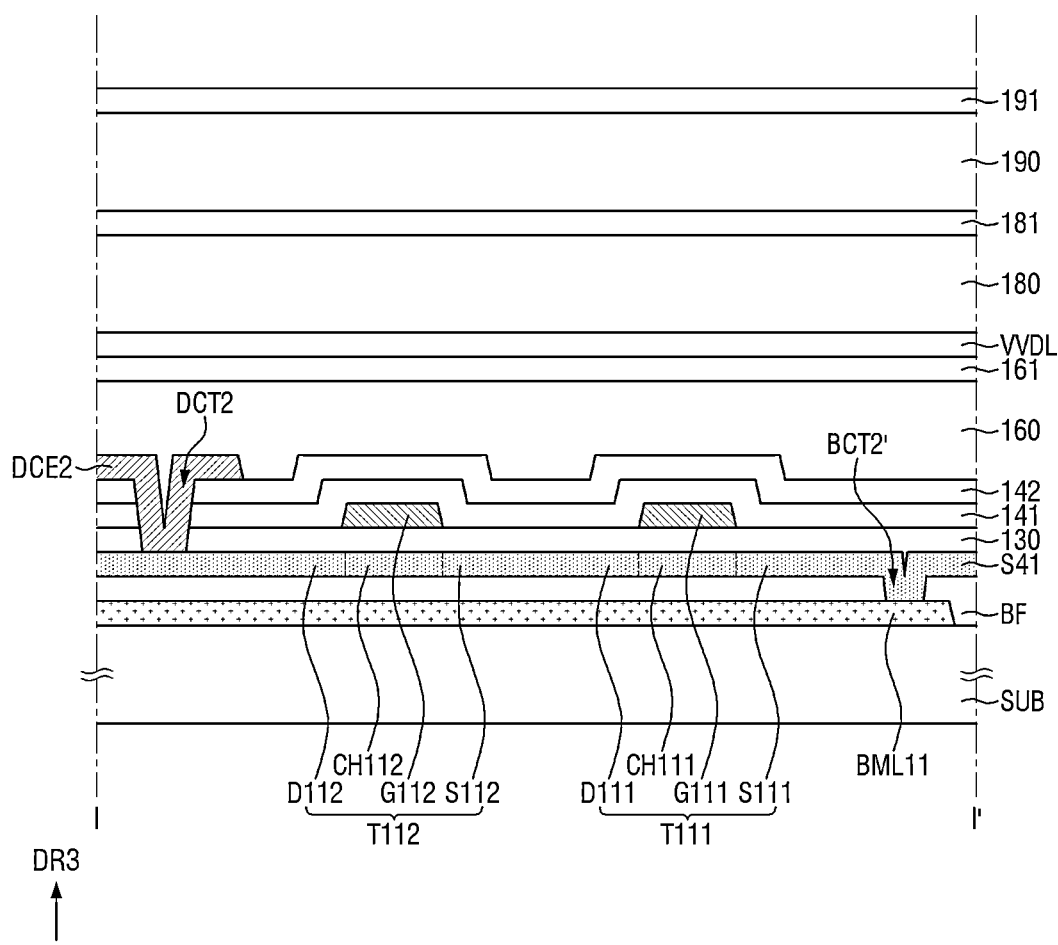
FIG. 35 is a cross-sectional view of the display panel taken along the line I-I' of FIG. 33.

FIG. 34 is a cross-sectional view of the display panel taken along the line H-H' of FIG. 32. FIG. 35 is a cross-sectional view of the display panel taken along the line I-I' of FIG. 33.

The embodiments of FIGS. 34 and 35 are different from the embodiments of FIGS. 15 to 17 in the first lower contact hole BCT1' and the second lower contact hole BCT2'. In FIGS. 34 and 35, descriptions overlapping with the embodiments of FIGS. 15 to 17 are omitted.

Referring to FIGS. 34 and 35, the third sub-source electrode S41 of the third sub-transistor T41 may be connected to the fourth bottom gate electrode BML4 through the first lower contact hole BCT1' penetrating the buffer film BF.

The seventh sub-source electrode S111 of the seventh sub-transistor T111 may be connected to the eleventh bottom gate electrode BML11 through the second lower contact hole BCT2' penetrating the buffer film BF.

Figure 36:
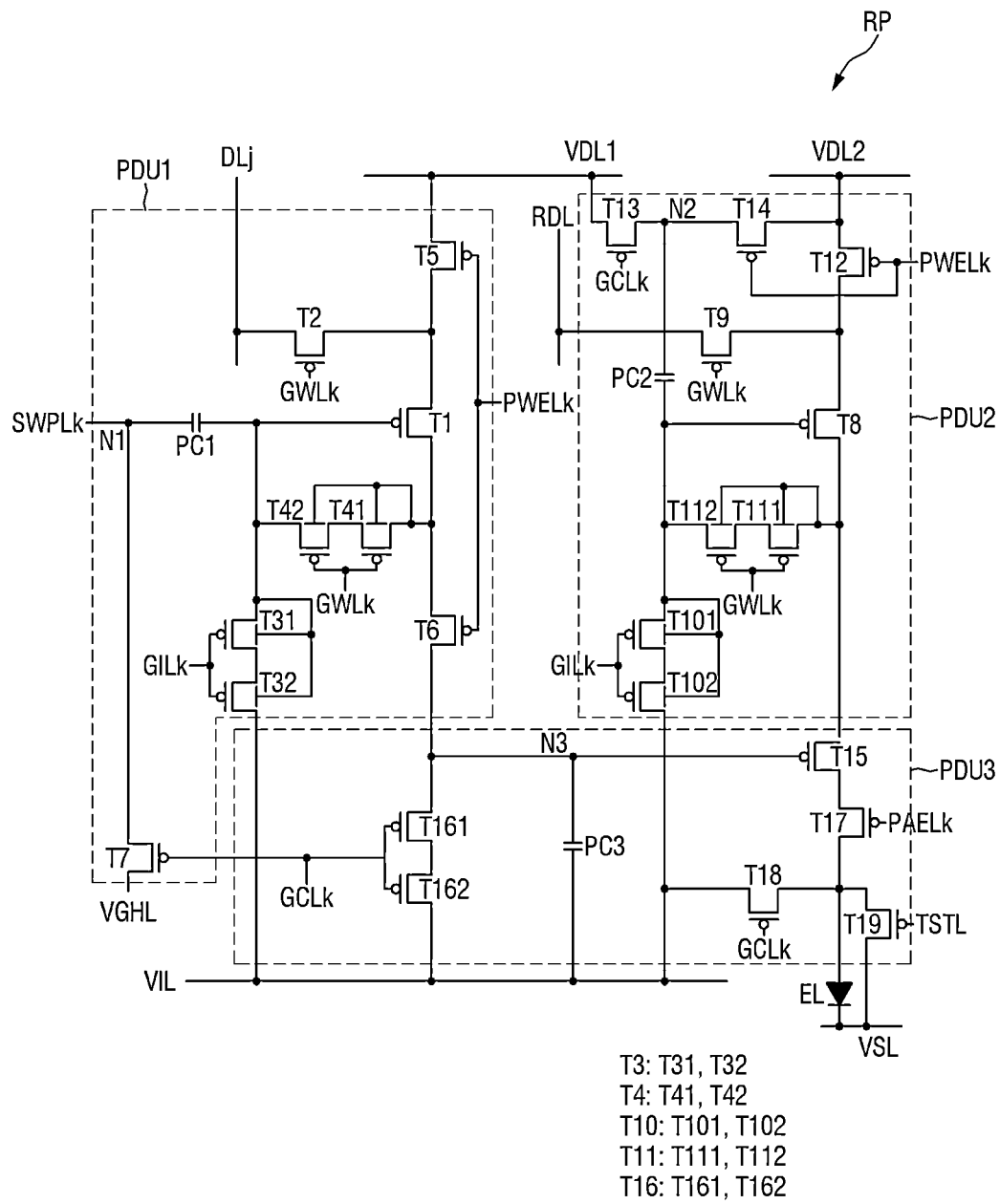
FIG. 36 is an equivalent circuit diagram illustrating a first sub-pixel according to one or more embodiments.

FIG. 36 is an equivalent circuit diagram illustrating a first sub-pixel according to one or more embodiments.

The embodiment of FIG. 36 is different from the embodiment of FIG. 29 in that the first sub-transistor T31 and the second sub-transistor T32 of the third transistor T3 include the bottom gate electrode and the fifth sub-transistor T101 and the sixth sub-transistor T102 of the tenth transistor T10 include the bottom gate electrode. In FIG. 36, differences from the embodiment of FIG. 29 will be mainly described.

Referring to FIG. 36, the bottom gate electrode of the first sub-transistor T31 of the third transistor T3 and the bottom gate electrode of the second sub-transistor T32 may be electrically connected to each other. For example, the bottom gate electrode of the first sub-transistor T31 of the third transistor T3 and the bottom gate electrode of the second sub-transistor T32 may be connected to the first electrode of the first sub-transistor T31. The first electrode of the first sub-transistor T31 may be connected to the gate electrode of the first transistor T1 and the second electrode of the fourth sub-transistor T42 of the fourth transistor T4.

The bottom gate electrode of the first sub-transistor T31 of the third transistor T3 and the bottom gate electrode of the second sub-transistor T32 may have the same potential as the first electrode of the first sub-transistor T31. That is, the voltage of the bottom gate electrode of the first sub-transistor T31 of the third transistor T3 and the voltage of the bottom gate electrode of the second sub-transistor T32 may be synchronized with the voltage of the first electrode of the first sub-transistor T31.

The bottom gate electrode of the fifth sub-transistor T101 of the tenth transistor T10 and the bottom gate electrode of the sixth sub-transistor T102 may be electrically connected to each other. For example, the bottom gate electrode of the fifth sub-transistor T101 of the tenth transistor T10 and the bottom gate electrode of the sixth sub-transistor T102 may be connected to the first electrode of the fifth sub-transistor T101. The first electrode of the fifth sub-transistor T101 may be connected to the gate electrode of the eighth transistor T8 and the second electrode of the eighth sub-transistor T112 of the eleventh transistor T11.

The bottom gate electrode of the fifth sub-transistor T101 of the tenth transistor T10 and the bottom gate electrode of the sixth sub-transistor T102 may have the same potential as the first electrode of the fifth sub-transistor T101. That is, the voltage of the bottom gate electrode of the fifth sub-transistor T101 and the voltage of the bottom gate electrode of the sixth sub-transistor T102 of the tenth transistor T10 may be synchronized with the voltage of the first electrode of the fifth sub-transistor T101.

Figure 37:
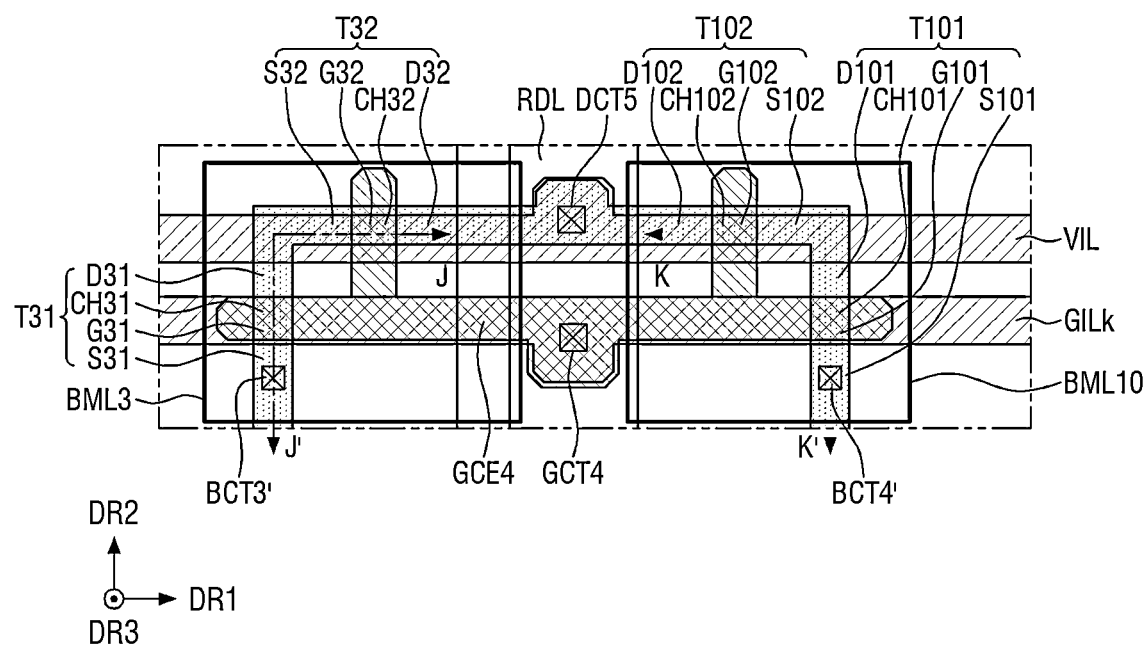
FIG. 37 is a layout diagram illustrating a third transistor and a tenth transistor of a first sub-pixel according to one or more embodiments.

FIG. 37 is a layout diagram illustrating a third transistor and a tenth transistor of a first sub-pixel according to one or more embodiments.

The embodiment of FIG. 37 is different from the embodiment of FIG. 21 in that the first sub-source electrode S31 of the first sub-transistor T31 is connected to the third bottom gate electrode BML3 and a fifth sub-source electrode S101 of the fifth sub-transistor T101 is connected to the tenth bottom gate electrode BML10. In the embodiment of FIG. 37, descriptions overlapping those of the embodiment of FIG. 21 are omitted.

Referring to FIG. 37, the first sub-source electrode S31 of the first sub-transistor T31 of the third transistor T3 may be connected to the third bottom gate electrode BML3 through a third lower contact hole BCT3'. The fifth sub-source electrode S101 of the fifth sub-transistor T101 of the tenth transistor T10 may be connected to the tenth bottom gate electrode BML10 through a fourth lower contact hole BCT4'.

The third bottom gate electrode BML3 may overlap the first sub-channel CH31, the first sub-source electrode S31, and the first sub-drain electrode D31 of the first sub-transistor T31 and the second sub-channel CH32, the second sub-source electrode S32, and the second sub-drain electrode D32 of the second sub-transistor T32. Light incident from the outside may not be incident to the first sub-channel CH31 of the first sub-transistor T31 and the second sub-channel CH32 of the second sub-transistor T32 because it is blocked by the third bottom gate electrode BML3. Therefore, it is possible to prevent the plurality of device identifiers DID from being visually recognized in the inspection mode because the light leakage current of the first sub-transistor T31 and the light leakage current of the second sub-transistor T32 may be reduced.

The tenth bottom gate electrode BML10 may overlap the fifth sub-channel CH101, the fifth sub-source electrode S101, and the fifth sub-drain electrode D101 of the fifth sub-transistor T101 and the sixth sub-channel CH102 of the sixth sub-transistor T102, the sixth sub-source electrode S102, and the sixth sub-drain electrode D102. Light incident from the outside may not be incident on the fifth sub-channel CH101 of the fifth sub-transistor T101 and the sixth sub-channel CH102 of the sixth sub-transistor T102 because it is blocked by the eleventh bottom gate electrode BML11. Therefore, it is possible to prevent the plurality of device identifiers DID from being visually recognized in the inspection mode because the light leakage current of the fifth sub-transistor T101 and the light leakage current of the sixth sub-transistor T102 may be reduced.

Figure 38:
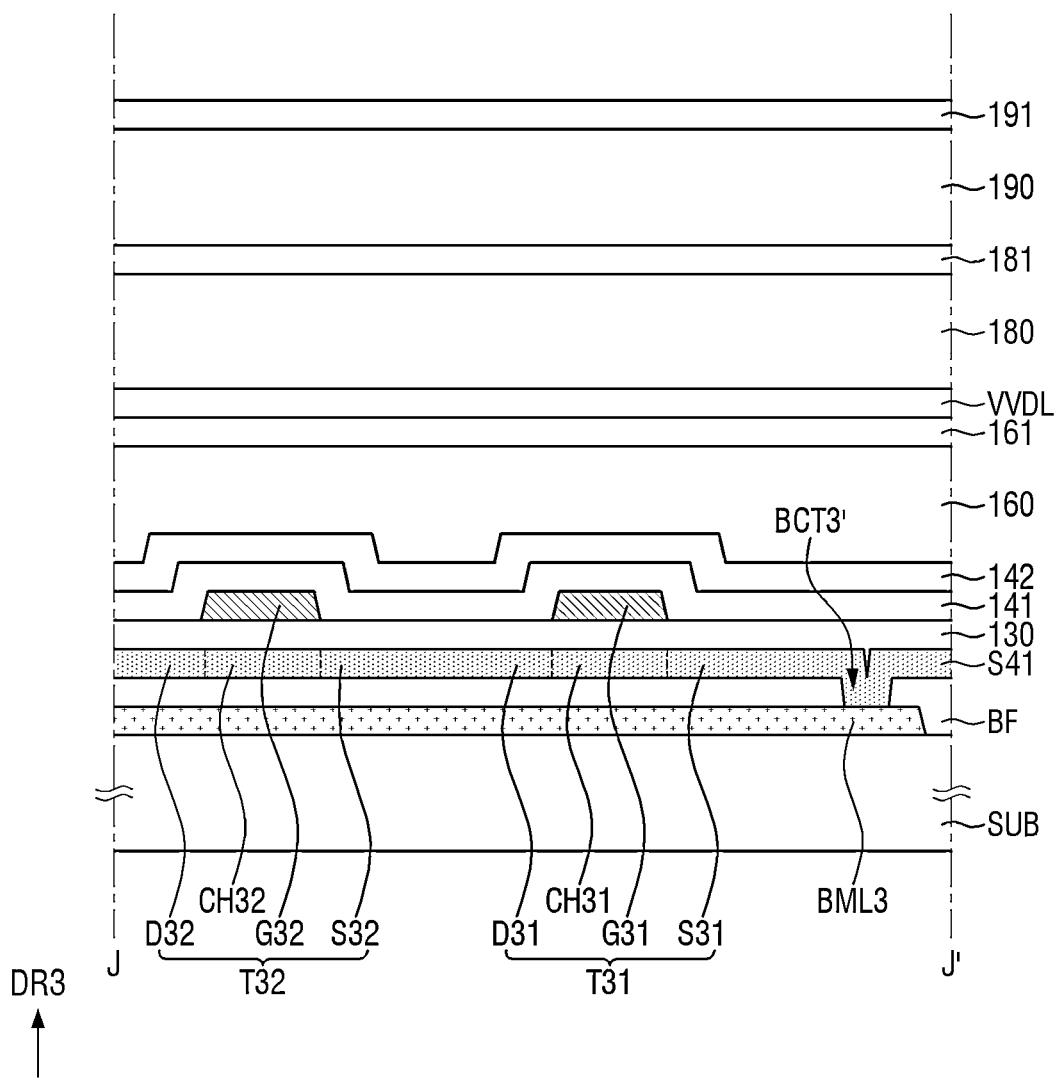
FIG. 38 is a cross-sectional view illustrating an example of a display panel taken along the line J-J' of FIG. 37.
Figure 39:
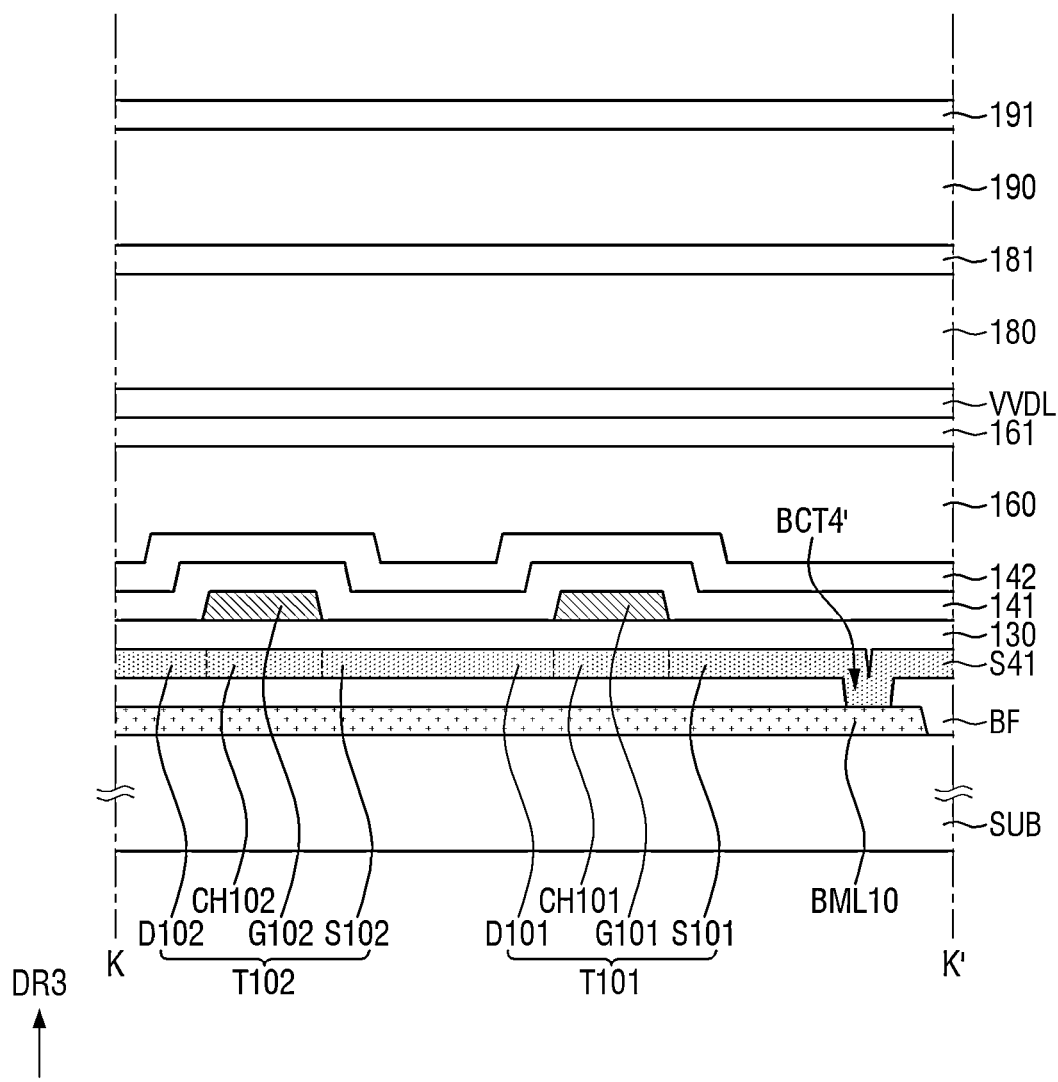
FIG. 39 is a cross-sectional view illustrating an example of a display panel taken along the line K-K' of FIG. 37.

FIG. 38 is a cross-sectional view illustrating an example of a display panel taken along the line J-J' of FIG. 37. FIG. 39 is a cross-sectional view illustrating an example of a display panel taken along the line K-K' of FIG. 37.

The embodiments of FIGS. 38 and 39 are different from the embodiments of FIGS. 22 and 23 in that the first sub-source electrode S31 of the first sub-transistor T31 is connected to the third bottom gate electrode BML3 and a fifth source electrode S101 of the fifth sub transistor T101 is connected to the tenth bottom gate electrode BML10. In the embodiments of FIGS. 38 and 39, descriptions overlapping those of the embodiments of FIGS. 22 and 23 will be omitted.

Referring to FIGS. 38 and 39, the first sub-source electrode S31 of the first sub-transistor T31 may be connected to the third bottom gate electrode BML3 through a third lower contact hole BCT3' penetrating the buffer film BF.

The fifth sub-source electrode S101 of the fifth sub-transistor T101 may be connected to the tenth bottom gate electrode BML10 through a fourth lower contact hole BCT4' penetrating the buffer film BF.

Figure 40:
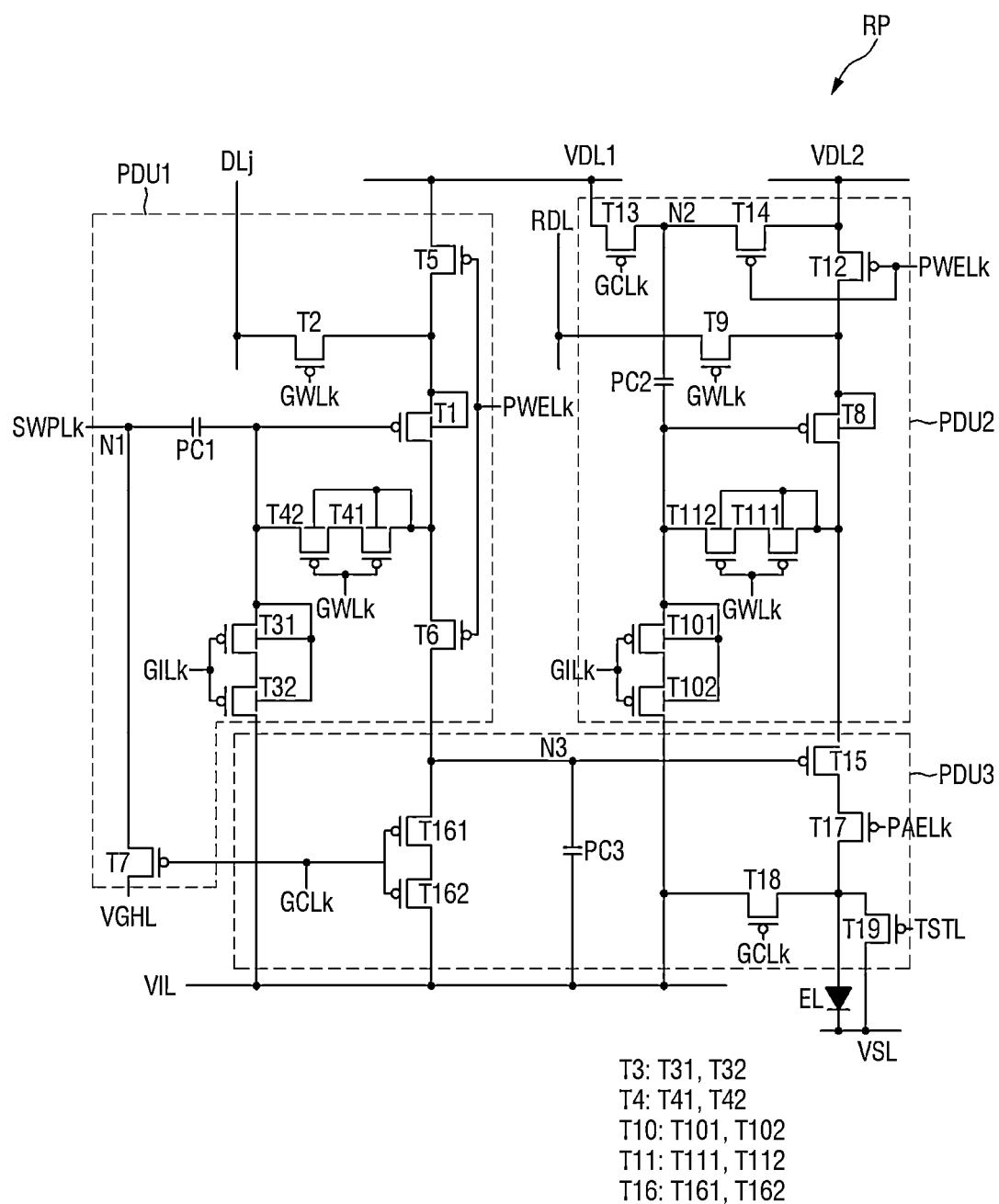
FIG. 40 is an equivalent circuit diagram illustrating a first sub-pixel according to one or more embodiments.

FIG. 40 is an equivalent circuit diagram illustrating a first sub-pixel according to one or more embodiments.

The embodiment of FIG. 40 is different from the embodiment of FIG. 24 in that the first transistor T1 includes the bottom gate electrode and the eighth transistor T8 includes the bottom gate electrode. The embodiment of FIG. 40 will be described focusing on differences from the embodiment of FIG. 24.

Referring to FIG. 40, the bottom gate electrode of the first transistor T1 may be connected to the first electrode of the first transistor T1. The first electrode of the first transistor T1 may be connected to the second electrode of the second transistor T2 and the second electrode of the fifth transistor T5. The bottom gate electrode of the first transistor T1 may have the same potential as the first electrode of the first transistor T1. That is, the voltage of the bottom gate electrode of the first transistor T1 and the voltage of the first electrode may be synchronized.

The bottom gate electrode of the eighth transistor T8 may be connected to the first electrode of the eighth transistor T8. The first electrode of the eighth transistor T8 may be connected to the second electrode of the ninth transistor T9 and the second electrode of the twelfth transistor T12. The bottom gate electrode of the eighth transistor T8 may have the same potential as the first electrode of the eighth transistor T8. That is, the voltage of the bottom gate electrode of the eighth transistor T8 and the voltage of the first electrode may be synchronized.

Figure 41:
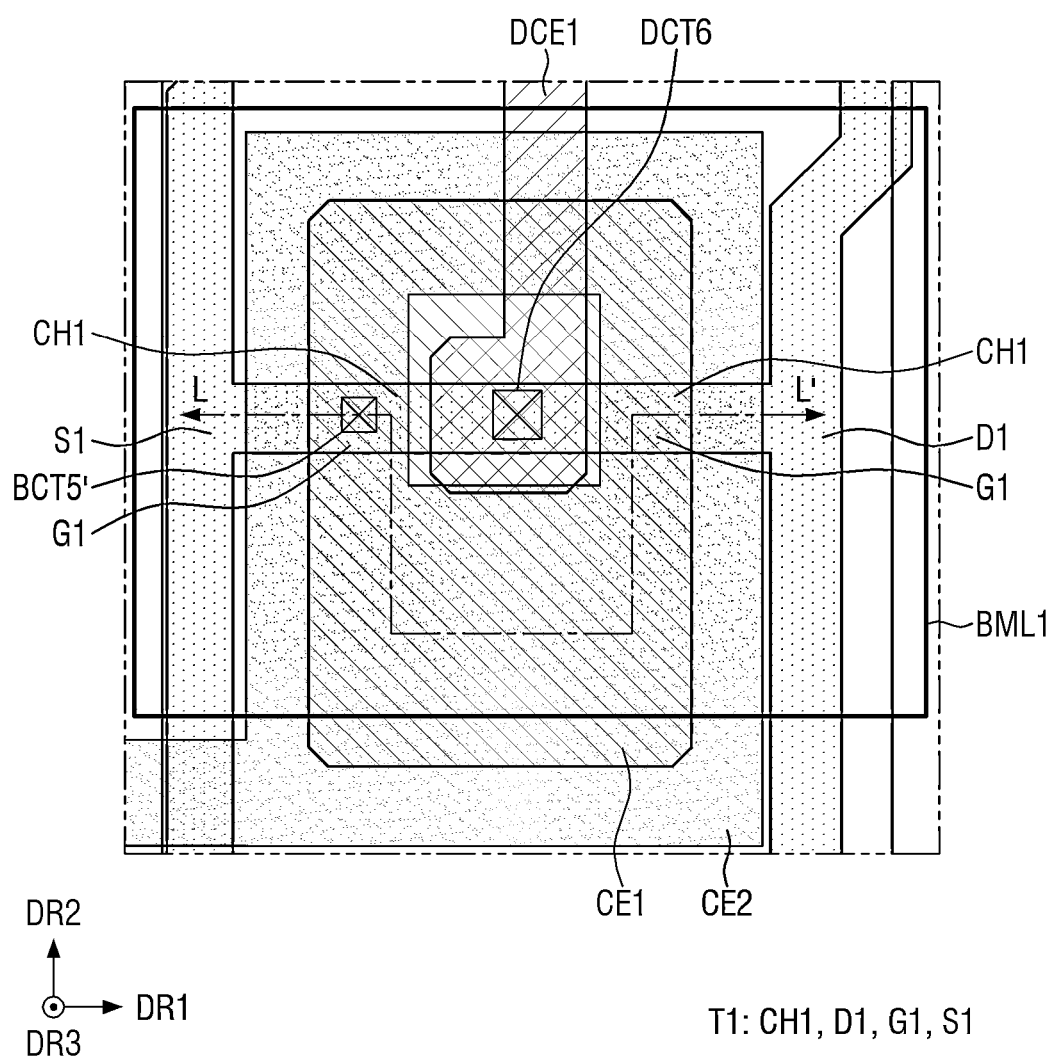
FIG. 41 is a layout diagram illustrating a first transistor of a first sub-pixel according to one or more embodiments.

FIG. 41 is a layout diagram illustrating a first transistor of a first sub-pixel according to one or more embodiments.

The embodiment of FIG. 41 is different from the embodiment of FIG. 25 in that the first source electrode S1 of the first transistor T1 is connected to the first bottom gate electrode BML1. In the embodiment of FIG. 41, descriptions overlapping those of the embodiment of FIG. 25 are omitted.

Referring to FIG. 41, the first source electrode S1 of the first transistor T1 may be connected to the first bottom gate electrode BML1 through a fifth lower contact hole BCT5'. FIG. 41 illustrates that the fifth lower contact hole BCT5' overlaps the first gate electrode G1 and the second capacitor electrode CE2 of the first transistor T1 in the third direction DR3, but one or more embodiments of the present disclosure are not limited thereto. For example, the fifth lower contact hole BCT5' may not overlap the first gate electrode G1 of the first transistor T1 but it may overlap the second capacitor electrode CE2 in the third direction DR3. Alternatively, the fifth lower contact hole BCT5' may not overlap the first gate electrode G1 and the second capacitor electrode CE2 of the first transistor T1 in the third direction DR3.

The first bottom gate electrode BML1 may overlap the first channel CH1, the first source electrode S1, and the first drain electrode D1 of the first transistor T1. Light incident from the outside may not be incident to the first channel CH1 of the first transistor T1 because it is blocked by the first bottom gate electrode BML1. Therefore, it is possible to prevent the plurality of device identifiers DID from being visually recognized in the inspection mode because the light leakage current of the first transistor T1 may be reduced.

Figure 42:
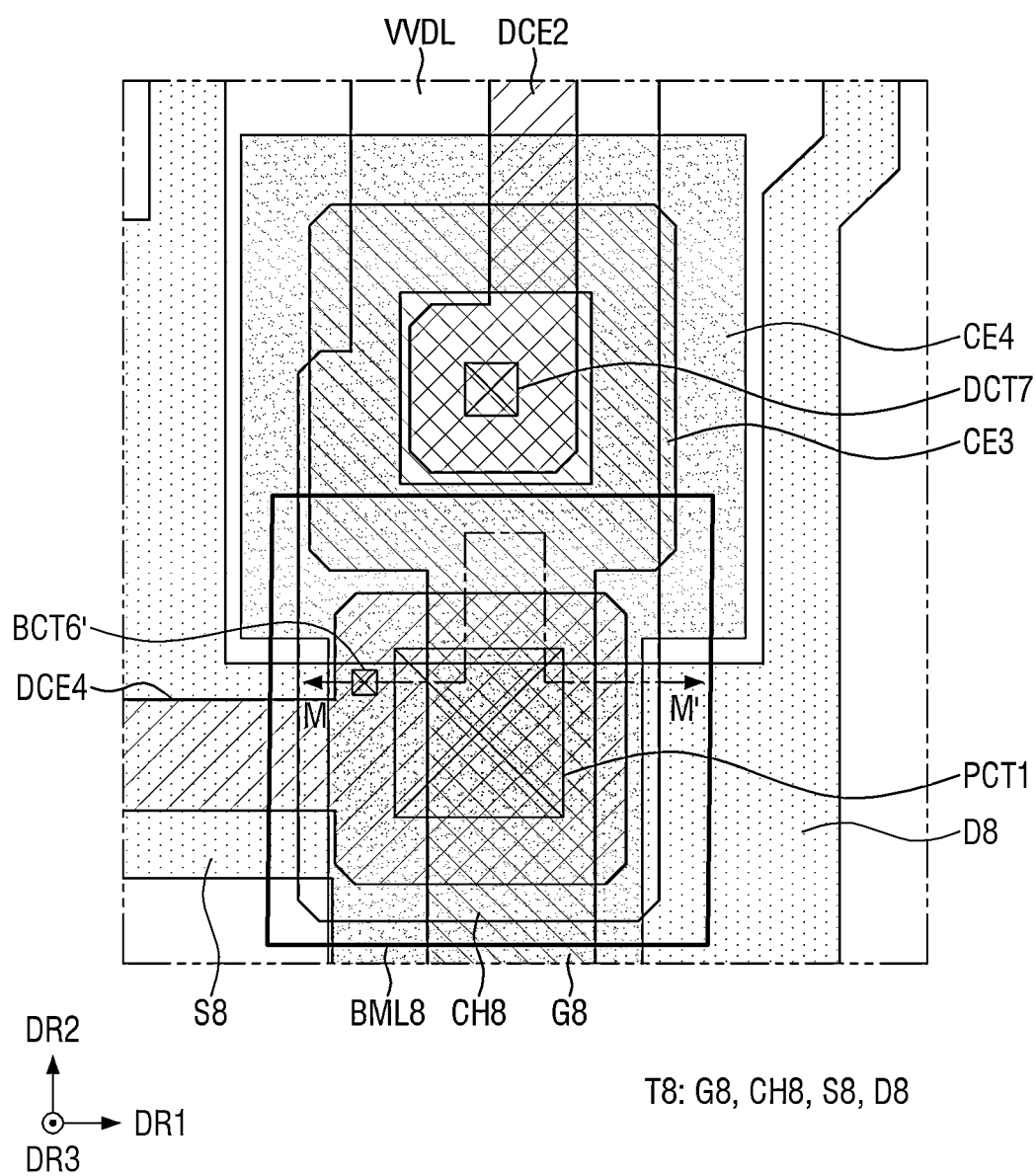
FIG. 42 is a layout diagram illustrating an eighth transistor of a first sub-pixel according to one or more embodiments.

FIG. 42 is a layout diagram illustrating an eighth transistor of a first sub-pixel according to one or more embodiments.

The embodiment of FIG. 42 is different from the embodiment of FIG. 26 in that the eighth source electrode S8 of the eighth transistor T8 is connected to the eighth bottom gate electrode BML8. In the embodiment of FIG. 42, descriptions overlapping those of the embodiment of FIG. 26 are omitted.

Referring to FIG. 42, the eighth source electrode S8 of the eighth transistor T8 may be connected to the eighth bottom gate electrode BML8 through a sixth lower contact hole BCT6'. FIG. 42 illustrates that a sixth lower contact hole BCT6' overlaps the eighth gate electrode G8 of the eighth transistor T8 and the fourth capacitor electrode CE4 in the third direction DR3 but one or more embodiments of the present disclosure are not limited thereto. For example, the sixth lower contact hole BCT6' does not overlap the eighth gate electrode G8 of the eighth transistor T8, but it may overlap the fourth capacitor electrode CE4 in the third direction DR3. Alternatively, the sixth lower contact hole BCT6' may not overlap the eighth gate electrode G8 of the eighth transistor T8 and the fourth capacitor electrode CE4 in the third direction DR3.

The eighth bottom gate electrode BML8 may overlap the eighth channel CH8, the eighth source electrode S8, and the eighth drain electrode D8 of the eighth transistor T8. Light incident from the outside may not be incident to the eighth channel CH8 of the eighth transistor T8 because it is blocked by the eighth bottom gate electrode BML8. Therefore, it is possible to prevent the plurality of device identifiers DID from being visually recognized in the inspection mode because the light leakage current of the eighth transistor T8 may be reduced.

Figure 43:
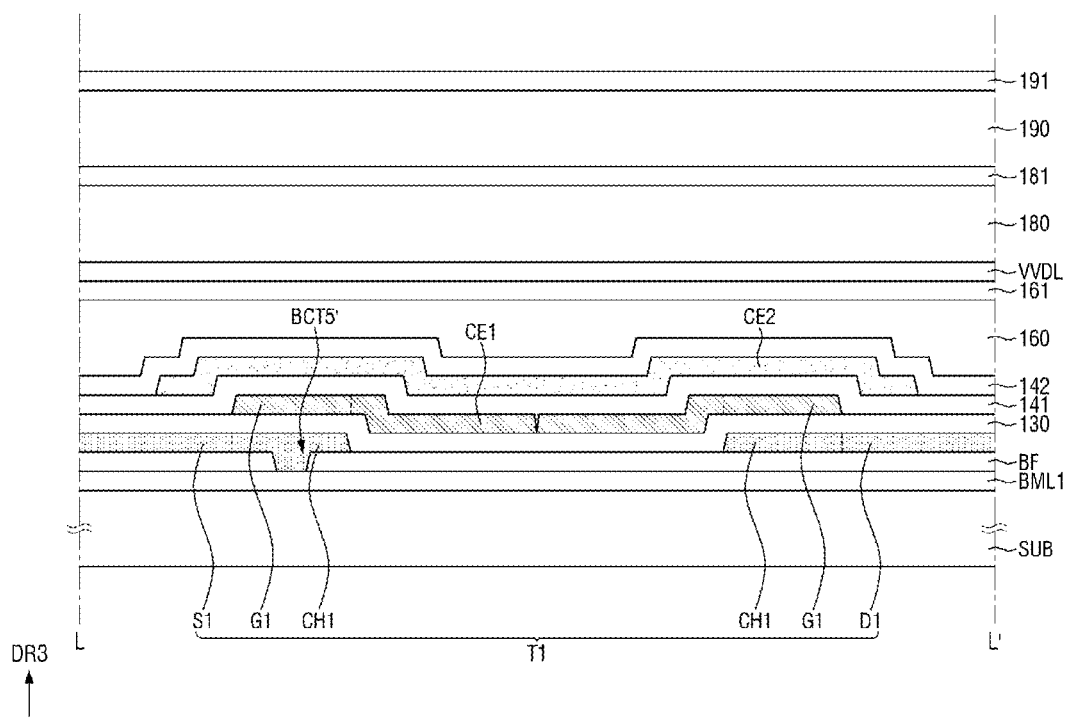
FIG. 43 is a cross-sectional view illustrating an example of a display panel taken along the line L-L' of FIG. 41.
Figure 44:
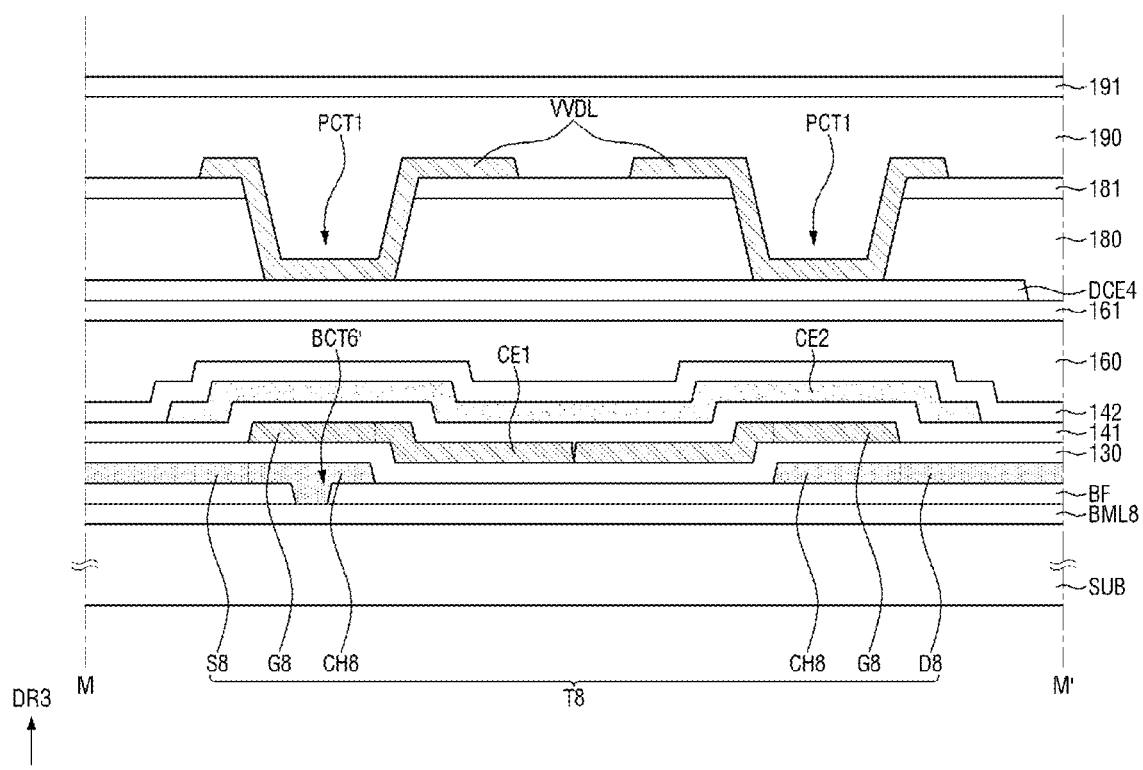
FIG. 44 is a cross-sectional view illustrating an example of a display panel taken along the line M-M' of FIG. 42.

FIG. 43 is a cross-sectional view illustrating an example of a display panel taken along the line L-L' of FIG. 41. FIG. 44 is a cross-sectional view illustrating an example of a display panel taken along the line M-M' of FIG. 42.

The embodiments of FIGS. 43 and 44 are different from the embodiments of FIGS. 27 and 28 in that the first source electrode S1 of the first transistor T1 is connected to the first bottom gate electrode BML1 and the eighth source electrode S8 of the eighth transistor T8 is connected to the eighth bottom gate electrode BML8. In FIGS. 43 and 44, descriptions overlapping with the embodiments of FIGS. 27 and 28 are omitted.

Referring to FIGS. 43 and 44, the first source electrode S1 of the first transistor T1 may be connected to the first bottom gate electrode BML1 through the fifth lower contact hole BCT5' penetrating the buffer film BF.

The eighth source electrode S8 of the eighth transistor T8 may be connected to the eighth bottom gate electrode BML8 through the sixth lower contact hole BCT6' penetrating the buffer film BF.

Figure 45:
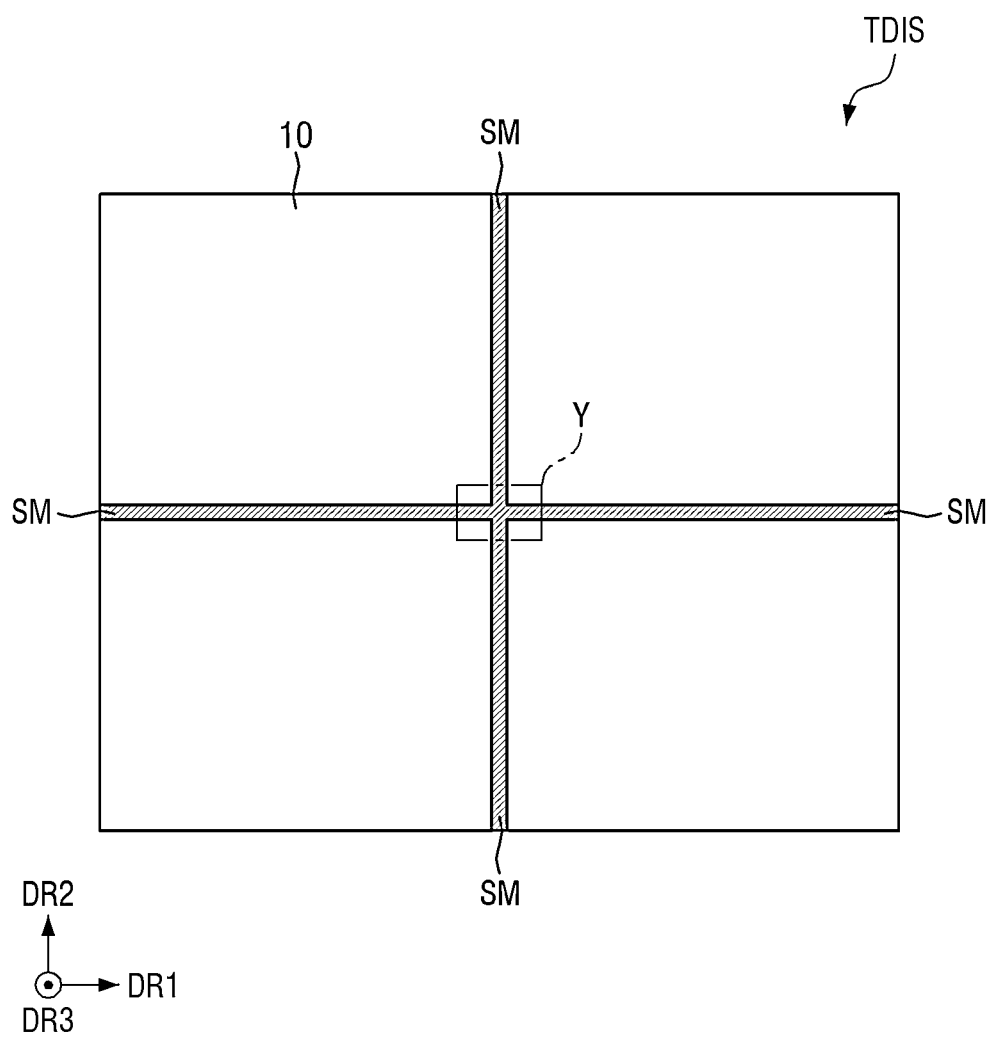
FIG. 45 is a perspective view illustrating a tiled display device including a plurality of display devices according to one or more embodiments.

FIG. 45 is a perspective view illustrating a tiled display device including a plurality of display devices according to another embodiment.

Referring to FIG. 45, a tiled display device TDIS may include a plurality of display devices 11, 12, 13, and 14, and a connection member SM. For example, the tiled display device TD may include a first display device 11, a second display device 12, a third display device 13, and a fourth display device 14.

The plurality of display devices 11, 12, 13, and 14 may be arranged in a matrix form in M (M is a positive integer) number of rows and N (N is a positive integer) number of columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TDIS are not limited to those illustrated in FIG. 45. The number and arrangement of the display devices 11, 12, 13, and 14 in the tiled display device TDIS may be determined in response to the size of the display device 10 and the tiled display device TDIS, and the shape of the tiled display device TDIS.

The plurality of display devices 11, 12, 13, and 14 may have the same size as each other, but embodiments of the present disclosure are not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be disposed such that the long sides or the short sides thereof are connected to each other. Some or all of the plurality of display devices 11, 12, 13, and 14 may be disposed at the edge of the tiled display device TDIS and may be disposed one side of the tiled display device TDIS. At least one of the plurality of display devices 11, 12, 13, and 14 may be disposed at least one corner of the tiled display device TDIS and may be formed two adjacent sides of the tiled display device TDIS. At least one of the plurality of display devices 11, 12, 13, and 14 may be surrounded by other display devices.

Each of the plurality of display devices 11, 12, 13, and 14 may be substantially the same as the display device 10 described with reference to FIG. 1. Therefore, a description of each of the plurality of display devices 11, 12, 13, and 14 will be omitted.

The connection member SM may include a coupling member or an adhesive member. In this case, the plurality of display devices 11, 12, 13, and 14 may be connected to each other by the coupling member or the adhesive member of the connection member SM. The connection member SM may be disposed between the first display device 11 and the second display device 12, between the first display device 11 and the third display device 13, between the second display device 12 and the fourth display device 14, and between the third display device 13 and the fourth display device 14.

Figure 46:
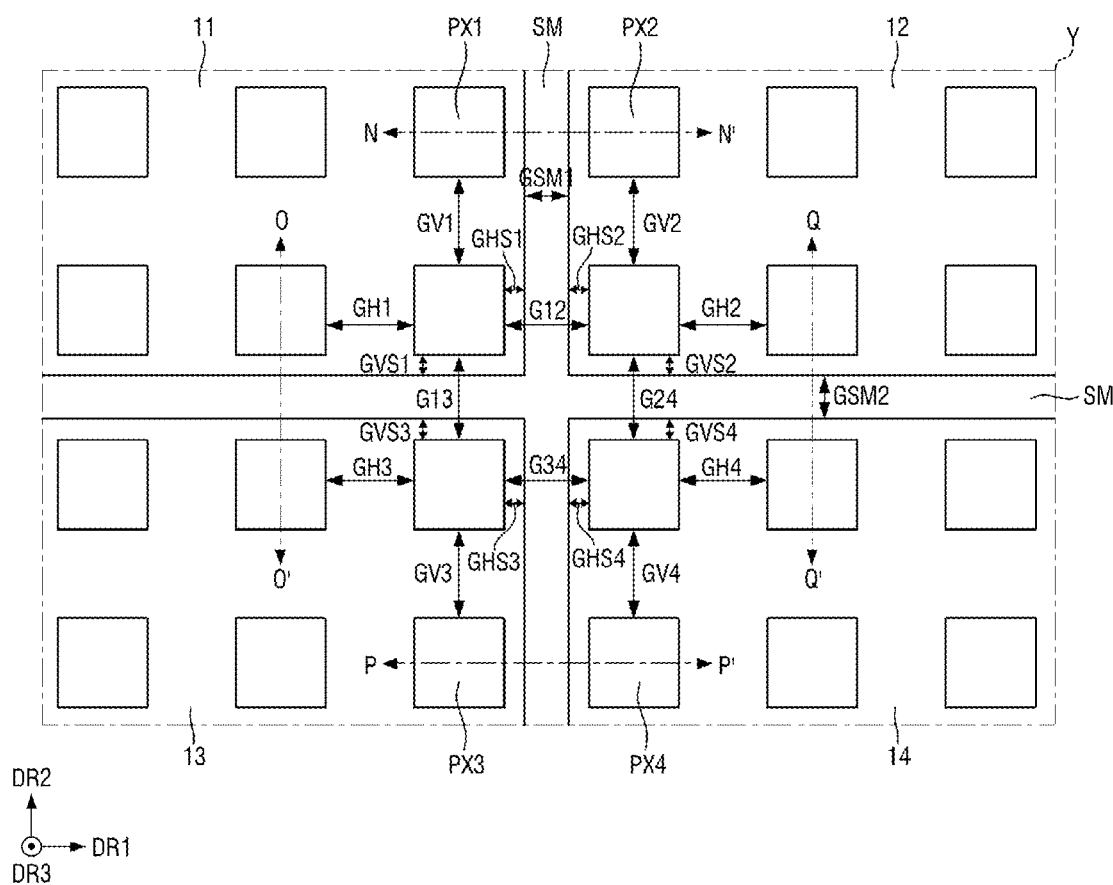
FIG. 46 is an enlarged layout diagram illustrating an area Y of FIG. 45 in detail.

FIG. 46 is an enlarged layout diagram illustrating an area Y of FIG. 45 in detail.

Referring to FIG. 46, the connection member SM may have a planar shape of a cross, or a plus sign in a central area of the device TDIS in which the first display device 11, the second display device 12, the third display device 13, and the fourth display device 14 are adjacent to each other. The connection member SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form in the first direction DR1 and the second direction DR2 to display an image. The second display device 12 may include second pixels PX2 arranged in a matrix in the first direction DR1 and the second direction DR2 to display an image. The third display device 13 may include third pixels PX3 arranged in a matrix in the first direction DR1 and the second direction DR2 to display an image. The fourth display device 14 may include fourth pixels PX4 arranged in a matrix in the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The connection member SM may be disposed between the first pixel PX1 and the second pixel PX2 adjacent in the first direction DR1. A minimum distance G12 between the first pixels PX1 and the second pixels PX2 adjacent in the first direction DR1 may be the sum of the minimum distance GHS1 between the first pixel PX1 and the connection member SM in the first direction DR1, the minimum distance GHS2 between the second pixel PX2 and the connection member SM in the first direction DR1 and a width GSM1 of the connection member SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the connection member SM in the first direction DR1 may be smaller than the first horizontal separation distance GH1, and the minimum distance GHS2 between the second pixel PX2 and the connection member SM in the first direction DR1 may be smaller than the second horizontal separation distance GH2. Further, the width GSM1 of the connection member SM in the first direction DR1 may be smaller than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same.

The connection member SM may be disposed between the third pixel PX3 and the fourth pixel PX4 adjacent in the first direction DR1. A minimum distance G34 between the third pixel PX3 and the fourth pixel PX4 adjacent in the first direction DR1 may be the sum of a minimum distance GHS3 between the third pixel PX3 and the connection member SM in the first direction DR1, a minimum distance GHS4 between the fourth pixel PX4 and the connection member SM in the second direction DR1, and the width GSM1 of the connection member SM in the second direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the connection member SM in the first direction DR1 may be smaller than the third horizontal separation distance GH3, and the minimum distance GHS4 between the fourth pixel PX4 and the connection member SM in the first direction DR1 may be smaller than the fourth horizontal separation distance GH4. Further, in the first direction DR1, the width GSM1 of the connection member SM may be smaller than the third horizontal separation distance GH3 or the fourth horizontal separation distance GH4.

The minimum distance between the first pixels PX1 adjacent in the second direction DR2 may be defined as a first vertical separation distance GV1, and the minimum distance between the third pixels PX3 adjacent in the first direction DR2 may be defined as a third vertical separation distance GV3. The first vertical separation distance GV1 and the third vertical separation distance GV3 may be substantially the same.

The connection member SM may be disposed between the first pixel PX1 and the third pixel PX3 adjacent in the first direction DR2. A minimum distance G13 between the first pixel PX1 and the third pixel PX3 adjacent in the first direction DR2 may be the sum of a minimum distance GVS1 between the first pixel PX1 and the connection member SM in the second direction DR2, a minimum distance GVS3 between the third pixel PX3 and the connection member SM in the second direction DR2, and a width GSM2 of the connection member SM in the second direction DR2.

The minimum distance G13 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the connection member SM in the second direction DR2 may be smaller than the first vertical separation distance GV1, and the minimum distance GVS3 between the third pixel PX3 and the connection member SM in the second direction DR2 may be smaller than the third vertical separation distance GV3. Further, in the second direction DR2, the width GSM2 of the connection member SM may be smaller than the first vertical separation distance GV1 or the third vertical separation distance GV3.

The minimum distance between the adjacent second pixels PX2 in the second direction DR2 may be defined as a second vertical separation distance GV2, and the minimum distance between the fourth pixels PX4 adjacent in the second direction DR2 may be defined as a fourth vertical separation distance GV4. The second vertical separation distance GV2 and the fourth vertical separation distance GV4 may be substantially the same.

The connection member SM may be disposed between the second pixel PX2 and the fourth pixel PX4 adjacent in the second direction DR2. The minimum distance G24 between the second pixel PX2 and the fourth pixel PX4 adjacent in the second direction DR2 may be the sum of the minimum distance GVS2 between the second pixel PX2 and the connection member SM in the second direction DR2, the minimum distance GVS4 between the fourth pixel PX4 and the connection member SM in the second direction DR2, and the width GSM2 of the connection member SM in the second direction DR2.

A minimum distance G24 between the second pixel PX2 and the fourth pixel PX4 adjacent in the second direction DR2, a second vertical separation distance GV2, and a fourth vertical separation distance GV4 may be substantially the same. To this end, a minimum distance GVS2 between the second pixel PX2 and the connection member SM in the second direction DR2 may be smaller than the second vertical separation distance GV2, and a minimum distance GVS4 between the fourth pixel PX4 and the connection member SM in the second direction DR2 may be smaller than the fourth vertical separation distance GV4. Further, in the second direction DR2, the width GSM2 of the connection member SM may be smaller than the second vertical separation distance GV2 or the fourth vertical separation distance GV4.

As shown FIGS. 46, the minimum distance between pixels of adjacent display devices may be substantially equal to the minimum distance between each of the pixels to prevent the connection member SM from being visually recognized between images displayed by the plurality of display devices 11, 12, 13, and 14.

Figure 47:
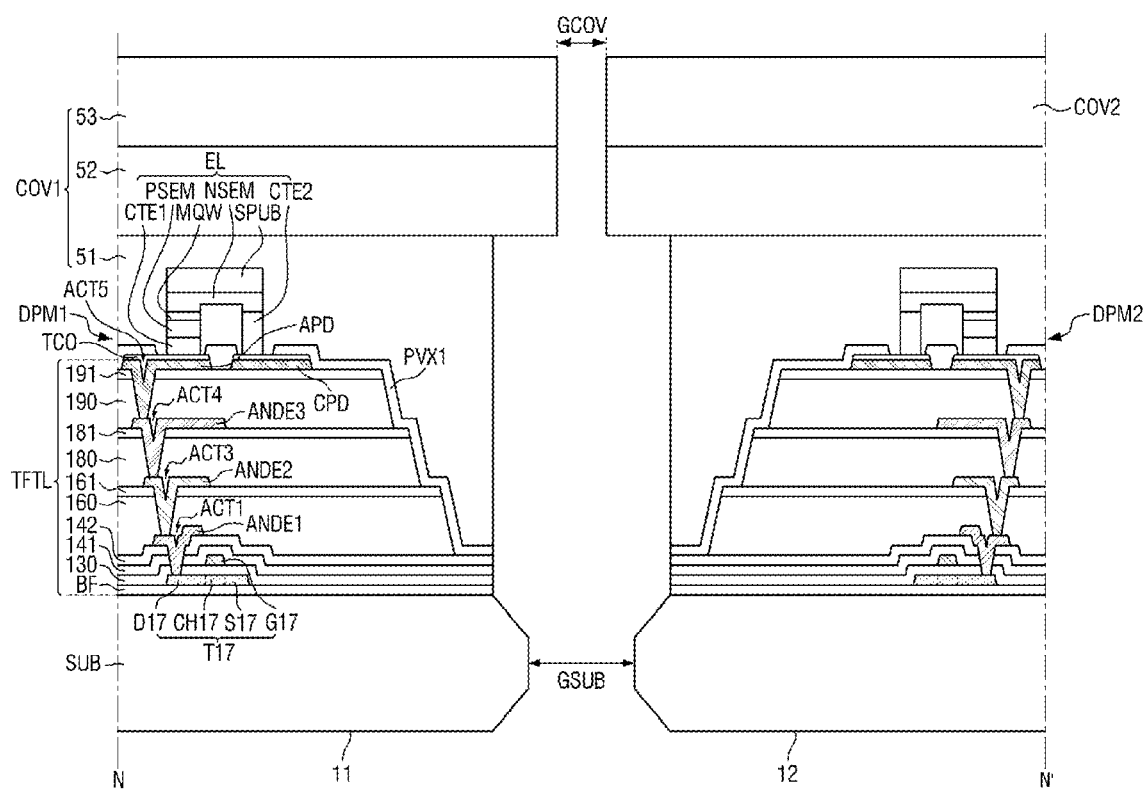
FIG. 47 is a cross-sectional view illustrating an example of a tiled display device taken along the line N-N' of FIG. 46.

FIG. 47 is a cross-sectional view illustrating an example of a tiled display device taken along the line N-N' of FIG. 46.

Referring to FIG. 47, the first display device 11 includes a first display module DPM1 and a first front cover COV1. The second display device 12 includes a second display module DPM2 and a second front cover COV2.

Each of the first display module DPM1 and the second display module DPM2 includes a substrate SUB, a thin film transistor layer TFTL, and light emitting elements EL.

Referring to FIG. 47, the display panel may include the thin film transistor layer TFTL and the light emitting elements EL disposed on the substrate SUB. The thin film transistor layer TFTL may be a layer in which thin film transistors are formed. The thin film transistors may include the first to nineteenth transistors T1 to T19 illustrated in FIGS. 5-6, 9, 20, 24, 29, 36, and 40.

The thin film transistor layer TFTL includes the active layer, the first gate metal layer, the second gate metal layer, the first source metal layer, the second source metal layer, the third source metal layer, a fourth source metal layer, and a transparent metal layer. In addition, the thin film transistor layer TFTL includes the buffer film BF, the gate insulating film 130, the first interlayer insulating film 141, the second interlayer insulating film 142, a first planarization film 160, the first inorganic insulating film 161, a second planarization film 180, the second inorganic insulating film 181, a third planarization film 190, and a third inorganic insulating film 191.

Because the active layer ACT, the first gate metal layer, the second gate metal layer, the first source metal layer, the second source metal layer, the buffer film BF, the gate insulating film 130, the first interlayer insulating film 141, the second interlayer insulating film 142, the first planarization film 160, the first inorganic insulating film 161, the second planarization film 180, the second inorganic insulating film 181, the third planarization film 190, and the third inorganic insulating film 191 has already been described above in connection with FIGS. 15 to 17, redundant description will be omitted.

The second source metal layer may further include a second anode connection electrode ANDE2. The second anode connection electrode ANDE2 may be disposed on the first inorganic insulating film 161. The second anode connection electrode ANDE2 may be connected to the first anode connection electrode ANDE1 through a third anode contact hole ANCT3 penetrating the first planarization film 160 and the first inorganic insulating film 161. In the embodiment of FIG. 47, the first anode connection electrode ANDE1 may be disposed on the second interlayer insulating film 142 and may be connected to the seventeenth drain electrode D17 via a first anode contact hole ANCT3 penetrating the gate insulating film 130, the first interlayer insulating film 141, and the second interlayer insulating film 142.

The third source metal layer may include a third anode connection electrode ANDE3. The third anode connection electrode ANDE3 may be disposed on the second inorganic insulating film 181. The third anode connection electrode ANDE3 may be connected to the second anode connection electrode ANDE2 through a fourth anode contact hole ANCT4 penetrating the second planarization film 180 and the second inorganic insulating film 181.

The fourth source metal layer may include an anode pad electrode APD and a cathode pad electrode CPD. The anode pad electrode APD and the cathode pad electrode CPD may be disposed on the third inorganic insulating film 191. The anode pad electrode APD may be connected to the third anode connection electrode ANDE3 through a fifth anode contact hole ACT5 penetrating the third planarization film 190 and the third inorganic insulating film 191. The cathode pad electrode CPD may be supplied with the first power supply voltage, which is a low potential voltage. The fourth data metal layer may be formed as a single layer or multiple layers made of one or more selected from among molybdenum (Mo), aluminum (AI), chromium (Cr), gold (Au), titanium (Ti), nickel (Ni), neodymium (Nd), and/or copper (Cu), and/or an alloy thereof.

A transparent metal layer TCO may be disposed on the anode pad electrode APD and the cathode pad electrode CPD. The transparent metal layer TCO may be a layer for increasing adhesion between a first contact electrode CTE1 and a second contact electrode CTE2 of the light emitting element LE. The transparent metal layer TCO may be formed of a transparent conductive oxide such as indium tin oxide (ITO) and/or indium zinc oxide (IZO).

A passivation film PVX1 may be disposed on the anode pad electrode APD, the cathode pad electrode CPD, and the transparent metal layer TCO. The passivation film PVX1 may be disposed to cover edges of the anode pad electrode APD, the cathode pad electrode CPD, and the transparent metal layer TCO. The passivation film PVX1 may be formed of the inorganic layer, such as a silicon nitride layer, a silicon oxy nitride layer, a silicon oxide layer, a titanium oxide layer, and/or an aluminum oxide layer.

The light emitting element EL is a flip chip type micro LED in which the first contact electrode CTE1 and the second contact electrode CTE2 are disposed to face the anode pad electrode APD and the cathode pad electrode CPD. The light emitting element EL may be an inorganic light emitting element made of an inorganic material such as GaN. The light emitting element EL may have a length of several to hundreds of μm in the first direction DR1, the second direction DR2, and the third direction DR3. For example, each of the lengths of the light emitting element EL in the first direction DR1, in the second direction DR2, and in the third direction DR3 may be about 100 μm or less.

The light emitting elements EL may be formed by being grown on a semiconductor substrate such as a silicon wafer. Each of the light emitting elements EL may be transferred directly from the silicon wafer onto the anode pad electrode APD and the cathode pad electrode CPD of the substrate SUB. Alternatively, each of the light emitting elements EL may be transferred to the anode pad electrode APD and the cathode pad electrode CPD of the substrate SUB through an electrostatic method using an electrostatic head or a stamp method using an elastic polymer material such as PDMS or silicon as a transfer substrate.

Each of the light emitting elements EL may be a light emitting structure including a base substrate SPUB, an n-type semiconductor NSEM, an active layer MQW, a p-type semiconductor PSEM, a first contact electrode CTE1, and a second contact electrode CTE2.

The base substrate SPUB may be a sapphire substrate, but one or more embodiments of the present disclosure are not limited thereto.

The n-type semiconductor NSEM may be disposed on one surface of the base substrate SPUB. For example, the n-type semiconductor NSEM may be disposed on the lower surface of the base substrate SPUB. The n-type semiconductor NSEM may be made of GaN doped with an n-type conductivity-type dopant such as Si, Ge, or Sn.

The active layer MQW may be disposed on a portion of one surface of the n-type semiconductor NSEM. The active layer may include a material having a single or multiple quantum well structure. When the active layer contains a material having a multiple quantum well structure, the active layer may have the structure in which a plurality of well layers and barrier layers are alternately laminated. In this case, the well layer may be formed of InGaN, and the barrier layer may be formed of GaN or AlGaN, but is not limited thereto. Alternatively, the active layer may have a structure in which semiconductor materials having large band gap energy and semiconductor materials having small band gap energy are alternately stacked and may include other Group III to Group V semiconductor materials according to a wavelength band of the emitted light.

The p-type semiconductor PSEM may be disposed on one surface of the active layer MQW. The p-type semiconductor PSEM may be made of GaN doped with a p-type conductivity-type dopant such as Mg, Zn, Ca, Se, and/or Ba.

The first contact electrode CTE1 may be disposed on the p-type semiconductor PSEM, and the second contact electrode CTE2 may be disposed on another portion of one surface of the n-type semiconductor NSEM. Another portion of one surface of the n-type semiconductor NSEM on which the second contact electrode CTE2 is disposed may be spaced from a portion of one surface of the n-type semiconductor NSEM on which the active layer MQW is disposed.

The first contact electrode CTE1 and the anode pad electrode APD may be adhered to each other through the conductive adhesive such as an anisotropic conductive film ACF or an anisotropic conductive paste ACP. Alternatively, the first contact electrode CTE1 and the anode pad electrode APD may be bonded to each other through a soldering process.

A distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance adjusting layer 52.

The adhesive member 51 of the first front cover COV1 serves to attach the light emitting element layer EL of the first display module DPM1 and the first front cover COV1. The adhesive member 51 of the second front cover COV2 serves to attach the light emitting element layer of the second display module DPM2 and the second front cover COV2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to prevent deterioration in visibility of an image by reflecting external light as it is. Accordingly, the contrast ratio of images displayed by the first display device 10 and the second display device 20 may be increased due to the anti-glare layer 53.

A light transmittance adjusting layer 52 may be designed to reduce transmittance of external light or light reflected from the first display module DPM1 and the second display module DPM2. Accordingly, it is possible to prevent the gap GSUB between the substrate SUB of the first display module DPM1 and the substrate SUB of the second display module DPM2 from being visually recognized from the outside.

The anti-glare layer 53 may be implemented as a polarizing plate, and the light transmittance control layer 52 may be implemented as a phase retardation layer, but one or more embodiments of the present disclosure are not limited thereto.

In one or more embodiments, because an example of the tiled display device cut along lines O-O', P-P', and Q-Q' of FIG. 46 is substantially the same as an example of the tiled display device cut along N-N' described in conjunction with FIG. 47, a description thereof is omitted.

It should be understood, however, that the aspects and features of embodiments of the present disclosure are not restricted to the one set forth herein. The above and other aspects of the present disclosure will become more apparent to one of ordinary skill in the art to which the present disclosure pertains by referencing the claims, with functional equivalents thereof to be included therein.

What is claimed is:

1. A display device comprising:
   a sub-pixel connected to a scan write line, a first data line, and a second data line, wherein the sub-pixel comprises:
   a light emitting element;
   a first pixel driving unit configured to generate a control current according to a first data voltage of the first data line;
   a second pixel driving unit configured to generate a driving current applied to the light emitting element according to a second data voltage of the second data line; and
   a third pixel driving unit configured to apply the driving current to the light emitting element according to the control current of the first pixel driving unit,
   wherein the first pixel driving unit comprises:
   a first transistor configured to generate the control current according to the first data voltage;
   a second transistor configured to apply the first data voltage of the first data line to a first electrode of the first transistor according to a scan write signal of the scan write line; and
   a third transistor connecting a gate electrode and a second electrode of the first transistor according to the scan write signal of the scan write line,
   wherein the third transistor comprises a first sub-transistor and a second sub-transistor connected in series between the gate electrode and the second electrode of the first transistor, and
   wherein a channel of the first sub-transistor and a channel of the second sub-transistor overlap a bottom gate electrode of the third transistor.

2. The display device of claim 1, wherein the bottom gate electrode of the third transistor is connected to a gate electrode of the first sub-transistor and a gate electrode of the second sub-transistor.

3. The display device of claim 1, wherein the bottom gate electrode of the third transistor is connected to a first electrode of the first sub-transistor, and
   wherein the first electrode of the first sub-transistor is connected to the second electrode of the first transistor.

4. The display device of claim 1, wherein the first pixel driving unit further comprises:
   a fourth transistor configured to initialize a voltage of the gate electrode of the first transistor to an initialization voltage according to a scan initialization signal of a scan initialization line,
   wherein the fourth transistor comprises a third sub-transistor and a fourth sub-transistor connected in series between the gate electrode of the first transistor and an initialization voltage line configured to receive the initialization voltage, and
   wherein a channel of the third sub-transistor and a channel of the fourth sub-transistor overlap a bottom gate electrode of the fourth transistor.

5. The display device of claim 4, wherein the bottom gate electrode of the fourth transistor is connected to a gate electrode of the third sub-transistor and a gate electrode of the fourth sub-transistor.

6. The display device of claim 4, wherein the bottom gate electrode of the fourth transistor is connected to a first electrode of the third sub-transistor, and the first electrode of the third sub-transistor is connected to the gate electrode of the first transistor.

7. The display device of claim 1, wherein a channel of the first transistor overlaps a bottom gate electrode of the first transistor.

8. The display device of claim 7, wherein the bottom gate electrode of the first transistor is connected to the gate electrode of the first transistor.

9. The display device of claim 7, wherein the bottom gate electrode of the first transistor is connected to the first electrode of the first transistor.

10. The display device of claim 1, wherein the bottom gate electrode of the third transistor is between the channel of the first sub-transistor and a substrate of the display device and between the channel of the second sub-transistor and the substrate.

11. The display device of claim 1, wherein a second electrode of the light emitting element is connected to a first power supply line configured to receive a first power voltage, and wherein the third pixel driving unit comprises a fifth transistor electrically connecting a first electrode of the light emitting element to the first power supply line according to a test signal of a test signal line.

12. The display device of claim 11, wherein a second electrode of the fifth transistor overlaps a light blocking layer.

13. The display device of claim 12, wherein the light blocking layer is electrically floating.

14. The display device of claim 12, wherein the bottom gate electrode of the third transistor comprises a same material as the light blocking layer.

15. The display device of claim 12, wherein the bottom gate electrode of the third transistor and the light blocking layer are on a substrate, and
wherein a buffer film is on the bottom gate electrode of the third transistor and the light blocking layer.

16. A display device comprising:
a sub-pixel connected to a scan write line, a first data line, and a second data line, wherein the sub-pixel comprises:
a light emitting element;
a first pixel driving unit configured to generate a control current according to a first data voltage of the first data line;
a second pixel driving unit configured to generate a driving current applied to the light emitting element according to a second data voltage of the second data line; and
a third pixel driving unit configured to apply the driving current to the light emitting element according to the control current of the first pixel driving unit,
wherein the second pixel driving unit comprises:
a first transistor configured to generate the drive current according to the second data voltage;
a second transistor configured to apply the second data voltage of second first data line to a first electrode of the first transistor according to a scan write signal of the scan write line; and
a third transistor connecting a gate electrode and a second electrode of the first transistor according to the scan write signal of the scan write line,
wherein the third transistor comprises a first sub-transistor and a second sub-transistor connected in series between the gate electrode and the second electrode of the first transistor, and
wherein a channel of the first sub-transistor and a channel of the second sub-transistor overlap a bottom gate electrode of the third transistor.

17. The display device of claim 16, wherein the bottom gate electrode of the third transistor is connected to a gate electrode of the first sub-transistor and a gate electrode of the second sub-transistor.

18. The display device of claim 16, wherein the bottom gate electrode of the third transistor is connected to a first electrode of the first sub-transistor and the first electrode of the first sub-transistor is connected to the second electrode of the first transistor.

19. The display device of claim 16, wherein a channel of the first transistor overlaps a bottom gate electrode of the first transistor and the bottom gate electrode of the first transistor is connected to a gate electrode of the first transistor.

20. The display device of claim 16, wherein a channel of the first transistor overlaps a bottom gate electrode of the first transistor and the bottom gate electrode of the first transistor is connected to the first electrode of the first transistor.

21. A tiled display device comprising:
a plurality of display devices; and
a connection member between the plurality of display devices,
wherein a display device from among the plurality of display devices comprises:
a sub-pixel connected to a scan write line, a first data line, and a second data line, wherein the sub-pixel comprises:
a light emitting element;
a first pixel driving unit configured to generate a control current according to a first data voltage of the first data line;
a second pixel driving unit configured to generate a driving current applied to the light emitting element according to a second data voltage of the second data line; and
a third pixel driving unit for applying the driving current to the light emitting element according to the control current of the first pixel driving unit,
wherein the second pixel driving unit comprises:
a first transistor configured to generate the drive current according to the second data voltage;
a second transistor configured to apply the second data voltage of the second data line to a first electrode of the first transistor according to a scan write signal of the scan write line; and
a third transistor connecting a gate electrode and a second electrode of the first transistor according to the scan write signal of the scan write line,
wherein the third transistor comprises a first sub-transistor and a second sub-transistor connected in series between the gate electrode and the second electrode of the first transistor, and
wherein a channel of the first sub-transistor and a channel of the second sub-transistor overlap a bottom gate electrode of the third transistor.

* * * * *